US012298611B2

(12) United States Patent
Yoshinari et al.

(10) Patent No.: US 12,298,611 B2
(45) Date of Patent: May 13, 2025

(54) LIGHT ABSORPTION ANISOTROPIC FILM, VIEWING ANGLE CONTROL SYSTEM, AND IMAGE DISPLAY DEVICE

(71) Applicant: FUJIFILM Corporation, Tokyo (JP)

(72) Inventors: Shinichi Yoshinari, Kanagawa (JP); Shinya Watanabe, Kanagawa (JP); Naoya Shibata, Kanagawa (JP); Wataru Hoshino, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/331,818

(22) Filed: Jun. 8, 2023

(65) Prior Publication Data

US 2023/0314854 A1 Oct. 5, 2023

Related U.S. Application Data

(63) Continuation of application No. PCT/JP2021/046999, filed on Dec. 20, 2021.

(30) Foreign Application Priority Data

Dec. 21, 2020 (JP) ................................ 2020-211373

(51) Int. Cl.
*G02F 1/13* (2006.01)
*G02F 1/1333* (2006.01)
(Continued)

(52) U.S. Cl.
CPC ...... *G02F 1/1323* (2013.01); *G02F 1/133365* (2013.01); *G02F 1/133528* (2013.01);
(Continued)

(58) Field of Classification Search
CPC ........... G02F 1/133726; G02F 1/13725; G02F 1/13775
See application file for complete search history.

(56) References Cited

U.S. PATENT DOCUMENTS 5,619,352 A * 4/1997 Koch ................ G02F 1/133632 349/177
2007/0285616 A1* 12/2007 Biver .................. G02B 5/3016 427/163.1
(Continued)

FOREIGN PATENT DOCUMENTS

JP 2009-145776 A 7/2009
JP 2011-215337 A 10/2011
(Continued)

OTHER PUBLICATIONS

International Search Report issued in PCT/JP2021/046999 on Mar. 8, 2022.
(Continued)

*Primary Examiner* — Alexander P Gross
(74) *Attorney, Agent, or Firm* — Edwards Neils LLC; Jean C. Edwards, Esq.

(57) ABSTRACT

A light absorption anisotropic film that displays a bright and clear image in a desired direction and makes the image invisible from a direction other than the desired direction using an image display device, a viewing angle control system formed of the light absorption anisotropic film, and an image display device formed of the light absorption anisotropic film. The light absorption anisotropic film includes a light absorption anisotropic layer, and a first alignment layer adjacent to the light absorption anisotropic layer, in which the light absorption anisotropic layer contains a liquid crystal compound and an organic dichroic substance, an angle between a transmittance central axis of the light absorption anisotropic layer and a normal line of the light absorption anisotropic layer is 5° or greater and less than 45°, and the first alignment layer is a layer in which a polymerizable liquid crystal compound is hybrid-aligned.

18 Claims, 3 Drawing Sheets

(51) Int. Cl.

| | |
|---|---|
| ***G02F 1/1335*** | (2006.01) |
| ***G02F 1/1337*** | (2006.01) |
| ***G02F 1/137*** | (2006.01) |

(52) U.S. Cl.

CPC .. *G02F 1/133703* (2013.01); *G02F 1/133757* (2021.01); *G02F 1/13725* (2013.01); *G02F 1/13775* (2021.01)

(56) References Cited

U.S. PATENT DOCUMENTS

| | | | | |
|---|---|---|---|---|
| 2009/0153783 | A1* | 6/2009 | Umemoto | G02B 27/28 359/487.01 |
| 2013/0107195 | A1 | 5/2013 | Morishima et al. | |
| 2014/0285752 | A1* | 9/2014 | Min | G02F 1/13725 349/187 |
| 2015/0378068 | A1 | 12/2015 | Hatanaka | |
| 2017/0179439 | A1* | 6/2017 | Tian | G02F 1/136209 |
| 2019/0250457 | A1 | 8/2019 | Nishimura et al. | |
| 2020/0319517 | A1* | 10/2020 | Kim | B32B 27/308 |

FOREIGN PATENT DOCUMENTS

| | | | |
|---|---|---|---|
| JP | 4902516 | B2 | 3/2012 |
| JP | 2016-027387 | A | 2/2016 |
| JP | 2019-120949 | A | 7/2019 |
| WO | 2018/079854 | A1 | 5/2018 |

OTHER PUBLICATIONS

Written Opinion issued in PCT/JP2021/046999 on Mar. 8, 2022.

International Preliminary Report on Patentability completed by WIPO on Jun. 13, 2023 in connection with International Patent Application No. PCT/JP2021/046999.

* cited by examiner

LIGHT ABSORPTION ANISOTROPIC FILM, VIEWING ANGLE CONTROL SYSTEM, AND IMAGE DISPLAY DEVICE

CROSS-REFERENCE TO RELATED APPLICATIONS

This application is a Continuation of PCT International Application No. PCT/JP2021/046999 filed on Dec. 20, 2021, which was published under PCT Article 21(2) in Japanese, and which claims priority under 35 U.S.C. § 119(a) to Japanese Patent Application No. 2020-211373 filed on Dec. 21, 2020. The above applications are hereby expressly incorporated by reference, in their entirety, into the present application.

BACKGROUND OF THE INVENTION

1. Field of the Invention

The present invention relates to a light absorption anisotropic film for controlling a viewing angle, a viewing angle control system formed of the light absorption anisotropic film, and an image display device formed of the viewing angle control system.

2. Description of the Related Art

In a case where an in-vehicle display such as a car navigation system is used, there is a problem in that light emitted upward from a display screen is reflected on a windshield or the like and interferes with driving.

For the purpose of solving such a problem, for example, JP4902516B suggests a method of using a first polarizer that has an absorption axis in a plane and a second polarizer (light absorption anisotropic layer) in which an absorption axis of an organic dichroic substance is aligned at 0° to 45° with respect to a normal direction in combination. Here, a polarizer on a viewing side in a liquid crystal display device can be used as the first polarizer.

According to this method, an image can be observed by an observer in a desired direction by transmitting only light from the image in a specific direction and shielding transmission of light at an angle other than the specific direction, and projection of the image in a direction other than the desired direction, for example, in a direction in which window glass is present can be prevented.

SUMMARY OF THE INVENTION

In the above-described technique of the related art, a photo-alignment film formed of an azobenzene coloring agent or the like is exposed to ultraviolet rays from obliquely above in a case of producing a light absorption anisotropic layer used in a viewing angle control device, a surface of the photo-alignment film is allowed to have anisotropy with a tilt angle, coated with a coating solution for forming a light absorption anisotropic layer containing an organic dichroic substance and a liquid crystal compound, and dried, and thus the liquid crystal compound and the organic dichroic substance are used by being obliquely aligned.

However, in order to use the method of allowing a surface of a photo-alignment film to have anisotropy with a tilt angle by exposing the film to ultraviolet rays as described above, an ultraviolet exposure device is required to be a high-output device capable of applying precise parallel light beams. At the same time, large-scale countermeasures to reflected light, for example, sufficiently suppressing stray light in an exposure environment to eliminate irradiation with light at angles other than the desired angle, are required in order to make the tilt angle of the organic dichroic substance uniform.

As a result, the cost burden for an exposure device used to form a light absorption anisotropic layer is extremely large in a case of using the above-described method. Further, in relation to such circumstances, the variation in the alignment direction of the light absorption anisotropic layer of the prepared light absorption anisotropic film is large in the method of exposing a photo-alignment film to ultraviolet rays at a tilt angle, and this leads to degradation of the quality of the light absorption anisotropic film.

Therefore, an object of the present invention is to provide a light absorption anisotropic film in which the cost burden for an exposure device used to control alignment of a light absorption anisotropic layer is small and an alignment direction of an organic dichroic substance in the light absorption anisotropic layer is uniform, a viewing angle control system formed of the light absorption anisotropic film, and an image display device formed of the viewing angle control system.

The present inventors found that the above-described object can be achieved by employing the following configurations.

(1) A light absorption anisotropic film comprising: a light absorption anisotropic layer; and a first alignment layer adjacent to the light absorption anisotropic layer, in which the light absorption anisotropic layer contains a liquid crystal compound and an organic dichroic substance, an angle between a transmittance central axis of the light absorption anisotropic layer and a normal line of the light absorption anisotropic layer is 5° or greater and less than 45°, and the first alignment layer is a layer formed by fixing a hybrid-aligned polymerizable liquid crystal compound in which an alignment direction of the compound in a thickness direction continuously changes from one surface side to the other surface side.

(2) The light absorption anisotropic film according to (1), in which the first alignment layer is a layer formed of a composition having a polymerizable polymer liquid crystal.

(3) The light absorption anisotropic film according to (1) or (2), in which an angle between an alignment axis of the polymerizable liquid crystal compound at an interface of the first alignment layer on the light absorption anisotropic layer side and a normal line of the first alignment layer is in a range of 2° to 50°.

(4) The light absorption anisotropic film according to any one of (1) to (3), in which a ratio of a mass of the organic dichroic substance to a total mass of a solid content in the light absorption anisotropic layer is 5% by mass or greater.

(5) The light absorption anisotropic film according to any one of (1) to (4), in which the liquid crystal compound of the light absorption anisotropic layer includes a polymerizable liquid crystal compound, and the polymerizable liquid crystal compound includes a liquid crystal compound exhibiting a smectic phase.

(6) The light absorption anisotropic film according to any one of (1) to (5), further comprising: a second alignment layer disposed adjacent to a side of the first alignment layer opposite to a side of the light absorption anisotropic layer and consisting of polyvinyl alcohol or polyimide.

(7) A viewing angle control system comprising: a polarizer; and the light absorption anisotropic film according to any one of (1) to (6).

(8) An image display device comprising: the viewing angle control system according to (7) which is disposed on at least one main surface of a display panel.

According to the present invention, it is possible to provide a light absorption anisotropic film, in which the alignment direction of the light absorption anisotropic layer is uniform, at a low cost.

DESCRIPTION OF THE PREFERRED EMBODIMENTS

Hereinafter, the present invention will be described in detail.

The description of configuration requirements described below may be made based on typical embodiments of the present invention, but the present invention is not limited to such embodiments.

Further, in the present specification, the numerical ranges shown using "to" indicate ranges including the numerical values described before and after "to" as the lower limits and the upper limits.

Further, in the present specification, the term parallel or orthogonal does not indicate parallel or orthogonal in a strict sense, but indicates a range of ±5° from parallel or orthogonal.

In the present specification, "(meth)acrylate" is used to indicate "any one or both acrylate and methacrylate".

Further, in the present specification, the concepts of the liquid crystal composition and the liquid crystal compound also include those that no longer exhibit liquid crystallinity due to curing or the like.

<Image Display Device>

In addition to a liquid crystal display device, an organic electroluminescence display device or another display device can be used as the image display device according to the embodiment of the present invention. Here, a liquid crystal display device will be described as an example thereof.

Figure 1:
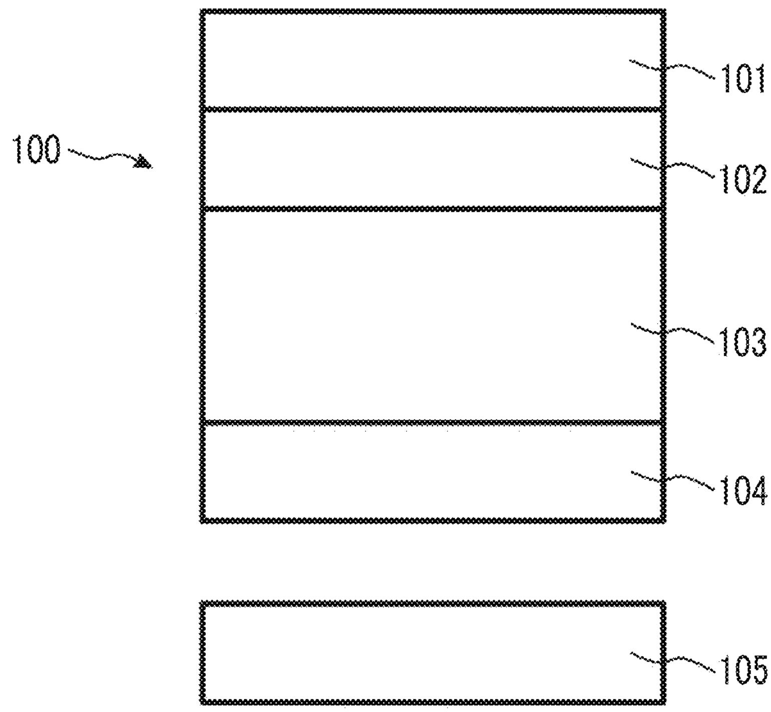
FIG. 1 is a cross-sectional view schematically illustrating an example of an embodiment of a liquid crystal display device of the present invention.

As illustrated in FIG. 1, a liquid crystal display device 100 according to the embodiment of the present invention is a liquid crystal display device including at least a light absorption anisotropic film 101, a viewing-side polarizer 102, a liquid crystal cell 103, a backlight-side polarizer 104, and a backlight 105 in this order from the viewing side.

The light absorption anisotropic film 101 is a light absorption anisotropic film according to the embodiment of the present invention and includes a light absorption anisotropic layer and a first alignment layer.

As the light absorption anisotropic film 101, any film with various configurations can be used as long as the film includes the light absorption anisotropic layer and the first alignment layer described below.

Figure 2:
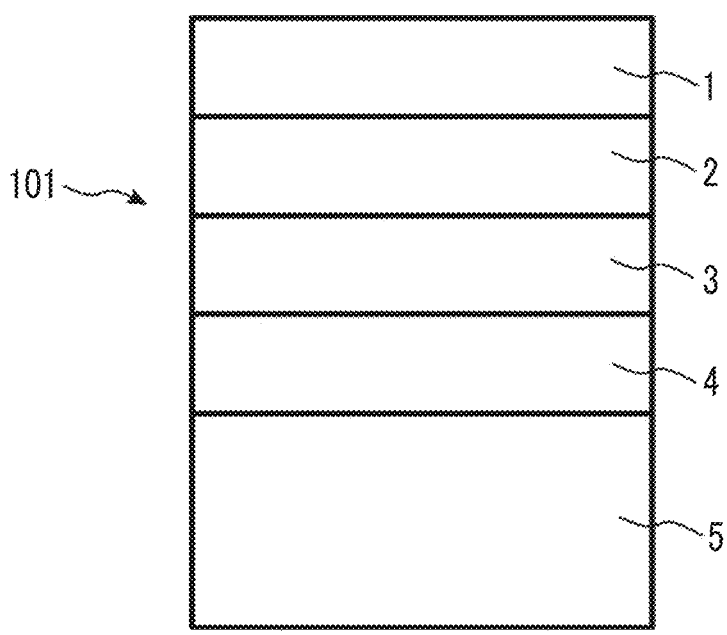
FIG. 2 is a cross-sectional view schematically illustrating an example of an embodiment of a light absorption anisotropic film of the present invention.

The configuration thereof is not limited, and the light absorption anisotropic film 101 according to the embodiment of the present invention includes, as an example, a barrier layer 1, a light absorption anisotropic layer 2, a first alignment layer 3, a second alignment layer 4, and a TAC film 5 in this order, as conceptually illustrated in FIG. 2.

The TAC film 5 is a support that supports the light absorption anisotropic layer 101. Further, the TAC film is an abbreviation for a triacetylcellulose film.

In the present invention, a direction of the absorption axis of the polarizer may be referred to as a longitudinal direction or a lateral direction, and a direction of a side of the liquid crystal display device close to the vertical direction is referred to as a longitudinal direction and a direction of a side of the liquid crystal display device close to the horizontal direction is referred to as a lateral direction typically in a state where a liquid crystal display device is used.

[Light Absorption Anisotropic Layer]

The light absorption anisotropic layer contains an organic dichroic substance and a liquid crystal compound as main components, and may contain a polymerization initiator, a leveling agent, an alignment control agent, and the like as other components.

Among these, various compounds such as low-molecular-weight liquid crystal compounds and polymer liquid crystal compounds can be used as the liquid crystal compound, and it is preferable that the light absorption anisotropic layer contains at least some polymer liquid crystal compounds in order to obtain a satisfactory alignment state of the organic dichroic substance in the light absorption anisotropic layer. Further, it is preferable that the polymer liquid crystal compound is used from the viewpoint that a difference in the tilt angle of the liquid crystal compound at the air-layer side interface and the support-side interface of the light absorption anisotropic layer can be suppressed to be relatively small and satisfactory viewing angle characteristics are obtained.

In order to control the light transmission direction of the light absorption anisotropic layer, an aspect in which an organic dichroic substance having absorption in a visible region is aligned in a desired direction is preferable, and examples thereof include a light absorption anisotropic layer in which at least one kind of organic dichroic substance is obliquely aligned with respect to the normal direction of the film.

As the light absorption anisotropic layer in which the organic dichroic substance is obliquely aligned as described above, an aspect in which an organic dichroic substance serving as a guest is aligned using alignment of a liquid crystal compound serving as a host by a technique of preparing a guest-host liquid crystal cell is more preferable.

As is well known, the normal line is a direction orthogonal to a main surface of a sheet-like material (such as a film, a layer, a membrane, or a plate-like material) and is, for example, a lamination direction of each layer in the light absorption anisotropic film illustrated in FIG. 2. Further, as is well known, the main surface is a maximum surface of a sheet-like material, and is typically both surfaces in the thickness direction.

In the light absorption anisotropic film according to the embodiment of the present invention, the first alignment layer adjacent to the light absorption anisotropic layer is used in a case of controlling the alignment direction of the organic dichroic substance, that is, the liquid crystal compound in the light absorption anisotropic layer.

As described in detail below, the first alignment layer is a layer formed by fixing a hybrid-aligned polymerizable liquid crystal compound in which the alignment direction of the compound in the thickness direction continuously changes from one surface side to the other surface side.

In the related art, the alignment direction of an organic dichroic coloring agent (liquid crystal compound) in the light absorption anisotropic layer is controlled by using a photo-alignment layer containing a photo-alignment material typified by an azobenzene coloring agent or polyvinyl cinnamate. That is, a photo-alignment layer containing a photo-alignment material is irradiated with ultraviolet rays in an oblique direction at an angle with respect to the normal direction of the photo-alignment layer, and anisotropy inclined with respect to the normal direction of the photo-alignment layer is generated.

A liquid crystal compound serving as a host is obliquely aligned by anisotropy of the photo-alignment layer by forming a light absorption anisotropic layer formed of a composition containing a liquid crystal compound and an organic dichroic substance on the photo-alignment layer in which anisotropy inclined as described above is generated, and the organic dichroic substance in the light absorption anisotropic layer is also aligned by following the alignment of the liquid crystal compound.

However, in a case where the alignment of the organic dichroic coloring agent in the light absorption anisotropic layer is intended to be sufficiently controlled by the method of using such a photo-alignment layer, an exposure amount of several thousand $mJ/cm^2$, which is several tens to several hundreds of times greater than that of the exposure amount in a case of exposure to ultraviolet rays for photocuring that has been typically performed, is required due to a decrease in illuminance by irradiation with ultraviolet rays in an oblique direction.

Further, in this alignment method, the alignment direction is determined by the incidence angle of the ultraviolet rays. Therefore, a light source capable of performing irradiation with a high degree of parallel light with a high output is required in order to obtain a uniform alignment direction. Further, in order to obtain a uniform alignment direction, measures to prevent irregular reflection are required to suppress stray light inside an optical system and an exposure device.

Therefore, the method of aligning a dichroic coloring agent using a photo-alignment layer places a heavy burden on treatments, devices, and the like.

Further, a method of using, in place of a photo-alignment layer, a polyimide-based alignment layer containing a special functional group, which is likely to have a relatively large tilt angle of alignment, by performing a rubbing treatment on the layer is also considered.

However, in these methods, the magnitude of the tilt angle of alignment is insufficient to control the alignment direction of the organic dichroic coloring agent (organic compound) in the light absorption anisotropic layer of the present invention, in which the angle between the transmittance central axis of the light absorption anisotropic layer and the normal line of the light absorption anisotropic layer is 5° or greater and less than 45°. Further, the alignment direction (tilt direction) cannot be freely changed as necessary in these methods.

Therefore, in the present invention, the above-described problem is solved by using, in place of the photo-alignment layer, the liquid crystal layer in which the liquid crystal compound is hybrid-aligned as the first alignment layer in order to control the alignment direction of the light absorption anisotropic layer.

Further, a method of determining the azimuthal angle of the alignment of the first alignment layer is not particularly limited, and examples thereof include a method of providing a second alignment layer having an alignment restricting force in the in-plane direction, adjacent to a side of the first alignment layer opposite to the light absorption anisotropic layer. It is preferable that the second alignment layer is a polyvinyl alcohol layer subjected to a rubbing treatment or a polyimide layer subjected to a rubbing treatment.

As the technique of aligning the organic dichroic substance in a desired direction, a technique of preparing a polarizer formed of an organic dichroic substance or a technique of preparing a guest-host liquid crystal cell can be referred to. As described above, in the light absorption anisotropic film according to the embodiment of the present invention, the light absorption anisotropic layer contains a liquid crystal compound and an organic dichroic sub stance.

Figure 3:
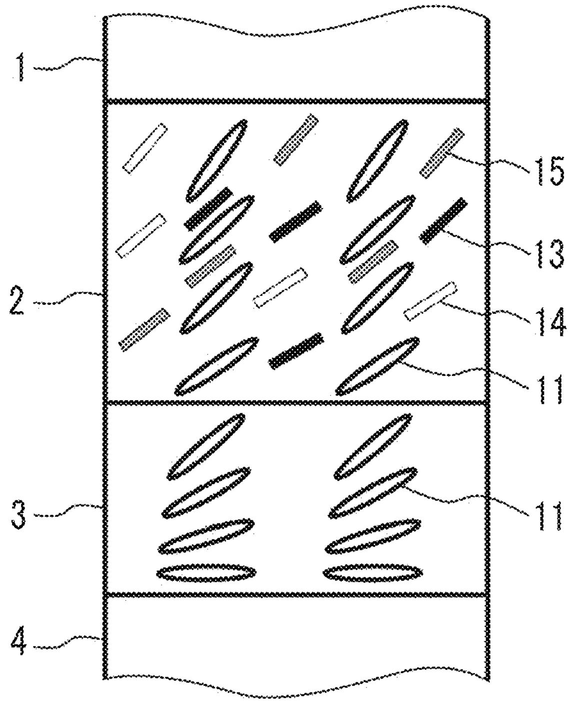
FIG. 3 is a cross-sectional view conceptually illustrating an alignment direction of a liquid crystal molecule and a dichroic substance in the light absorption anisotropic film of the present invention.

As an example, in a case where liquid crystal compounds 11 are obliquely aligned in a desired direction as in the light absorption anisotropic layer 2 conceptually illustrated in FIG. 3, dichroic substances D-1 indicated by the reference numeral 13, dichroic substances D-2 indicated by the reference numeral 14, and dichroic substances D-3 indicated by the reference numeral 15 are aligned as guests along the liquid crystal compounds using the liquid crystal compounds 11 as hosts. Further, the dichroic substances D-1, the dichroic substances D-2, and the dichroic substances D-3 are, for example, organic dichroic substances having different absorption peak wavelengths.

In the alignment of such dichroic substances, for example, techniques used in the method of preparing a dichroic polarizer described in JP1999-305036A (JP-H11-305036A) or JP2002-90526A and the method of preparing a guest-host type liquid crystal display device described in JP2002-99388A or JP2016-27387A can also be used for preparation of the light absorption anisotropic layer in the light absorption anisotropic film according to the embodiment of the present invention.

For example, molecules of the organic dichroic substance can be desirably aligned as described above in association with the alignment of host liquid crystals using the technique of the guest-host type liquid crystal cell.

Specifically, the light absorption anisotropic layer used in the present invention can be prepared by mixing an organic dichroic substance serving as a guest and a rod-like liquid crystal compound serving as a host liquid crystal, aligning the host liquid crystal, aligning molecules of the organic dichroic substance along the alignment of the liquid crystal molecules, and fixing the alignment state.

It is preferable that the alignment of the organic dichroic substance is fixed by forming a chemical bond in order to prevent fluctuation of the light absorption characteristics of the light absorption anisotropic layer used in the present invention depending on the usage environment. For example, the alignment can be fixed by promoting the polymerization of the host liquid crystal, the organic dichroic substance, and the polymerizable component to be added as desired.

Further, the guest-host type liquid crystal cell having a liquid crystal layer that contains at least an organic dichroic substance and a host liquid crystal on a pair of substrates may be used as the light absorption anisotropic layer used in the present invention. The alignment of the host liquid crystal (the alignment of the organic dichroic substance molecules in association of the alignment of the host liquid crystal) can be controlled by the alignment film formed on the inner surface of the substrate, the alignment state thereof is maintained as long as an external stimulus such as an electric field is not applied, and the light absorption characteristics of the light absorption anisotropic layer used in the present invention can be set to be constant.

Further, a polymer film that can be used as the light absorption anisotropic layer of the light absorption anisotropic film according to the embodiment of the present invention can be prepared by allowing the organic dichroic substance to permeate into the polymer film and aligning the organic dichroic substance along the alignment of the polymer molecules in the polymer film.

Specifically, the polymer film can be prepared by coating a surface of the polymer film with a solution of an organic dichroic substance and allowing the solution to permeate into the film. The alignment of the organic dichroic substance can be adjusted by the alignment of a polymer chain in the polymer film, the properties thereof (chemical and physical properties of the polymer chain, a functional group of the polymer chain, and the like), the coating method, and the like. The details of this method are described in JP2002-90526A.

In a case where this polymer film is used as the light absorption anisotropic layer, the transmittance central axis may be detected by the same method as described below.

In the light absorption anisotropic film according to the embodiment of the present invention, an angle between the transmittance central axis of the light absorption anisotropic layer and the normal line of the light absorption anisotropic layer is 5° or greater and less than 45°.

In a case where the angle between the transmittance central axis and the normal line of the light absorption anisotropic layer is less than 5°, inconveniences such as a low degree of freedom in designing deposition in a vehicle including the image display device occur.

Further, even in a case where the angle between the transmittance central axis and the normal line of the light absorption anisotropic layer is set to 45° or greater, the screen is difficult to see at such a shallow angle, the brightness of the emitted light by the image display device is high, and the light shielding properties in the front direction in which the optical path length of an optical path across the optically anisotropic layer is shortened are also insufficient. That is, in a case where the angle between the transmittance central axis and the normal line of the light absorption anisotropic layer is 45° or greater, which is not preferable from the viewpoint of the viewing angle control direction of the viewing angle control system, inconveniences such as degradation of the visibility in a viewing direction to be set, insufficient light shielding properties in a direction other than the viewing direction to be set, an increase in reflected glare on window glass in in-vehicle applications, and the like occur.

The angle between the transmittance central axis and the normal line of the light absorption anisotropic layer is preferably in a range of 5° to 30° and more preferably in a range of 5° to 15°.

Here, the transmittance central axis denotes the direction in which the transmittance is the highest in a case where the transmittance is measured by changing the inclination angle (polar angle) and the inclination direction (azimuthal angle) with respect to the normal direction of the main surface of the light absorption anisotropic layer.

As described in examples below, a direction (polar angle) in which the transmittance is the highest, which is obtained by detecting the direction of the azimuthal angle at which the transmittance central axis is inclined using, for example, AxoScan OPMF-1 (manufactured by Opto Science, Inc.) and measuring the Mueller matrix while variously changing the polar angle in the direction of the azimuthal angle to derive the transmittance, is defined as the direction of the transmittance central axis of the light absorption anisotropic layer. The direction of this polar angle is an angle between the transmittance central axis of the light absorption anisotropic layer and the normal direction of the light absorption anisotropic layer.

Further, the transmittance central axis (polar angle) of the light absorption anisotropic layer is measured at 15 sites optionally selected in the light absorption anisotropic layer, and the average value of the polar angles is defined as the transmittance central axis in the light absorption anisotropic layer.

Further, in the present invention, the optical measurement is performed using light having a wavelength of 550 nm unless otherwise specified.

In the light absorption anisotropic layer used in the present invention, the transmittance at an angle inclined by 30° from the transmittance central axis (hereinafter, at 550 nm) is preferably 60% or less, more preferably 50% or less, and still more preferably 45% or less.

In the light absorption anisotropic layer used in the present invention, the transmittance in the transmittance central axis direction is preferably 65% or greater, more preferably 75% or greater, and still more preferably 85% or greater. In this manner, the illuminance at the center of the viewing angle of the image display device can be increased to enhance the visibility.

Further, from the viewpoint of making the tint in the front direction neutral, the alignment degree of the light absorption anisotropic layer at a wavelength of 420 nm is preferably 0.93 or greater.

The tint of the light absorption anisotropic film containing a dichroic substance is typically controlled by adjusting the addition amount of the dichroic substance contained in the film. However, it was found that the tint both in the front direction and an oblique direction cannot be made neutral only by adjusting the addition amount of the dichroic substance. The reason why the tint thereof both in the front direction and an oblique direction cannot be made neutral is found to be that the alignment degree at 420 nm is low, and the tint thereof both in the front direction and an oblique direction can be made neutral by increasing the alignment degree at 420 nm.

In the light absorption anisotropic film according to the embodiment of the present invention, the light absorption anisotropic layer may be obtained by laminating a plurality of light absorption anisotropic layers with different transmittance central axes or laminating retardation layers such that the transmittance at an angle inclined by 30° from the transmittance central axis and the transmittance of the transmittance central axis are satisfied.

The width of a region where the transmittance is high can be adjusted by laminating a plurality of light absorption anisotropic layers with different transmittance central axes. Further, in a case where retardation layers are laminated, the transmission and light shielding performance can be controlled by controlling the retardation value and the optical axis direction. As the retardation layer, a positive A-plate, a negative A-plate, a positive C-plate, a negative C-plate, a B-plate, an O-plate, or the like can be used.

From the viewpoint of reducing the thickness of the viewing angle control system, it is preferable that the thickness of the retardation layer is small as long as the optical characteristics, the mechanical properties, and the manufacturing suitability are not impaired, and specifically, the thickness thereof is preferably in a range of 1 to 150 μm, more preferably in a range of 1 to 70 μm, and still more preferably in a range of 1 to 30 μm.

[First Alignment Layer]

In the light absorption anisotropic film according to the embodiment of the present invention, a first alignment layer containing a hybrid-aligned liquid crystal compound is provided adjacent to the light absorption anisotropic layer.

Specifically, the first alignment layer is a layer formed by fixing a hybrid-aligned polymerizable liquid crystal compound in which the alignment direction of the compound in the thickness direction continuously changes from one surface side to the other surface side. In the examples illustrated in FIGS. 2 and 3, the first alignment layer 3 is a hybrid-aligned liquid crystal layer in which the alignment direction of a liquid crystal molecule 11 continuously changes from the TAC film 5 (support) side toward the barrier layer 1 (air side).

In the present invention, the alignment direction of the liquid crystal molecule 11 continuously changes such that the alignment direction of the liquid crystal compound in the first alignment layer is basically a normal direction (the thickness direction or the vertical alignment) from an in-plane direction (horizontal alignment) toward the light absorption anisotropic layer side from a side opposite to the light absorption anisotropic layer as illustrated in FIG. 3.

The alignment direction of the liquid crystal compound basically follows the alignment direction of the liquid crystal compound present in the underlayer (formation surface).

As a function of the first alignment layer, the alignment angle (tilt angle) of the liquid crystal compound at the interface between the light absorption anisotropic layer and other liquid crystal layers provided on the first alignment layer and the first alignment layer and the orientation of the alignment direction, that is, the azimuthal angle direction are controlled by using the alignment angle (tilt angle) of the liquid crystal compound at the interface (air layer-side interface) of the first alignment layer on the side of the light absorption anisotropic layer.

The liquid crystal compound used in the first alignment layer is not limited, and various known liquid crystal compounds can be used. Further, the liquid crystal compound may be a rod-like liquid crystal compound or a disk-like liquid crystal compound.

Here, the first alignment layer, the light absorption anisotropic layer and other liquid crystal layers provided on the first alignment layer are formed of preferably the same kind of liquid crystal compounds or liquid crystal compounds having chemical structures similar to each other and more preferably the same kind of liquid crystal compounds. With such a configuration, the interaction between the first alignment layer and the light absorption anisotropic layer and other liquid crystal layers on the first alignment layer is strengthened, and the alignment angle and the alignment direction of the liquid crystal compound in the light absorption anisotropic layer or the like can be controlled more accurately.

The liquid crystal compound of the first alignment layer can be formed by using various liquid crystal compounds such as low-molecular-weight liquid crystal compounds and polymer liquid crystal compounds, but it is preferable that the first alignment layer is formed of a polymer liquid crystal compound to obtain a uniform alignment state.

Further, the liquid crystal compound of the first alignment layer may be a polymer liquid crystal compound or a low-molecular-weight liquid crystal compound, but it is preferable that the liquid crystal compound thereof is a polymerizable liquid crystal compound. In a case where the first alignment layer is coated with a coating solution that forms the light absorption anisotropic layer by coating the first alignment layer with the coating solution containing the polymerizable liquid crystal compound forming the first alignment layer and performing a curing treatment before the coating of the coating solution that forms the light absorption anisotropic layer to cure the first alignment layer, disturbance of the alignment of the liquid crystal compound in the first alignment layer due to the organic solvent or the like in the coating solution that forms the light absorption anisotropic layer can be minimized. As a result, a higher quality light absorption anisotropic film can be prepared.

That is, it is most preferable that the first alignment layer is a layer formed of a composition containing a polymerizable polymer liquid crystal compound.

The thickness of the first alignment layer is not limited, and a thickness that enables sufficient exhibition of aligning properties may be appropriately set depending on the material for forming the first alignment layer.

From the viewpoint that the alignment state is satisfactory in the light absorption anisotropic layer, the thickness of the first alignment layer is preferably in a range of 0.1 to 5.0 μm. The thickness of the first alignment layer is more preferably in a range of 0.1 to 3.5 μm and still more preferably in a range of 0.1 to 2.0 μm.

In the first alignment layer, the angle between the alignment axis (optical axis) of the liquid crystal compound at the interface on the light absorption anisotropic layer side and the normal line of the first alignment layer is preferably in a range of 2° to 50°. That is, the alignment angle of the liquid crystal compound with respect to the normal line at the interface of the first alignment layer on the light absorption anisotropic layer side is preferably in a range of 2° to 50°.

It is preferable that the alignment angle of the liquid crystal compound with respect to the normal line in the first alignment layer is set to 2° or greater from the viewpoint that asymmetric viewing angle control can be performed in the horizontal direction or the vertical direction.

Even in a case where the alignment angle of the liquid crystal compound with respect to the normal line is set to greater than 50°, the screen is difficult to see at such a shallow angle, the brightness of the emitted light by the image display device is high, and the light shielding properties are also insufficient in the front direction in which the optical path length of the optical path that crosses the optically anisotropic layer is shortened. That is, it is preferable that the alignment angle of the liquid crystal compound with respect to the normal line in the first alignment layer is set to 50° or less from the viewpoint of enhancing the visibility in the viewing direction to be set, sufficiently obtaining light shielding properties in a direction other than the viewing direction to be set, and reducing reflected glare on window glass in in-vehicle applications from the viewpoint of the viewing angle control direction of the viewing angle control system.

The alignment angle of the liquid crystal compound with respect to the normal line at the interface of the first alignment layer on the light absorption anisotropic layer side is more preferably in a range of 3° to 45° and still more preferably in a range of 5° to 35°.

For example, the alignment angle of the liquid crystal compound with respect to the normal line at the interface of the first alignment layer on the light absorption anisotropic layer side is measured as follows.

Figure 5:
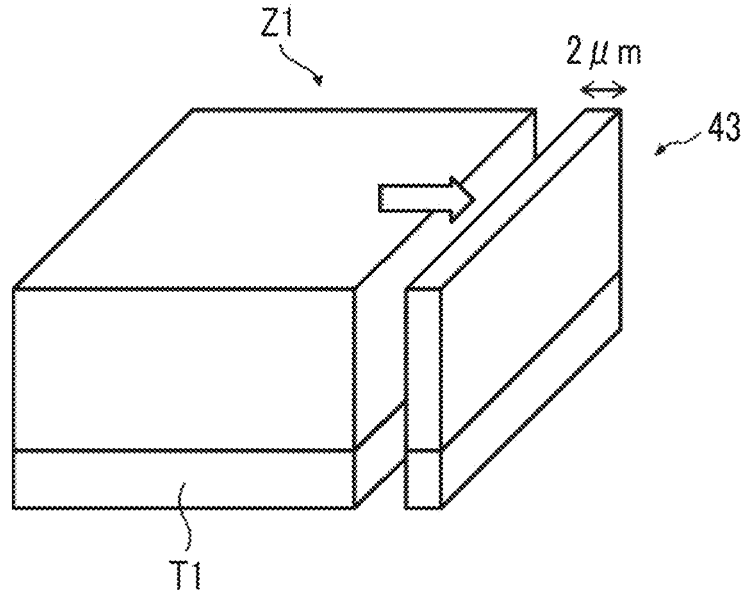
FIG. 5 is a view conceptually illustrating a method of cutting out a section for measuring an alignment angle of a first alignment layer.

First, as conceptually illustrated in FIG. 5, a first alignment layer is formed on a support, this laminate is cut into a size of 2 μm in parallel with the thickness direction (normal direction), and a section 43 serving as a sample is cut out. The cutting may be performed with, for example, a microtome.

Figure 6:
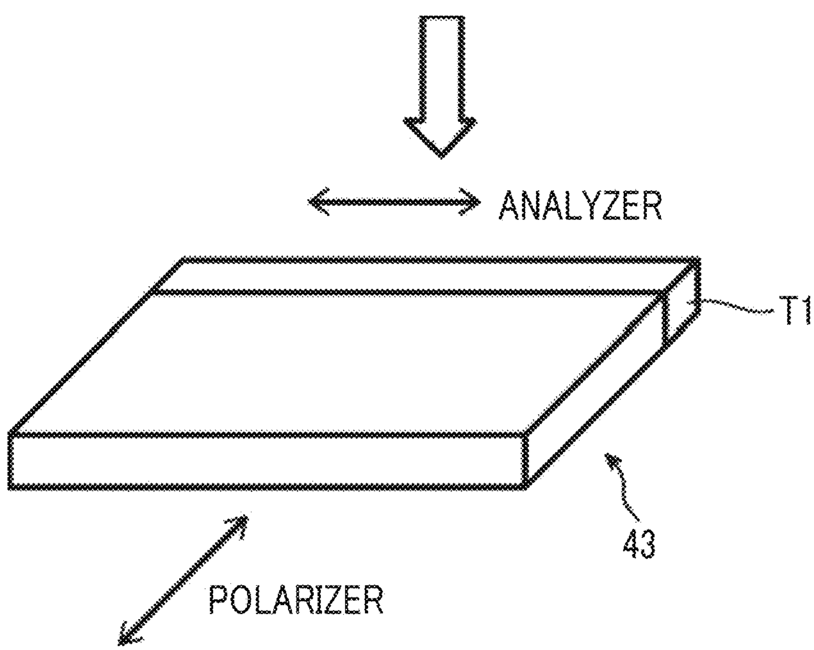
FIG. 6 is a view conceptually illustrating a method of measuring the alignment angle of the first alignment layer.

Next, as conceptually illustrated in FIG. 6, the polarizer and the analyzer are disposed in crossed nicols, the azimuthal angle at which light extinguishes on the air interface side of the first alignment layer, that is, the interface on the light absorption anisotropic layer side is observed using a polarization microscope while the azimuthal angle of the section 43 is allowed to move, a sensitive color plate (λ plate) is inserted, a change in color in the vicinity of the air interface is observed while the azimuthal angle is allowed to move, the direction of the slow axis in the section is investigated, and the alignment angle of the liquid crystal compound at the air layer-side interface is determined.

Further, the direction of the slow axis in the section is determined by investigating the azimuthal angle at which light extinguishes, inserting a sensitive color plate (λ plate), and observing a change in color while moving the azimuthal angle even in the support side of the first alignment layer, that is, the second alignment layer side and an intermediate portion of the first alignment layer in the same manner as described above, and it can be confirmed that the entire first alignment layer is hybrid-aligned.

[Second Alignment Layer]

It is preferable that the light absorption anisotropic film according to the embodiment of the present invention includes a second alignment layer on a side of the first alignment layer opposite to the light absorption anisotropic layer as a preferred embodiment. As a preferred embodiment, the light absorption anisotropic films illustrated in FIGS. 2 and 3 includes a second alignment layer 4 on the surface of the TAC film 5 serving as a support, a first alignment layer 3 on the surface of the second alignment layer 4, and a light absorption anisotropic layer on the surface of the first alignment layer 3.

The second alignment layer is an alignment layer having an alignment restricting force in an in-plane direction (direction of an azimuthal angle) and is aligned in the in-plane direction of the liquid crystal compound in the first alignment layer. In a case where the light absorption anisotropic film includes the second alignment layer, the alignment direction of the liquid crystal compound in the in-plane direction of the first alignment layer is controlled more accurately, and as a result, the alignment direction of the liquid crystal compound in the in-plane direction of the light absorption anisotropic layer can be more accurately controlled.

As the second alignment layer, various known alignment layers (alignment films) can be used as long as the liquid crystal compound can be aligned in the in-plane direction. Examples thereof include a resin film consisting of polyvinyl alcohol subjected to a rubbing treatment, polyimide, a polyfunctional (meth)acrylate compound. Among these, a polyvinyl alcohol film subjected to a rubbing treatment and a polyimide film subjected to a rubbing treatment are suitably exemplified as the second alignment layer.

In addition, a photo-alignment layer consisting of a photo-alignment material such as polyvinyl cinnamate or an azobenzene-based compound, which has been irradiated with ultraviolet rays of linearly polarized light in the normal direction of the alignment layer, can also be used as the second alignment layer.

[Liquid Crystal Compound]

As described above, in the light absorption anisotropic film according to the embodiment of the present invention, the light absorption anisotropic layer contains a liquid crystal compound and an organic dichroic substance. Further, the first alignment layer is formed by hybrid-aligning a polymerizable liquid crystal compound.

In the present invention, the liquid crystal compound may be any of a rod-like type compound (rod-like liquid crystal compound) or a disk-like type compound (disk-like liquid crystal compound), but a rod-like liquid crystal compound is preferable from the viewpoint that the alignment direction of the dichroic substance can be easily controlled.

Further, a liquid crystal compound that does not exhibit dichroism in a visible region is preferable as the rod-like liquid crystal compound.

As such a rod-like liquid crystal compound, both a low-molecular-weight liquid crystal compound and a polymer liquid crystal compound can be used. Here, "low-molecular-weight liquid crystal compound" indicates a liquid crystal compound having no repeating units in the chemical structure. Here, the term "polymer liquid crystal compound" denotes a liquid crystal compound having a repeating unit in the chemical structure.

Examples of the low-molecular-weight liquid crystal compound include liquid crystal compounds described in JP2013-228706A.

Examples of the polymer liquid crystal compound include thermotropic liquid crystal polymers described in JP2011-237513A. Further, the polymer liquid crystal compound may contain a crosslinkable group (such as an acryloyl group or a methacryloyl group) at a terminal.

The rod-like liquid crystal compound may be used alone or in combination of two or more kinds thereof.

From the viewpoint that the effects of the present invention are more excellent, the rod-like liquid crystal compound includes preferably a polymer liquid crystal compound and particularly preferably both a polymer liquid crystal compound and a low-molecular-weight liquid crystal compound.

It is preferable that the liquid crystal composition contains, as the rod-like liquid crystal compound, a liquid crystal compound represented by Formula (LC) or a polymer thereof. The liquid crystal compound represented by Formula (LC) or a polymer thereof is a compound exhibiting liquid crystallinity. The liquid crystallinity may be a nematic phase or a smectic phase, or may indicate both a nematic phase and a smectic phase. It is preferable that the liquid crystallinity exhibited by the liquid crystal compound is a smectic liquid crystal phase from the viewpoint that a light absorption anisotropic layer with a higher alignment degree order can be prepared.

The smectic phase may be a high-order smectic phase. The high-order smectic phase here denotes a smectic B phase, a smectic D phase, a smectic E phase, a smectic F phase, a smectic G phase, a smectic H phase, a smectic I phase, a smectic J phase, a smectic K phase, or a smectic L phase. Among these, a smectic B phase, a smectic F phase, or a smectic I phase is preferable.

It is preferable that the smectic liquid crystal phase exhibited by the liquid crystal compound is any of these high-order smectic liquid crystal phases from the viewpoint that a light absorption anisotropic layer with a higher alignment degree order can be prepared. Further, the light absorption anisotropic layer prepared from such a high-order smectic liquid crystal phase with a high alignment degree order is a layer in which a Bragg peak derived from a high-order structure such as a hexatic phase or a crystal phase in X-ray diffraction measurement is obtained. The Bragg peak is a peak derived from a plane periodic structure of molecular alignment, and according to the liquid crystal composition of the present invention, a light absorption anisotropic layer having a periodic interval of 3.0 to 5.0 Å can be obtained.

Q1-S1-MG-S2-Q2 (LC)

In Formula (LC), Q1 and Q2 each independently represent a hydrogen atom, a halogen atom, a linear, branched, or cyclic alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—$B(OH)_2$), a phosphate group (—$OPO(OH)_2$), a sulfate group (—$OSO_3H$), or a crosslinkable group represented by any of Formulae (P-1) to (P-30), and it is preferable that at least one of Q1 or Q2 represents a crosslinkable group represented by any of the following formulae.

(P-1)

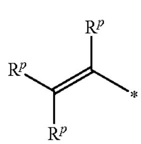

(P-2)

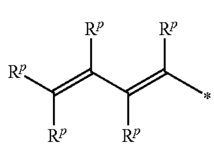

(P-3)

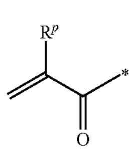

-continued (P-4)

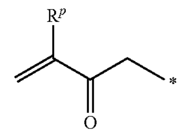

(P-5)

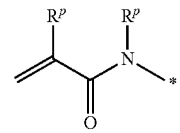

(P-6)

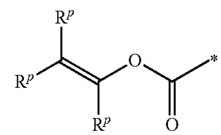

(P-7)

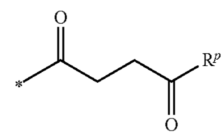

(P-8)

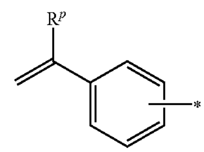

(P-9)

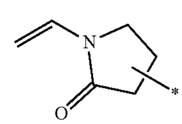

(P-10)

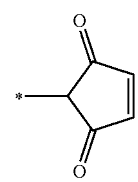

(P-11)

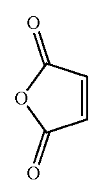

(P-12)

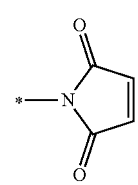

(P-13)

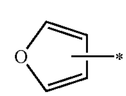

(P-14)

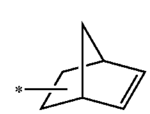

-continued (P-15)

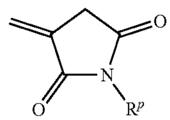

(P-16)

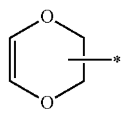

(P-17)

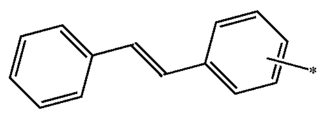

(P-18)

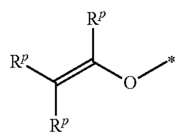

(P-19)

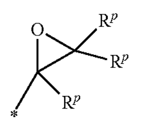

(P-20)

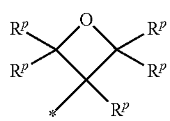

(P-21)

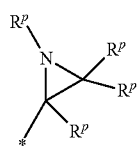

(P-22)

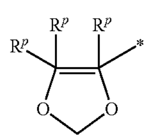

(P-23)

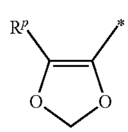

(P-24)

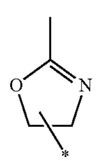

(P-25)

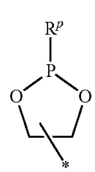

-continued (P-26)

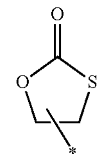

(P-27)

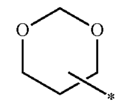

(P-28)

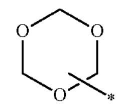

(P-29)

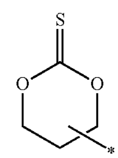

(P-30)

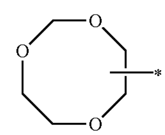

In Formulae (P-1) to (P-30), RP represents a hydrogen atom, a halogen atom, a linear, branched, or cyclic alkylene group having 1 to 10 carbon atoms, a halogenated alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—$B(OH)_2$), a phosphate group (—$OPO(OH)_2$), or a sulfate group (—$OSO_3H$), and a plurality of RP's may be the same as or different from each other.

Preferred embodiments of the crosslinkable group include a radically polymerizable group and a cationically polymerizable group. As the radically polymerizable group, a vinyl group represented by Formula (P-1), a butadiene group represented by Formula (P-2), a (meth)acryl group represented by Formula (P-4), a (meth)acrylamide group represented by Formula (P-5), a vinyl acetate group represented by Formula (P-6), a fumaric acid ester group represented by Formula (P-7), a styryl group represented by Formula (P-8), a vinylpyrrolidone group represented by Formula (P-9), a maleic acid anhydride represented by Formula (P-11), or a maleimide group represented by Formula (P-12) is preferable. As the cationically polymerizable group, a vinyl ether group represented by Formula (P-18), an epoxy group represented by Formula (P-19), or an oxetanyl group represented by Formula (P-20) is preferable.

In Formula (LC), S1 and S2 each independently represent a divalent spacer group, and preferred embodiments of S1 and S2 include the same structures as those for SPW in Formula (W1), and thus the description thereof will not be repeated.

In Formula (LC), MG represents a mesogen group described below. The mesogen group represented by MG is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited, and for example, particularly description on pages 7 to 16 of “Flussige Kristalle in Tabellen II” (VEB Deutsche Verlag fur Grundstoff Industrie, Leipzig, 1984) and particularly the description in Chapter 3 of “Liquid Crystal Handbook” (Maruzen, 2000) edited by Liquid Crystal Handbook Editing Committee can be referred to.

The mesogen group represented by MG has preferably 2 to 10 cyclic structures and more preferably 3 to 7 cyclic structures.

Specific examples of the cyclic structure include an aromatic hydrocarbon group, a heterocyclic group, and an alicyclic group.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group represented by MG, a group represented by Formula (MG-A) or Formula (MG-B) is preferable, and a group represented by Formula (MG-B) is more preferable.

$$*-\!\left(A1\right)_{a1}\!-*\qquad \text{(MG-A)}$$

$$*-\!\left(A2-LA1\right)_{a2}\!-A3-*\qquad \text{(MG-B)}$$

In Formula (MG-A), A1 represents a divalent group selected from the group consisting of an aromatic hydrocarbon group, a heterocyclic group, and an alicyclic group. These groups may be substituted with a substituent such as the substituent W.

It is preferable that the divalent group represented by A1 is a 4- to 15-membered ring. Further, the divalent group represented by A1 may be a monocycle or a fused ring.

Further, * represents a bonding position with respect to S1 or S2.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, a thienooxazole-diyl group, and the following structures (II-1) to (II-4).

(II-1)

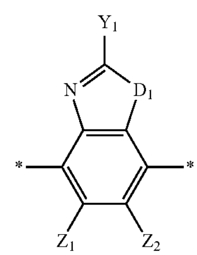

(II-2)

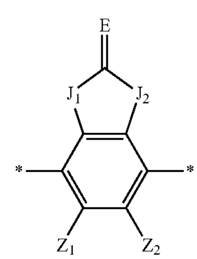

(II-3)

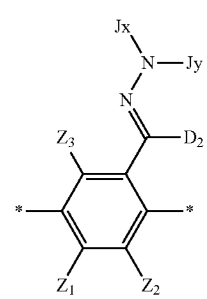

-continued (II-4)

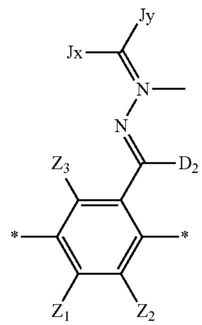

In Formulae (II-1) to (II-4), $D_1$ represents —S—, —O—, or $NR^{11}$—, $R^{11}$ represents a hydrogen atom or an alkyl group having 1 to 6 carbon atoms, $Y_1$ represents an aromatic hydrocarbon group having 6 to 12 carbon atoms or an aromatic heterocyclic group having 3 to 12 carbon atoms, $Z_1$, $Z_2$, and $Z_3$ each independently represent a hydrogen atom, an aliphatic hydrocarbon group having 1 to 20 carbon atoms, an alicyclic hydrocarbon group having 3 to 20 carbon atoms, a monovalent aromatic hydrocarbon group having 6 to 20 carbon atoms, a halogen atom, a cyano group, a nitro group, —$NR^{12}R^{13}$, or $SR^{12}$, $Z_1$ and $Z_2$ may be bonded to each other to form an aromatic ring or an aromatic heterocyclic ring, $R^{12}$ and $R^{13}$ each independently represent a hydrogen atom or an alkyl group having 1 to 6 carbon atoms, $J_1$ and $J_2$ each independently represent a group selected from the group consisting of —O—, —$NR^{21}$— ($R^{21}$ represents a hydrogen atom or substituent), —S—, and C(O)—, E represents a hydrogen atom or a non-metal atom of a Group 14 to a Group 16 to which a substituent may be bonded, Jx represents an organic group having 2 to 30 carbon atoms, which has at least one aromatic ring selected from the group consisting of an aromatic hydrocarbon ring and an aromatic heterocyclic ring, Jy represents a hydrogen atom, an alkyl group having 1 to 6 carbon atoms which may have a substituent, or an organic group having 2 to 30 carbon atoms which has at least one aromatic ring selected from the group consisting of an aromatic hydrocarbon ring and an aromatic heterocyclic ring, the aromatic ring of Jx and Jy may have a substituent, Jx and Jy may be bonded to each other to form a ring, and $D_2$ represents a hydrogen atom or an alkyl group having 1 to 6 carbon atoms which may have a substituent.

In Formula (II-2), in a case where $Y_1$ represents an aromatic hydrocarbon group having 6 to 12 carbon atoms, the aromatic hydrocarbon group may be monocyclic or polycyclic. In a case where $Y_1$ represents an aromatic heterocyclic group having 3 to 12 carbon atoms, the aromatic heterocyclic group may be monocyclic or polycyclic.

In Formula (II-2), in a case where $J_1$ and $J_2$ represent —$NR^{21}$—, the substituent as $R^{21}$ can refer to, for example, the description in paragraphs [0035] to [0045] of JP2008-107767A, and the content thereof is incorporated in the present specification.

In Formula (II-2), in a case where E represents a non-metal atom of a Group 14 to a Group 16 to which a substituent may be bonded, =O, =S, =NR', or =C(R')R' is preferable. R' represents a substituent, and as the substituent, for example, the description in paragraphs [0035] to [0045] of JP2008-107767A can be referred to, and —$NZ^{A1}Z^{A2}$ ($Z^{A1}$ and $Z^{A2}$ each independently represent a hydrogen atom, an alkyl group, or an aryl group) is preferable.

Specific examples of the divalent alicyclic group represented by A1 include a cyclopentylene group and a cyclohexylene group, and the carbon atoms thereof may be substituted with —O—, —$Si(CH_3)_2$—, —N(Z)— (Z represents a hydrogen atom, an alkyl group having 1 to 4 carbon atoms, a cycloalkyl group, an aryl group, a cyano group, or a halogen atom), —C(O)—, —S—, —C(S)—, —S(O)—, —$SO_2$—, or a group obtained by combining two or more of these groups.

In Formula (MG-A), a1 represents an integer of 2 to 10. The plurality of A1's may be the same as or different from each other.

In Formula (MG-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (MG-A), and thus description thereof will not be repeated.

In Formula (MG-B), a2 represents an integer of 1 to 10, a plurality of A2's may be the same as or different from each other, and a plurality of LA1's may be the same as or different from each other. From the viewpoint that the effects of the present invention are more excellent, it is more preferable that a2 represents 2 or greater.

In Formula (MG-B), LA1 represents a single bond or a divalent linking group. Here, LA1 represents a divalent linking group in a case where a2 represents 1, and at least one of the plurality of LA1's represents a divalent linking group in a case where a2 represents 2 or greater.

In Formula (MG-B), examples of the divalent linking group represented by LA1 are the same as those for LW, and thus the description thereof will not be repeated.

Specific examples of MG include the following structures, the hydrogen atoms on the aromatic hydrocarbon group, the heterocyclic group, and the alicyclic group in the following structures may be substituted with the substituent W described above.

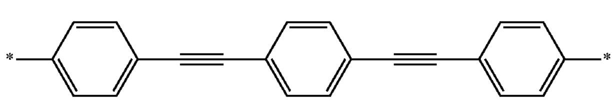

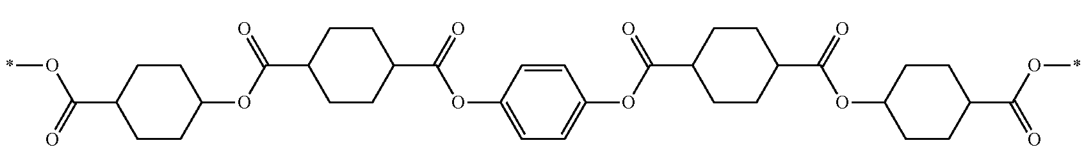

-continued
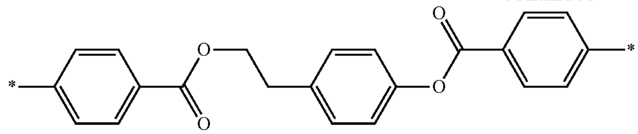
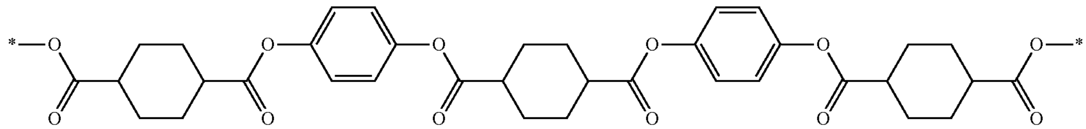
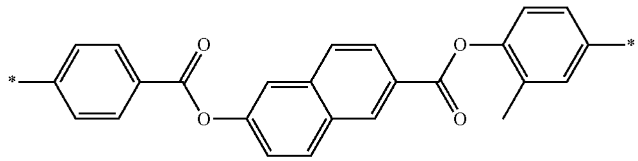
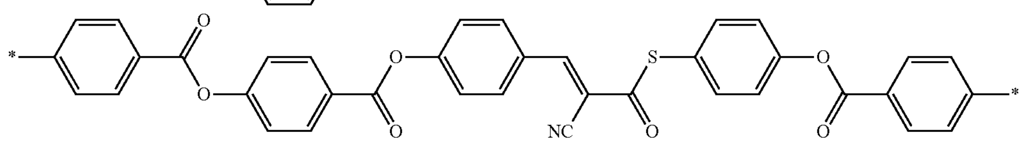
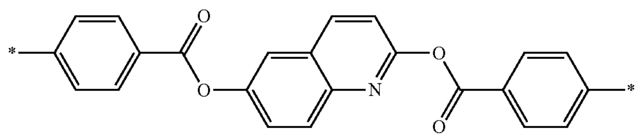
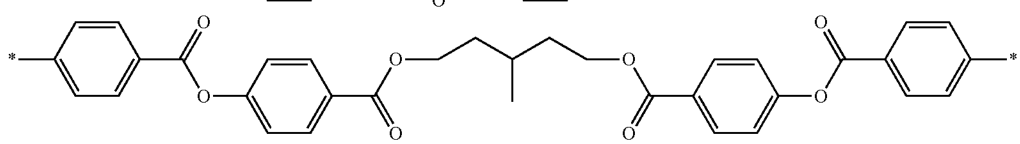
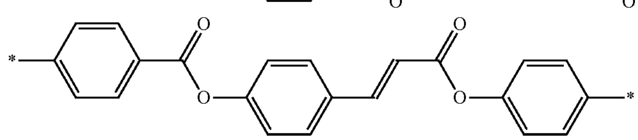
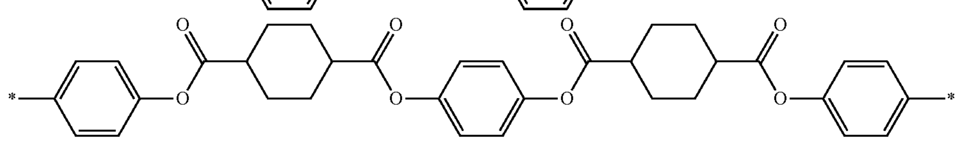
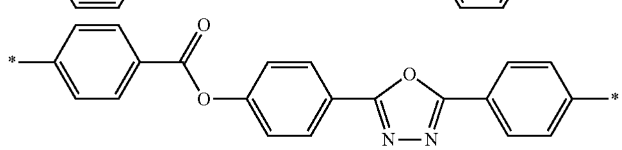
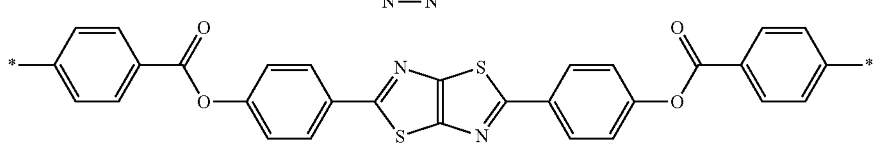
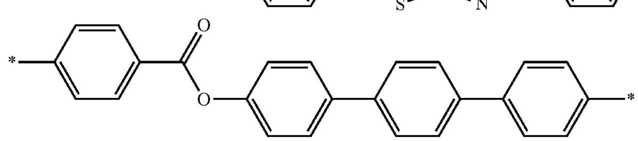
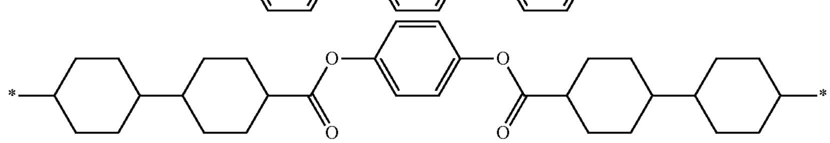
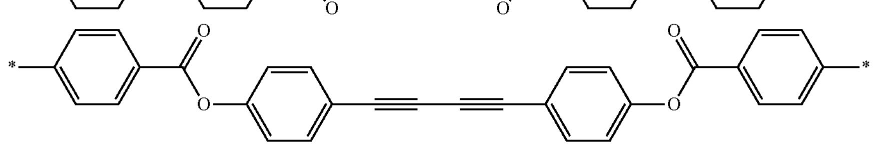

-continued
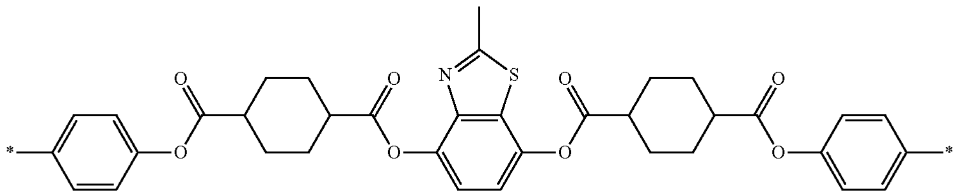
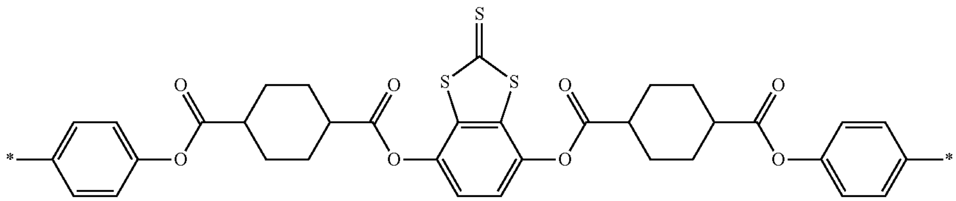
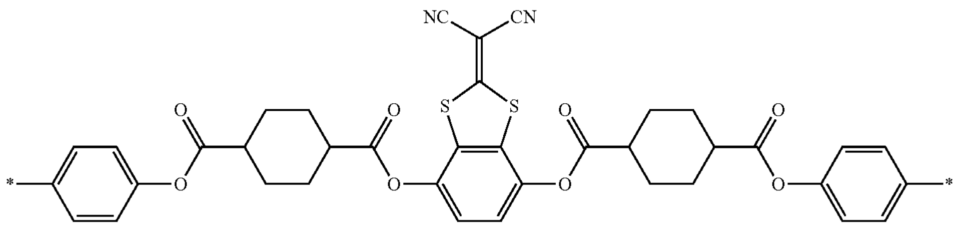
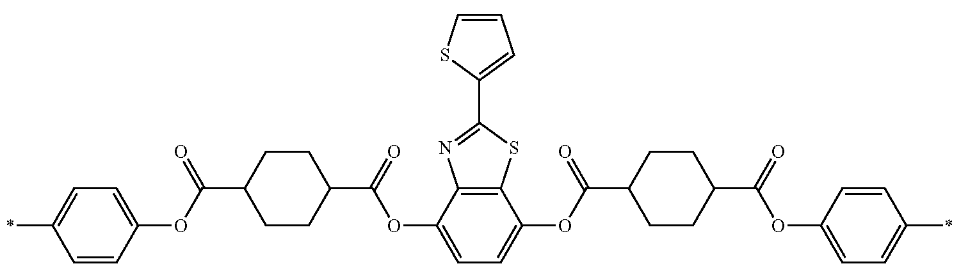
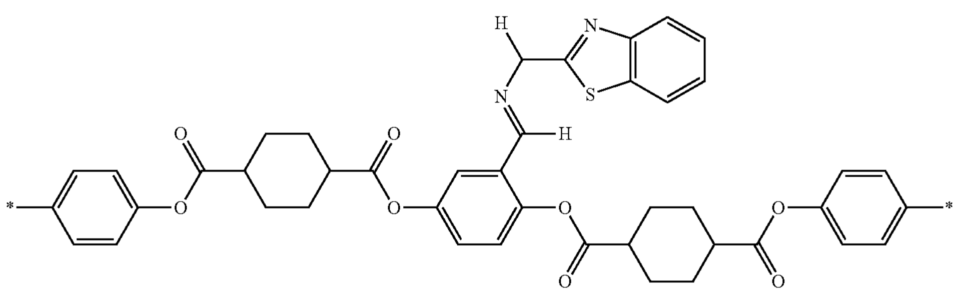
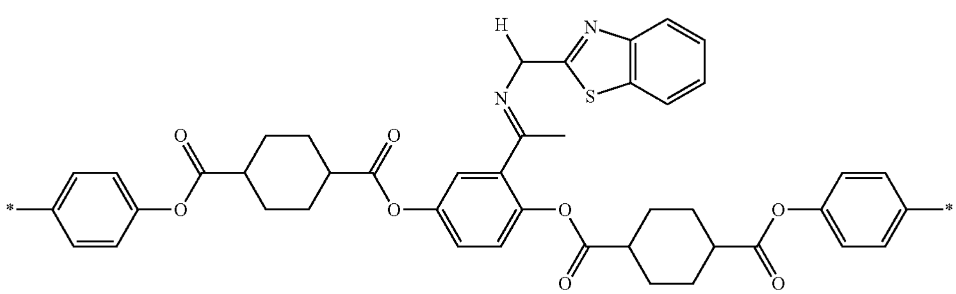

-continued
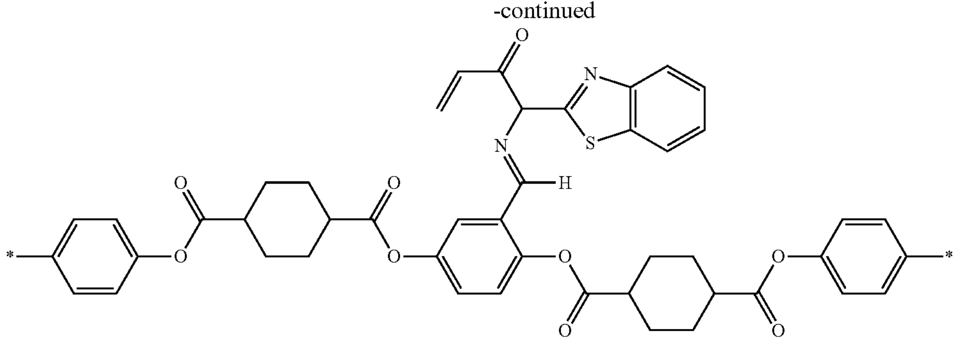
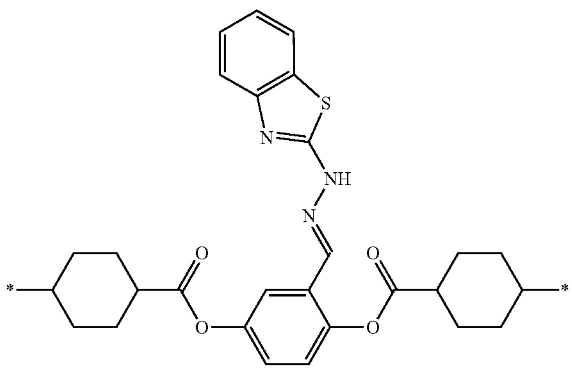
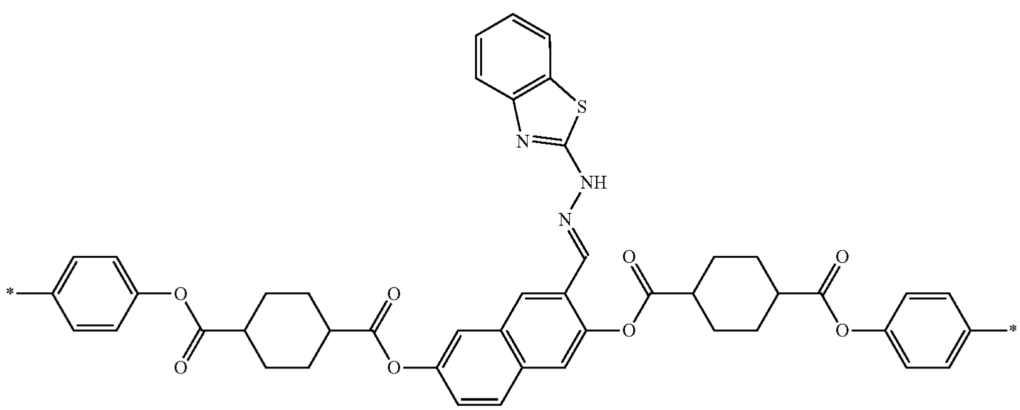
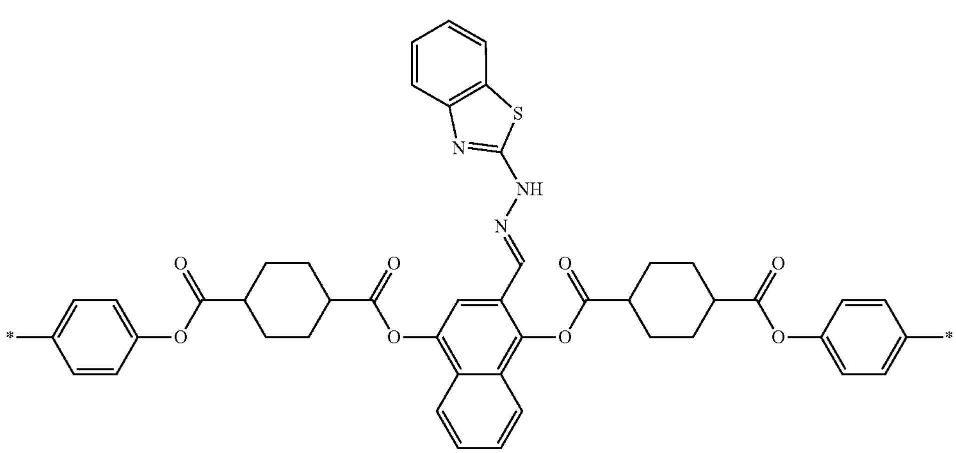

-continued
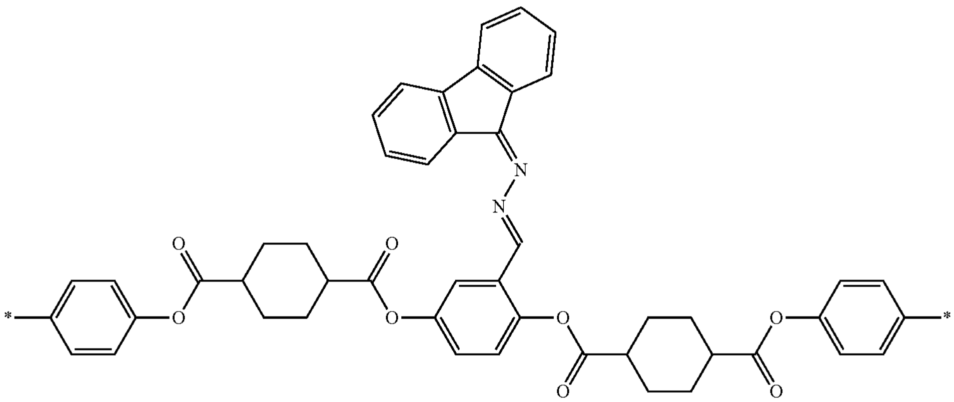
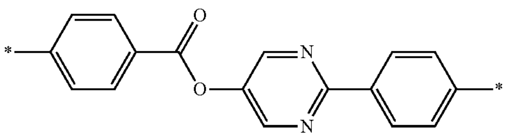
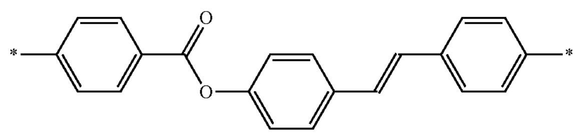
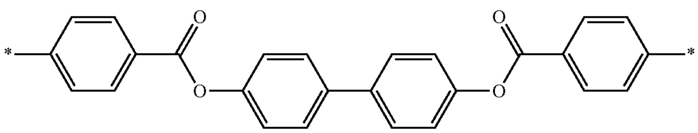
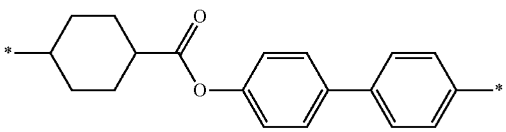
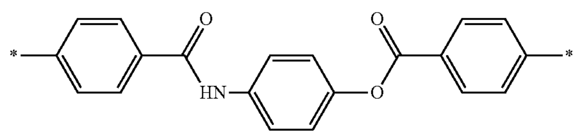
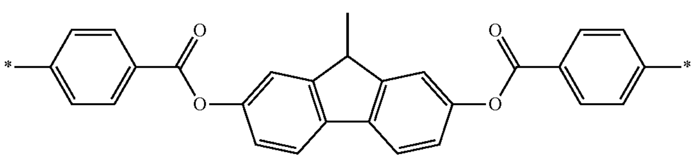
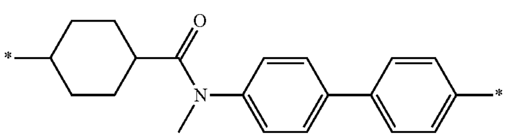
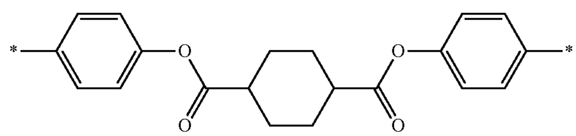
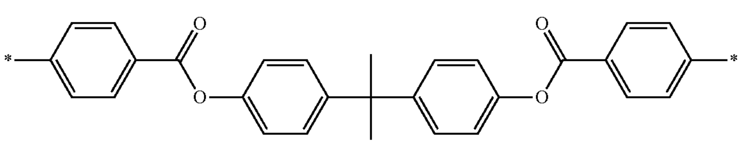
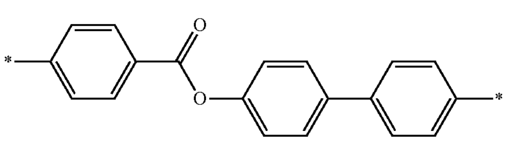
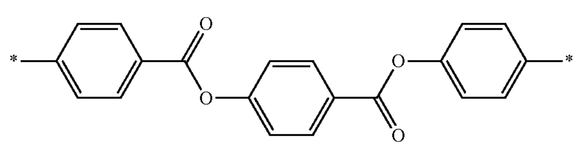
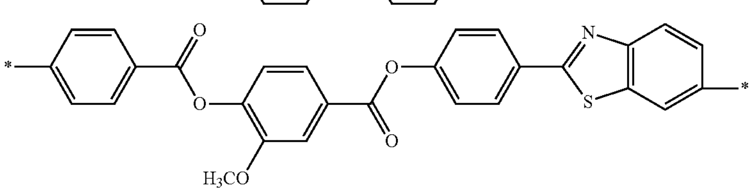
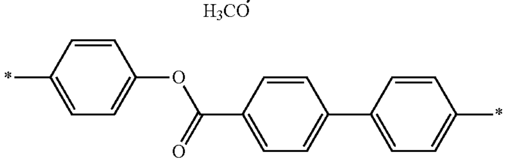
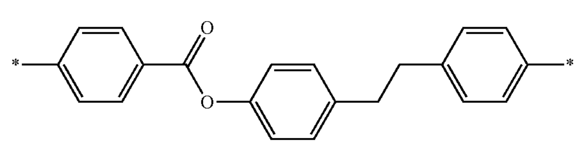

-continued
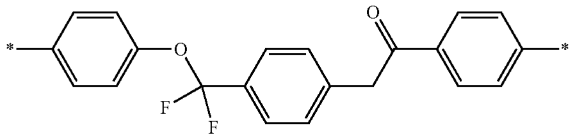
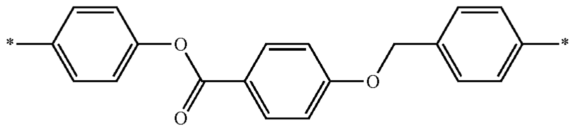
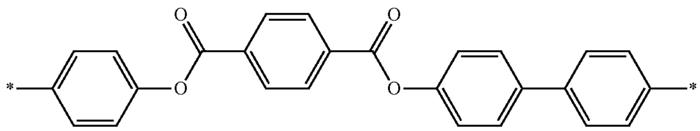
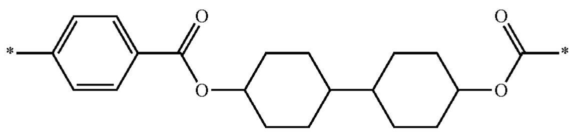
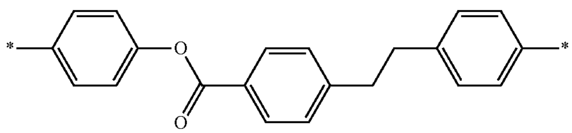
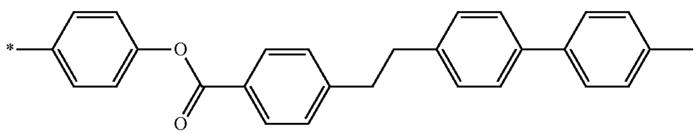
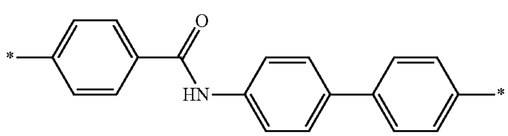
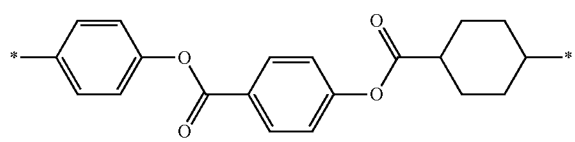
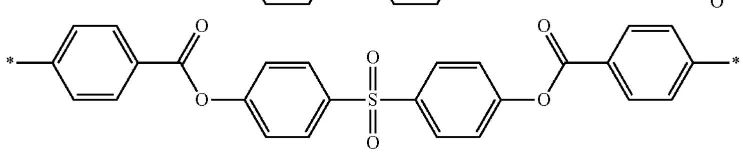
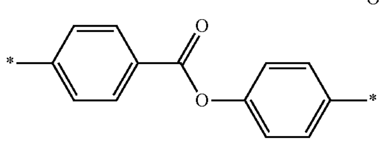
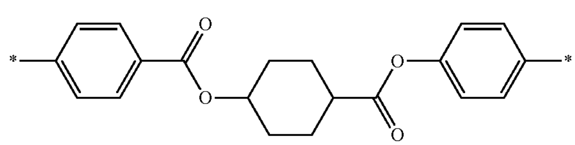
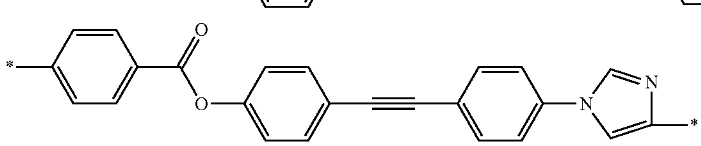
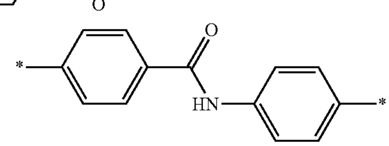
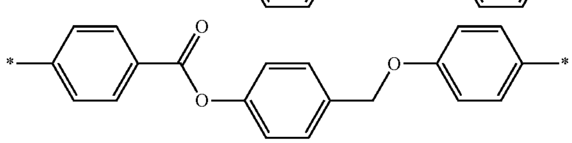
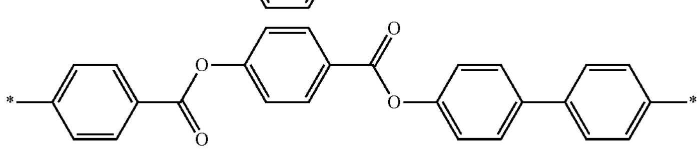
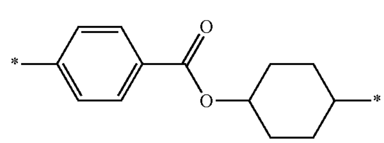
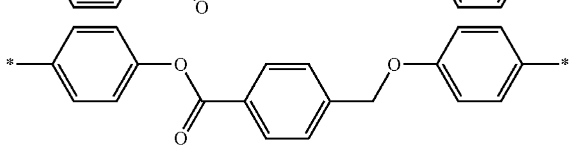

-continued
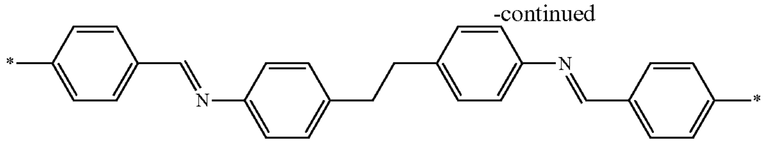
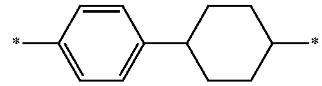
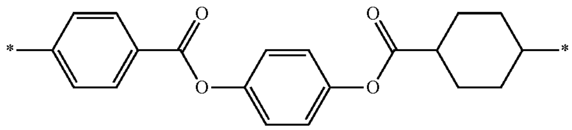
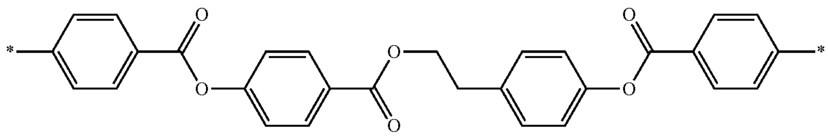
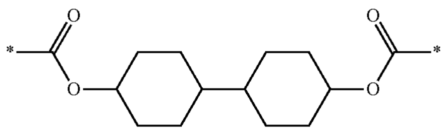
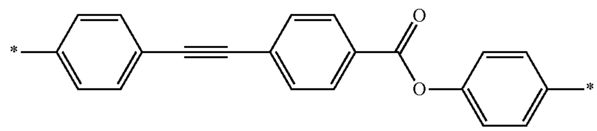
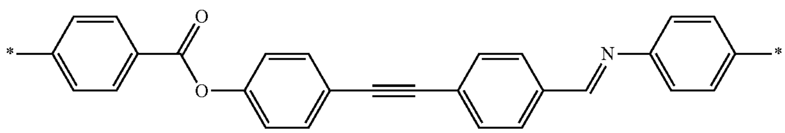
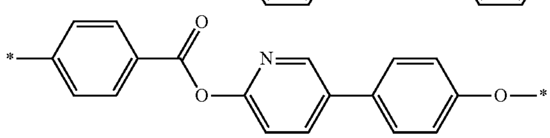
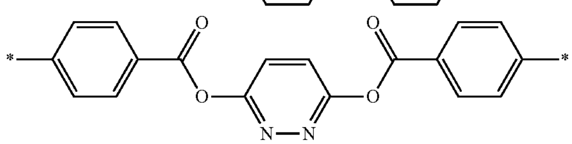
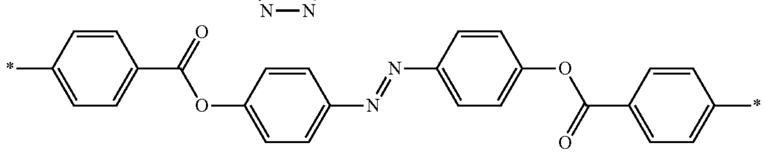
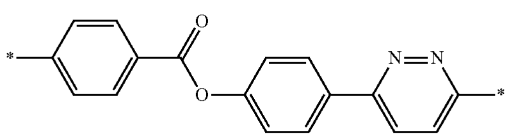
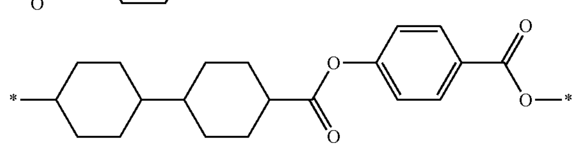
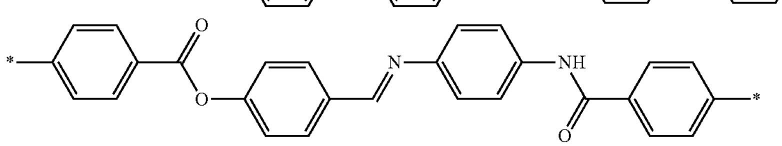
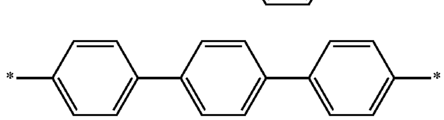
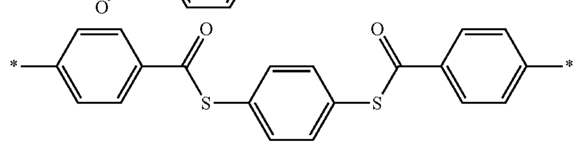
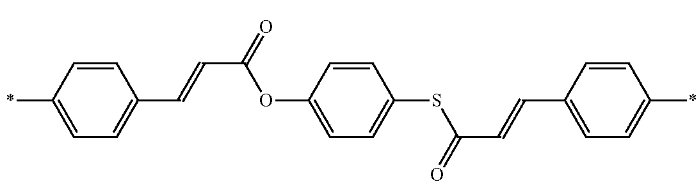
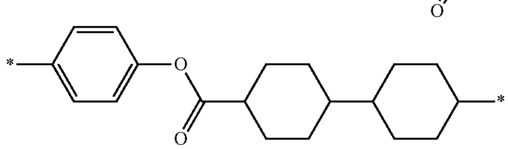
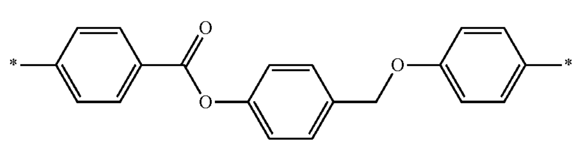

-continued

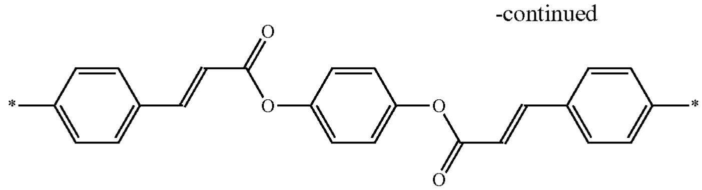

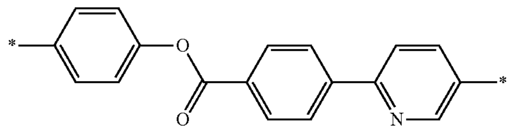

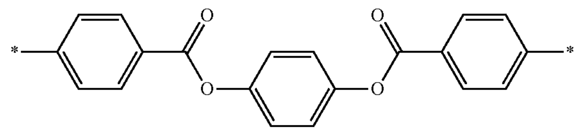

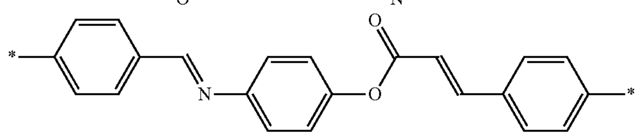

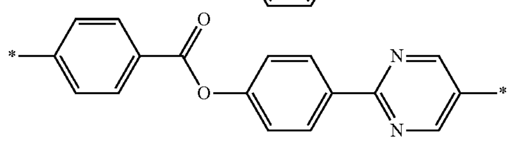

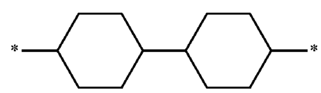

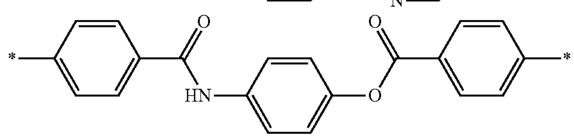

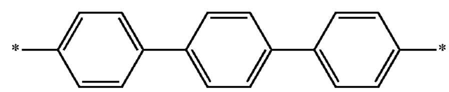

<Low-Molecular-Weight Liquid Crystal Compound>

In a case where the liquid crystal compound represented by Formula (LC) is a low-molecular-weight liquid crystal compound, examples of preferred embodiments of the cyclic structure of the mesogen group MG include a cyclohexylene group, a cyclopentylene group, a phenylene group, a naphthylene group, a fluorene-diyl group, a pyridine-diyl group, a pyridazine-diyl group, a thiophene-diyl group, an oxazole-diyl group, a thiazole-diyl group, and a thienothiophene-diyl group, and the number of cyclic structures is preferably in a range of 2 to 10 and more preferably in a range of 3 to 7.

Examples of preferred embodiments of the substituent W having a mesogen structure include a halogen atom, a halogenated alkyl group, a cyano group, a hydroxy group, a nitro group, a carboxy group, an alkoxy group having 1 to 10 carbon atoms, an alkylcarbonyl group having 1 to 10 carbon atoms, an alkyloxycarbonyl group having 1 to 10 carbon atoms, an alkylcarbonyloxy group having 1 to 10 carbon atoms, an amino group, an alkylamino group having 1 to 10 carbon atoms, an alkylaminocarbonyl group, and a group in which LW in Formula (W1) represents a single bond, SPW represents a divalent spacer group, and Q represents a crosslinkable group represented by any of Formulae (P-1) to (P-30), and preferred examples of the crosslinkable group include a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group.

The preferred embodiments of the divalent spacer groups S1 and S2 are the same as those for the SPW, and thus the description thereof will not be repeated.

In a case where a low-molecular-weight liquid crystal compound exhibiting smectic properties is used, the number of carbon atoms of the spacer group (the number of atoms in a case where the carbon atoms are substituted with "SP—C") is preferably 6 or more and more preferably 8 or more.

In a case where the liquid crystal compound represented by Formula (LC) is a low-molecular-weight liquid crystal compound, a plurality of low-molecular-weight liquid crystal compounds may be used in combination, preferably 2 to 6 kinds of low-molecular-weight liquid crystal compounds are used in combination, and more preferably 2 to 4 kinds of low-molecular-weight liquid crystal compounds are used in combination. By using low-molecular-weight liquid crystal compounds in combination, the solubility can be improved and the phase transition temperature of the liquid crystal composition can be adjusted.

Specific examples of the low-molecular-weight liquid crystal compound include compounds represented by Formulae (LC-1) to (LC-77), but the low-molecular-weight liquid crystal compound is not limited thereto.

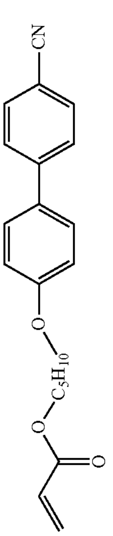
(LC-1)
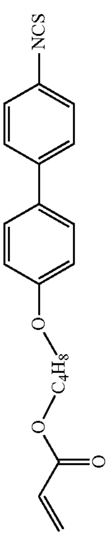
(LC-2)
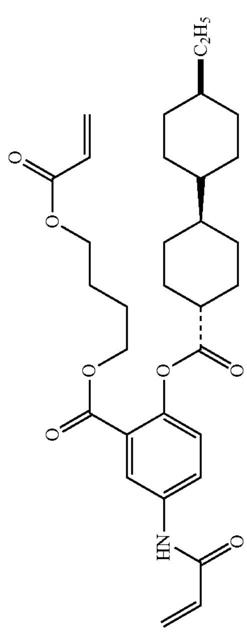
(LC-3)
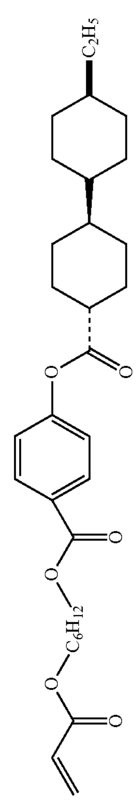
(LC-4)
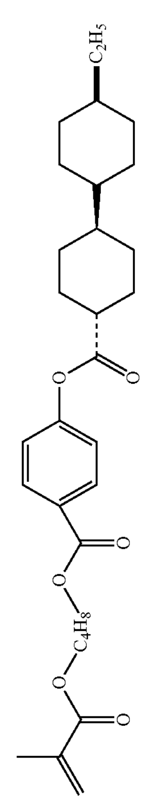
(LC-5)
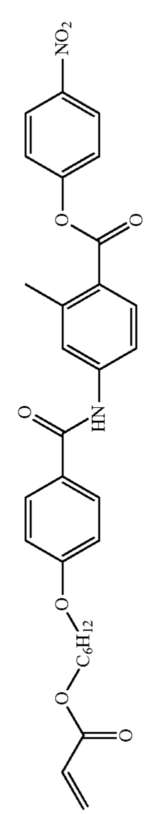
(LC-6)
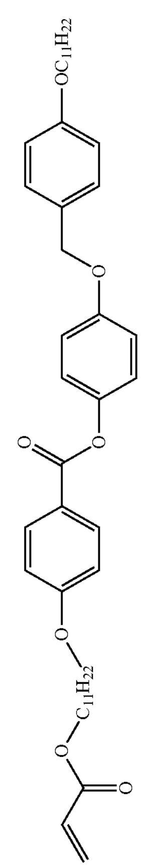
(LC-7)

-continued
(LC-8)
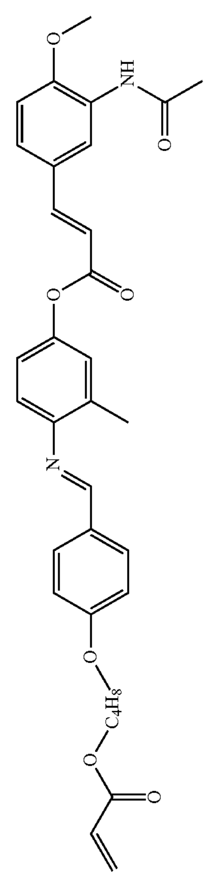
(LC-9)
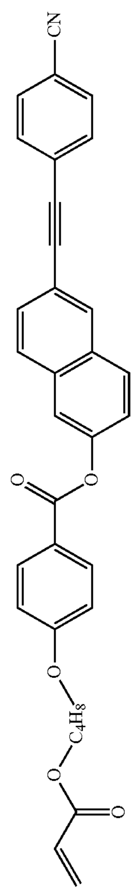
(LC-10)
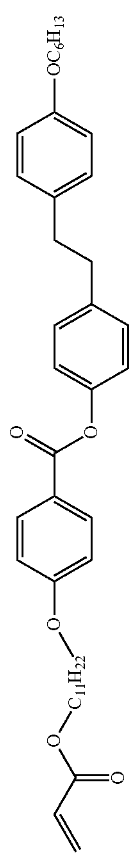
(LC-11)
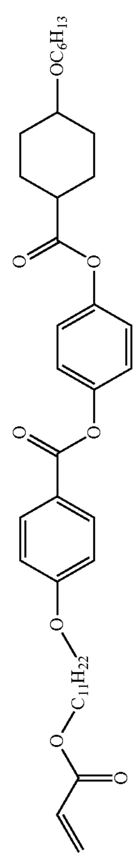
(LC-12)
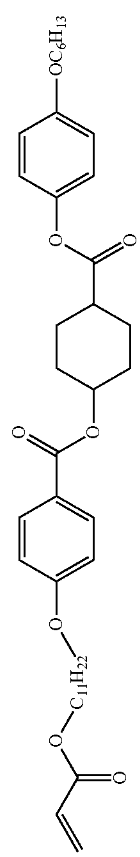
(LC-13)
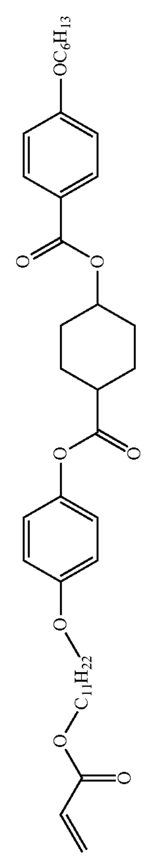
(LC-14)
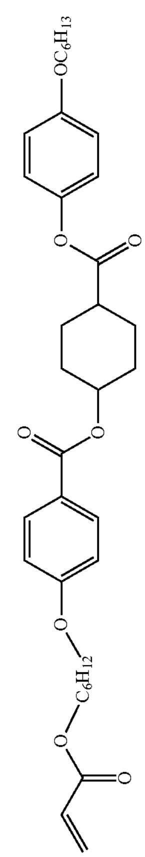

-continued
(LC-15)
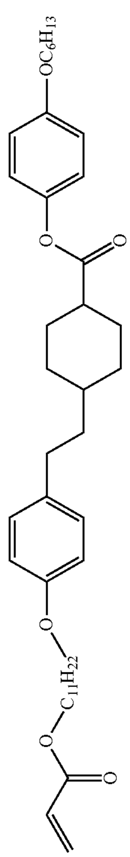
(LC-16)
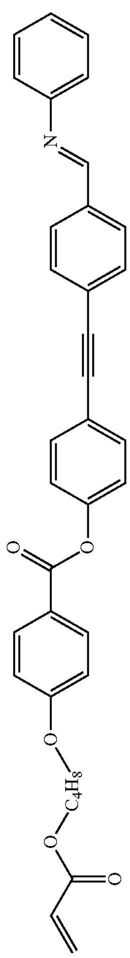
(LC-17)
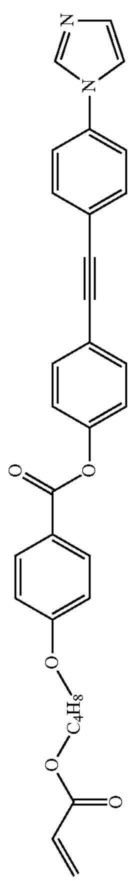
(LC-18)
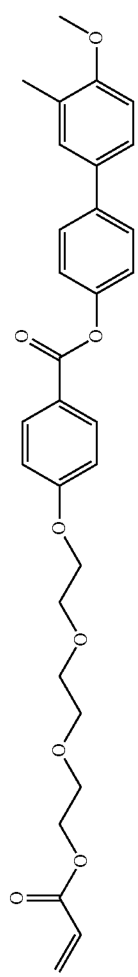
(LC-19)
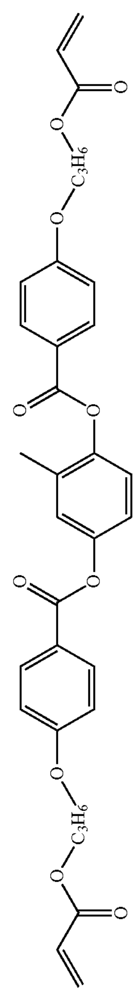
(LC-20)
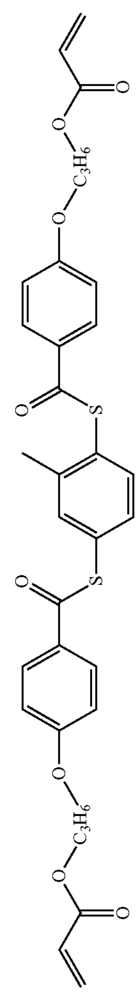
(LC-21)
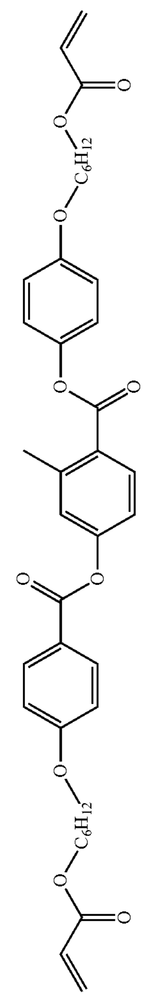

-continued
(LC-22)
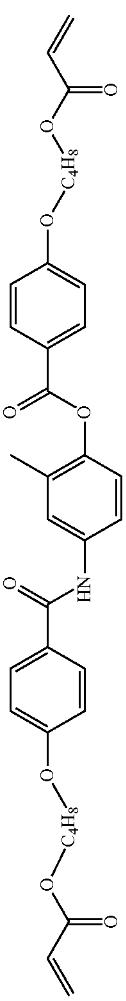
(LC-23)
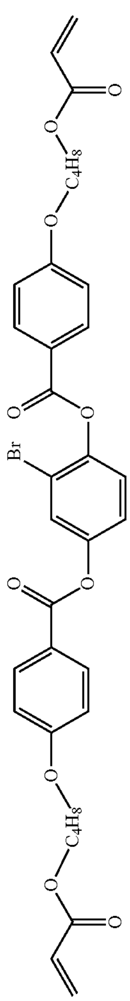
(LC-24)
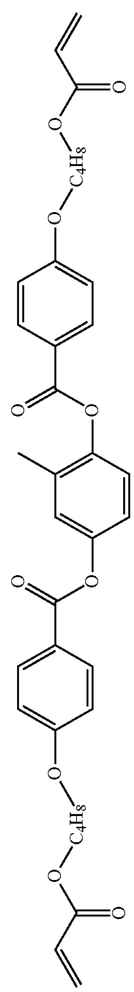
(LC-25)
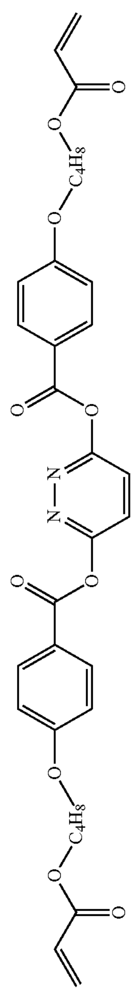
(LC-26)
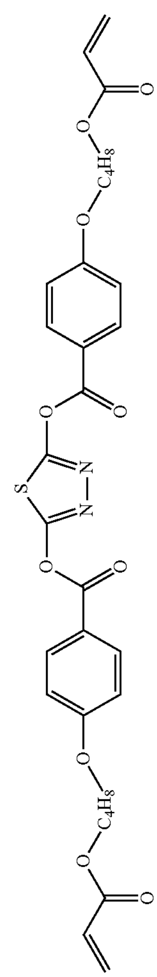
(LC-27)
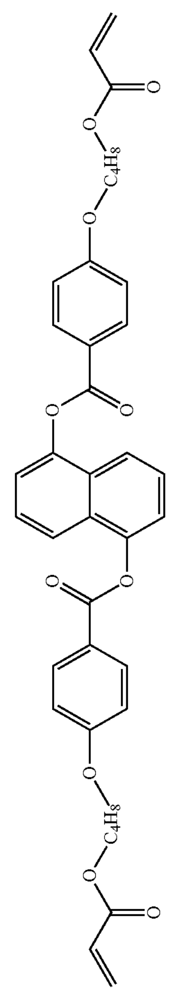

-continued
(LC-28)
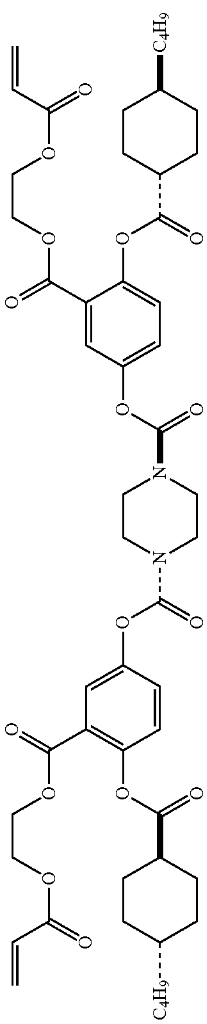
(LC-29)
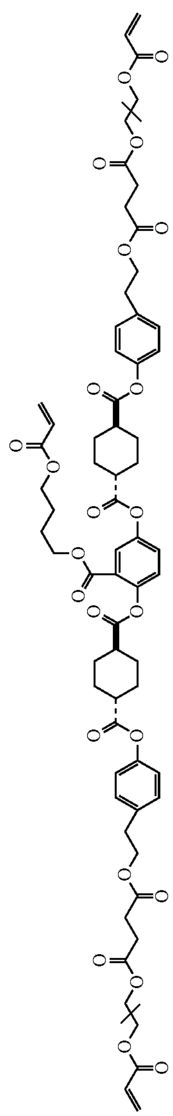
(LC-30)
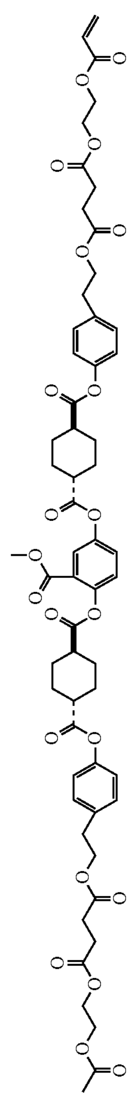
(LC-31)
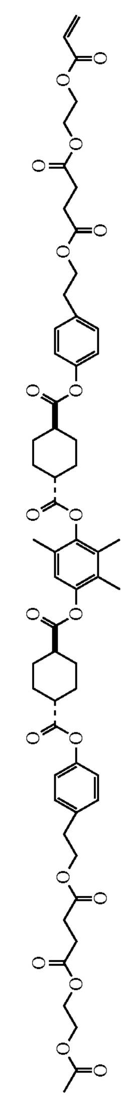
(LC-32)
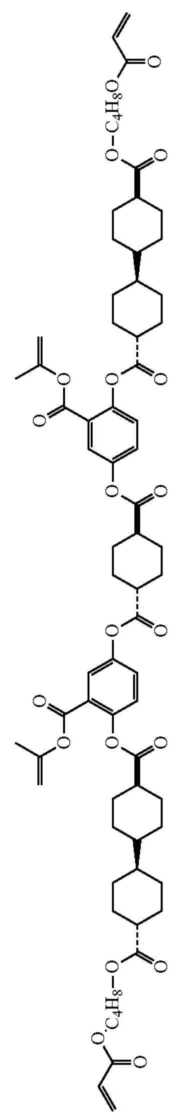

-continued
(LC-33)
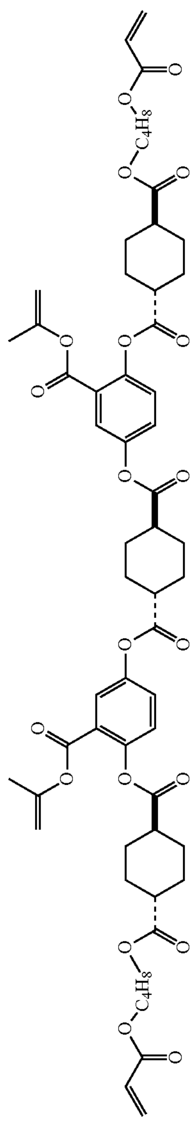
(LC-34)
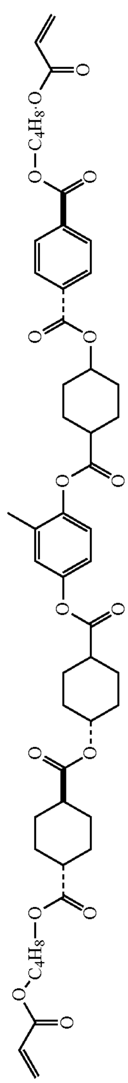
(LC-35)
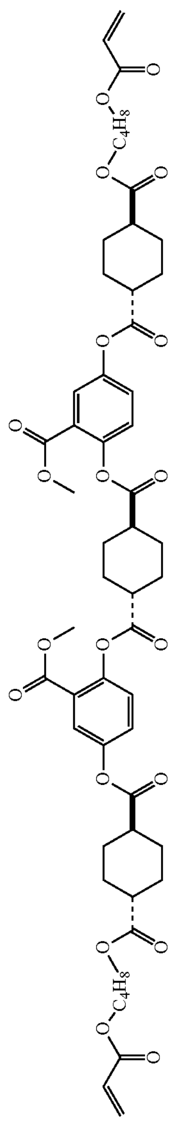
(LC-36)
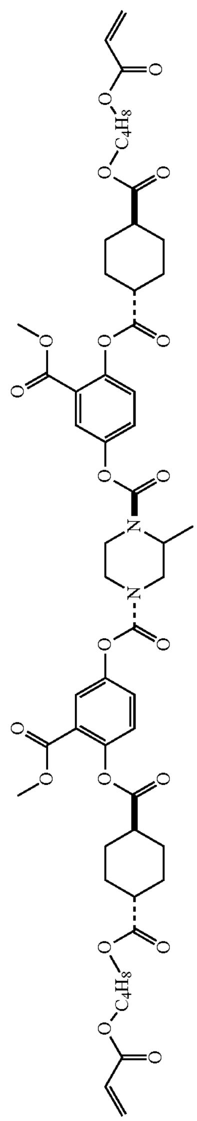
(LC-37)
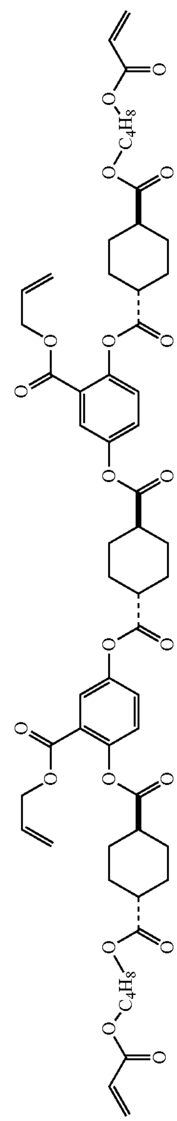

-continued
(LC-38)
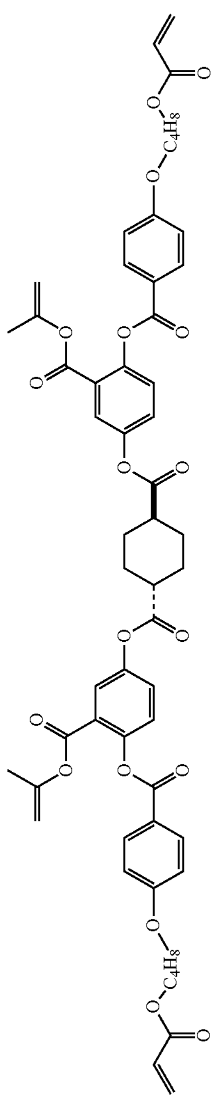
(LC-39)
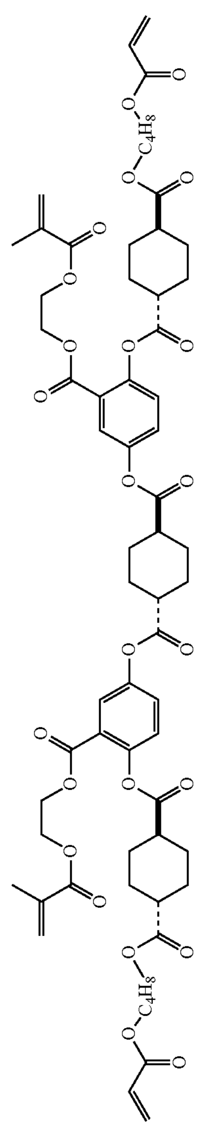
(LC-40)
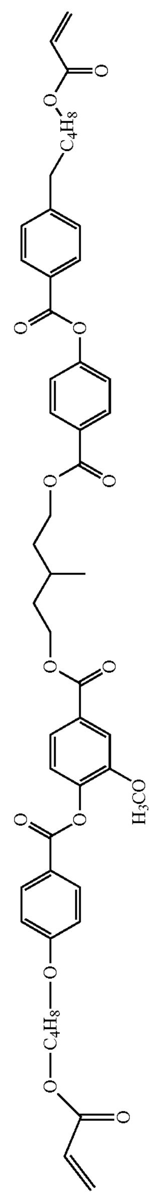
(LC-41)
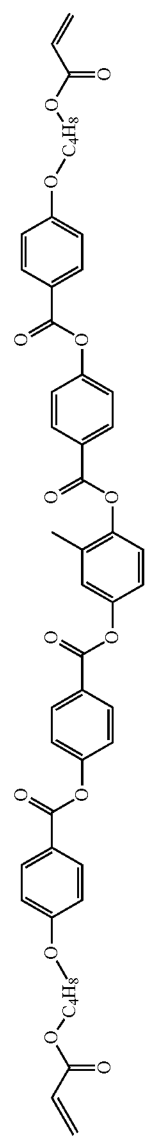
(LC-42)
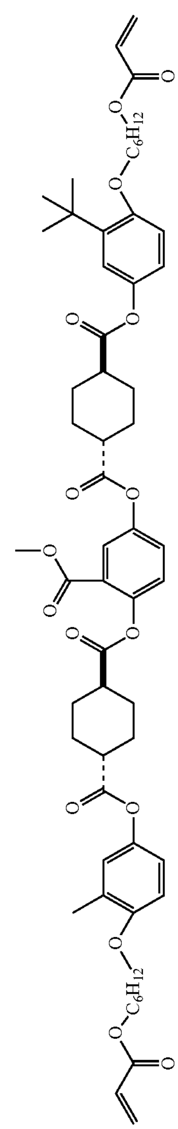

-continued
(LC-43)
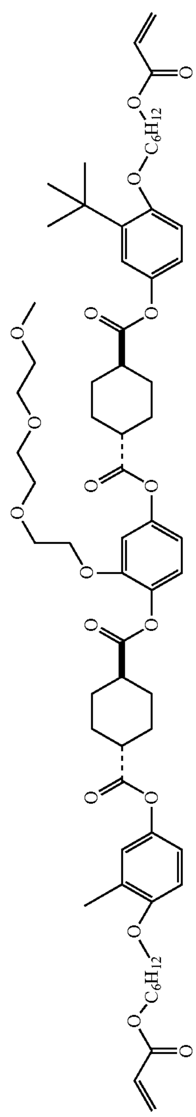
(LC-44)
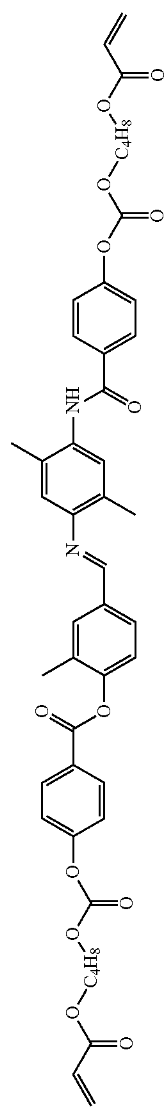
(LC-45)
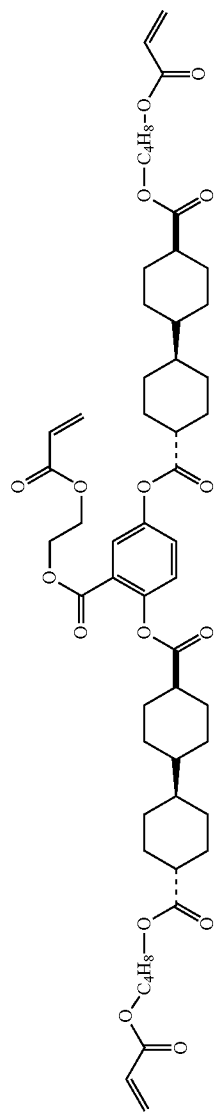
(LC-46)
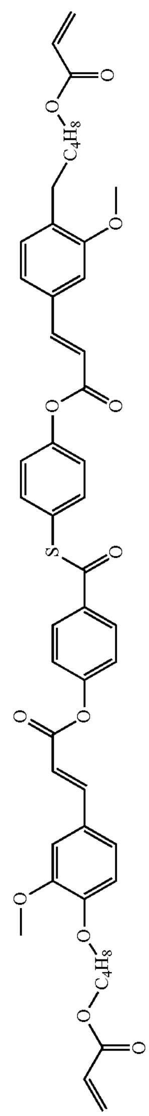
(LC-47)
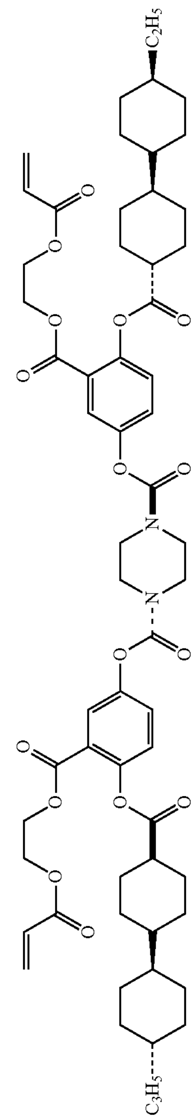

-continued
(LC-48)
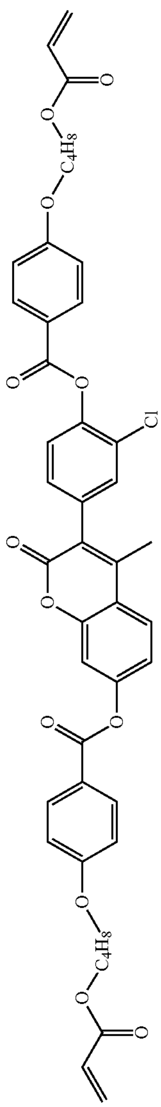
(LC-49)
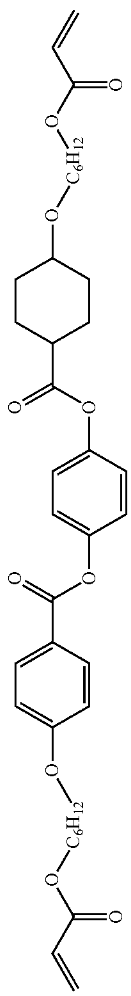
(LC-50)
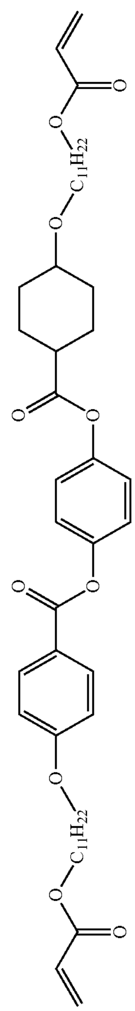
(LC-51)
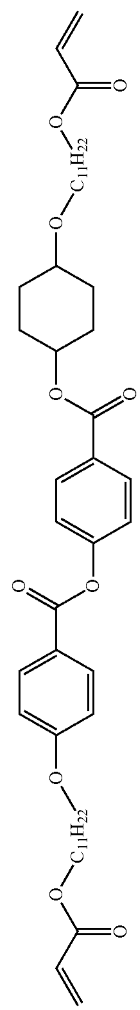
(LC-52)
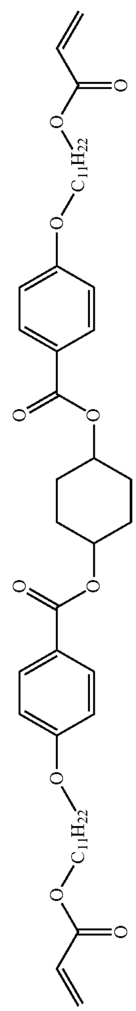
(LC-53)
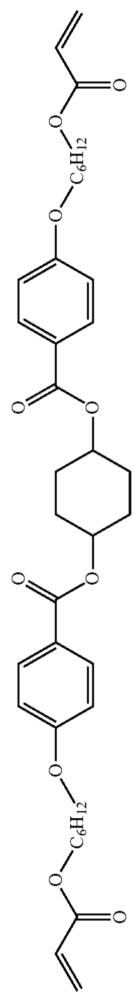
(LC-54)
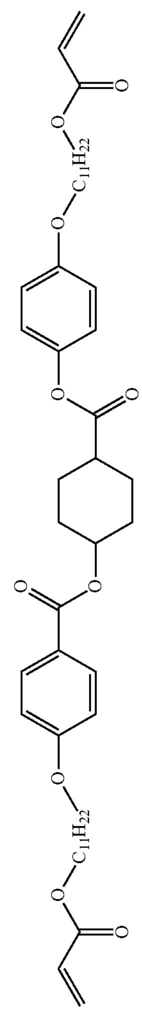

-continued
(LC-55)
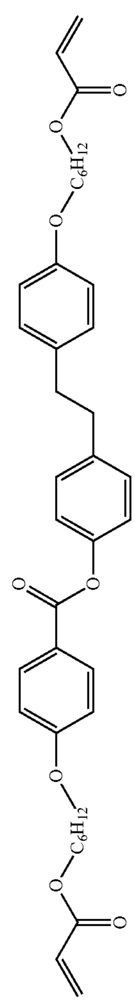
(LC-56)
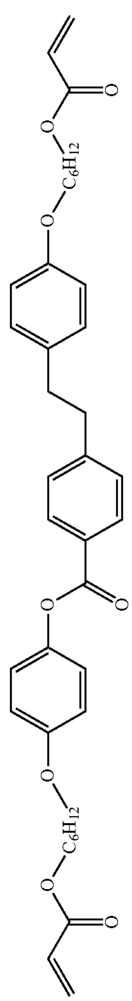
(LC-57)
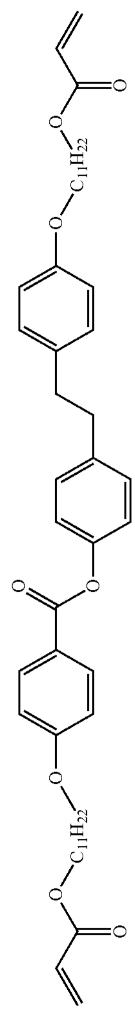
(LC-58)
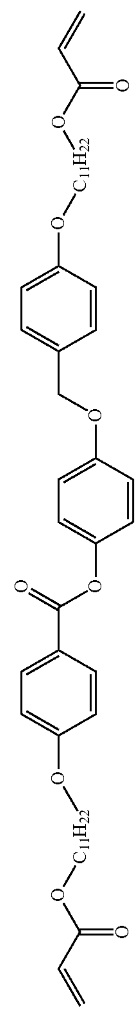
(LC-59)
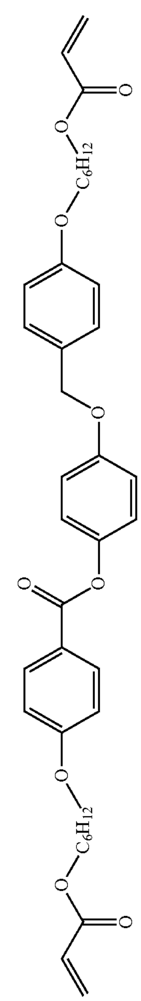
(LC-60)
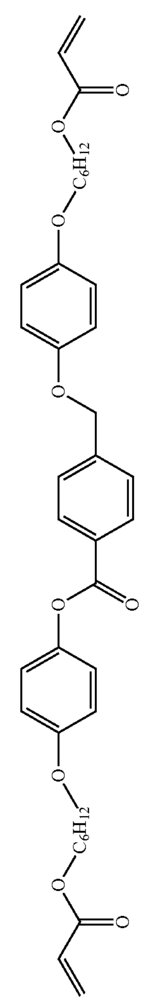
(LC-61)
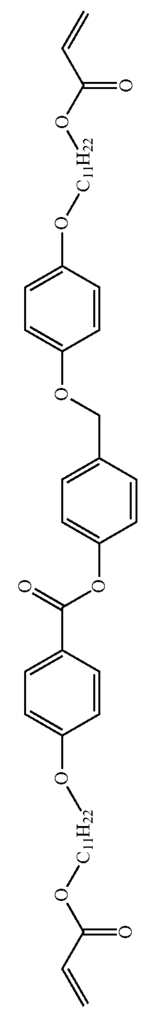

-continued
(LC-62)
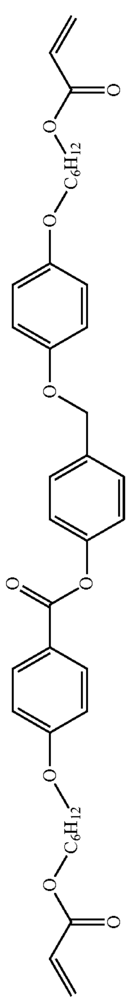
(LC-63)
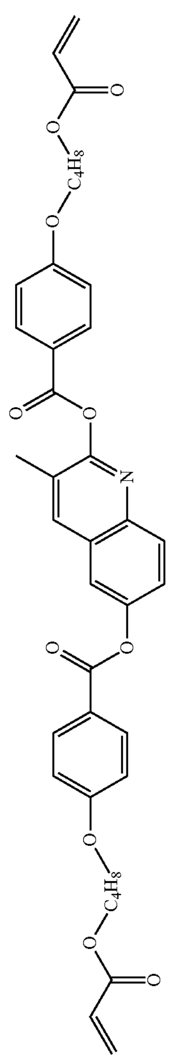
(LC-64)
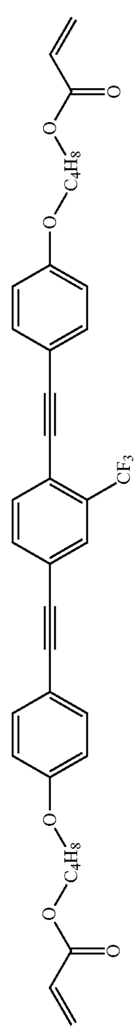
(LC-65)
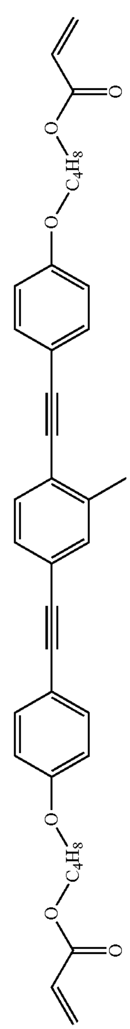
(LC-66)
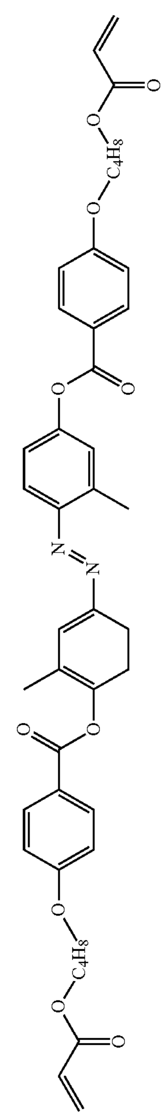
(LC-67)
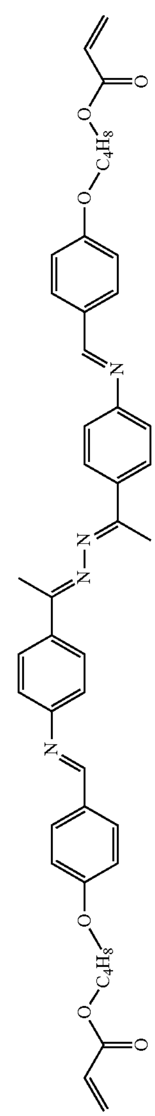

-continued
(LC-68)
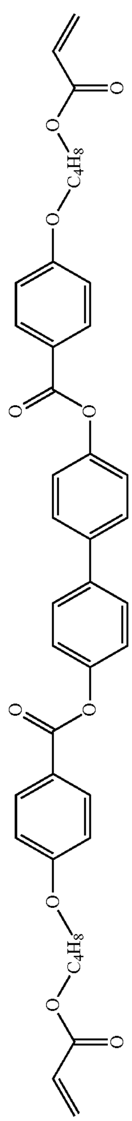
(LC-69)
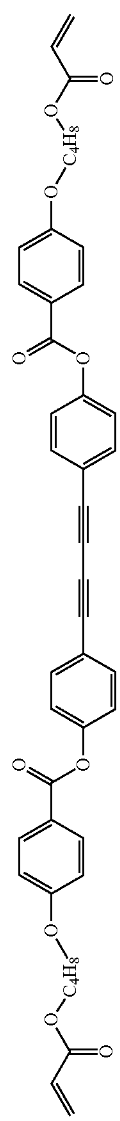
(LC-70)
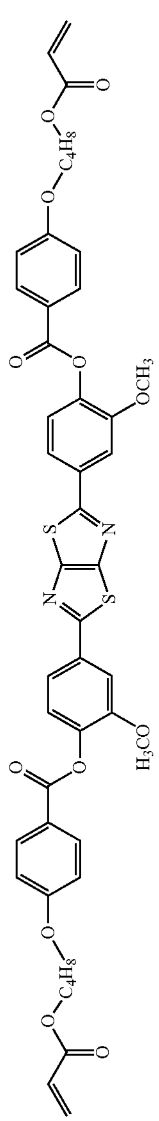
(LC-71)
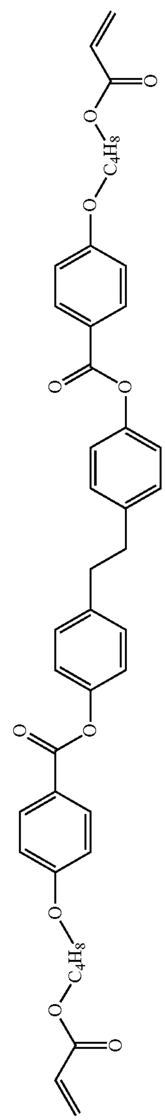
(LC-72)
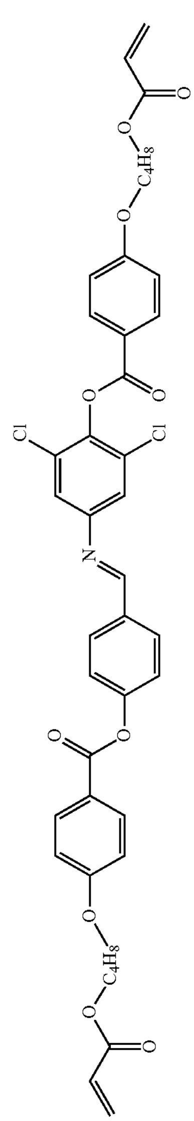
(LC-73)
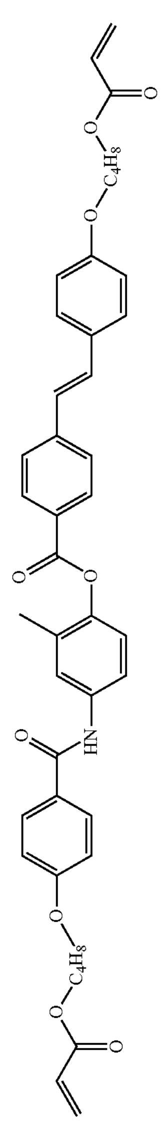

-continued
(LC-74)
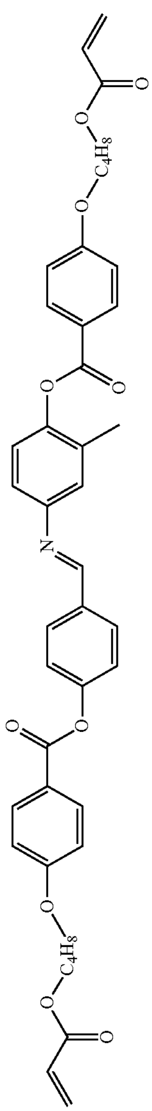
(LC-75)
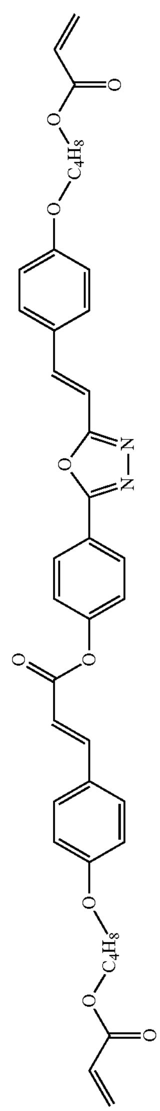
(LC-76)
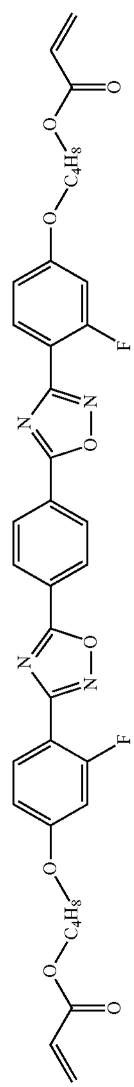
(LC-77)
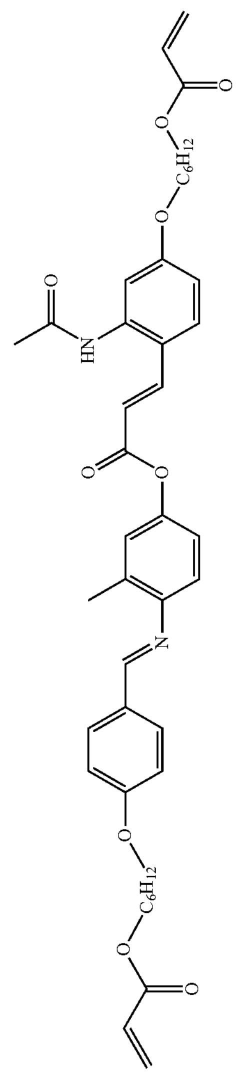

<Polymer Liquid Crystal Compound>

The polymer liquid crystal compound is preferably a homopolymer or a copolymer having a repeating unit described below, and may be any of a random polymer, a block polymer, a graft polymer, or a star polymer.

(Repeating Unit (1))

It is preferable that the polymer liquid crystal compound has a repeating unit represented by Formula (1) (hereinafter, also referred to as "repeating unit (1)").

(1)

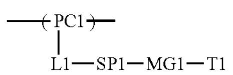

In Formula (1), PC1 represents the main chain of the repeating unit, L1 represents a single bond or a divalent linking group, SP1 represents a spacer group, MG1 represents a mesogen group MG in Formula (LC), and T1 represents a terminal group.

Examples of the main chain of the repeating unit represented by PC1 include groups represented by Formulae (P1-A) to (P1-D). Among these, from the viewpoints of diversity and handleability of a monomer serving as a raw material, a group represented by Formula (P1-A) is preferable.

(P1-A)

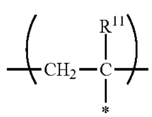

(P1-B)

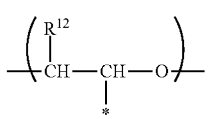

(P1-C)

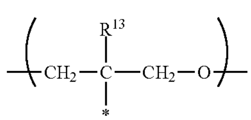

(P1-D)

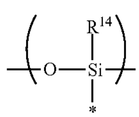

In Formulae (P1-A) to (P1-D), "*" represents a bonding position with respect to L1 in Formula (1). In Formulae (P1-A) to (P1-D), $R^{11}$, $R^{12}$, $R^{13}$, and $R^{14}$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound containing the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^{14}(OR^{15})_2$—. In the formula, $R^{14}$ has the same definition as that for $R^{14}$ in Formula (P1-D), and a plurality of $R^{15}$'s each independently represent a hydrogen atom or an alkyl group having 1 to 10 carbon atoms.

The divalent linking group represented by L1 is the same divalent linking group represented by LW in Formula (W1), and preferred embodiments thereof include —C(O)O—, —OC(O)—, —O—, —S—, —C(O)$NR^{16}$—, —$NR^{16}$C(O)—, —$S(O)_2$—, and —$NR^{16}R^{17}$—. In the formulae, $R^{16}$ and $R^{17}$ each independently represent a hydrogen atom or an alkyl group having 1 to 6 carbon atoms which may have a substituent (for example, the substituent W described above). In the specific examples of the divalent linking group described above, the bonding site on the left side is bonded to PC1 and the bonding site on the right side is bonded to SP1.

In a case where PC1 represents a group represented by Formula (P1-A), it is preferable that L1 represents a group represented by —C(O)O— or C(O)$NR^{16}$—.

In a case where PC1 represents a group represented by any of Formulae (P1-B) to (P1-D), it is preferable that L1 represents a single bond.

Examples of the spacer group represented by SP1 are the same groups as those represented by S1 and S2 in Formula (LC), and from the viewpoint of the alignment degree, a group having at least one structure selected from the group consisting of an oxyethylene structure, an oxypropylene structure, a polysiloxane structure, and an alkylene fluoride structure or a linear or branched alkylene group having 2 to 20 carbon atoms is preferable. However, the alkylene group may contain —O—, —S—, —O—CO—, —CO—O—, —O—CO—O—, —O—CNR— (R represents an alkyl group having 1 to 10 carbon atoms), or —$S(O)_2$—.

From the viewpoints of easily exhibiting liquid crystallinity and the availability of raw materials, it is more preferable that the spacer group represented by SP1 is a group having at least one structure selected from the group consisting of an oxyethylene structure, an oxypropylene structure, a polysiloxane structure, and an alkylene fluoride structure.

Here, as the oxyethylene structure represented by SP1, a group represented by *—$(CH_2—CH_2O)_{n1}$—* is preferable. In the formula, n1 represents an integer of 1 to 20, and * represents a bonding position with respect to L1 or MG1. From the viewpoint that the effects of the present invention are more excellent, n1 represents preferably an integer of 2 to 10, more preferably an integer of 2 to 6, and most preferably an integer of 2 to 4.

Here, a group represented by *—$(CH(CH_3)—CH_2O)_{n2}$—* is preferable as the oxypropylene structure represented by SP1. In the formula, n2 represents an integer of 1 to 3, and "*" represents a bonding position with respect to L1 or MG1.

Further, a group represented by *—$(Si(CH_3)_2—O)_{n3}$—* is preferable as the polysiloxane structure represented by SP1. In the formula, n3 represents an integer of 6 to 10, and "*" represents a bonding position with respect to L1 or MG1.

Further, a group represented by *—$(CF_2—CF_2)_{n4}$—* is preferable as the alkylene fluoride structure represented by SP1. In the formula, n4 represents an integer of 6 to 10, and "*" represents a bonding position with respect to L1 or MG1.

Examples of the terminal group represented by T1 include a hydrogen atom, a halogen atom, a cyano group, a nitro group, a hydroxy group, —SH, a carboxyl group, a boronic acid group, —$SO_3H$—, —$PO_3H_2$, —$NR^{11}R^{12}$ (here, $R^{11}$ and $R^{12}$ each independently represent a hydrogen atom, a substituted or unsubstituted alkyl group having 1 to 10 carbon atoms, a cycloalkyl group, or an aryl group), an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a crosslinkable group-containing group.

Examples of the crosslinkable group-containing group include -L-CL. L represents a single bond or a linking group. Specific examples of the linking group are the same as those for LW and SPW described above. CL represents a crosslinkable group, and examples thereof include a group represented by Q1 or Q2, and a group represented by Formulae (P-1) to (P-30) is preferable. Further, T1 may represent a group obtained by combining two or more of these groups.

From the viewpoint that the effects of the present invention are more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention are more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the alignment degree of the light absorption anisotropic layer is further improved. Here, "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

The content of the repeating unit (1) is preferably in a range of 40% to 100% by mass and more preferably in a range of 50% to 95% by mass with respect to all the repeating units (100% by mass) of the polymer liquid crystal compound. In a case where the content of the repeating unit (1) is 40% by mass or greater, an excellent light absorption anisotropic layer can be obtained due to satisfactory aligning properties. Further, in a case where the content of the repeating unit (1) is 100% by mass or less, an excellent light absorption anisotropic layer can be obtained due to satisfactory aligning properties.

The polymer liquid crystal compound may have only one or two or more kinds of repeating units (1). In a case where the polymer liquid crystal compound has two or more kinds of repeating units (1), the content of the repeating unit (1) indicates the total content of the repeating units (1).

(Log P Value)

In Formula (1), a difference ($|\log P_1 - \log P_2|$) between the log P value of P1, L1, and SP1 (hereinafter, also referred to as "log $P_1$") and the log P value of MG1 (hereinafter, also referred to as "log $P_2$") is 4 or greater. Further, from the viewpoint of further improving the alignment degree of the light absorption anisotropic layer, the difference thereof is more preferably 4.25 or greater and still more preferably 4.5 or greater.

Further, from the viewpoints of adjusting the liquid crystal phase transition temperature and the synthetic suitability, the upper limit of the difference is preferably 15 or less, more preferably 12 or less, and still more preferably 10 or less.

Here, the log P value is an index for expressing the properties of the hydrophilicity and hydrophobicity of a chemical structure and is also referred to as a hydrophilic-hydrophobic parameter. The log P value can be calculated using software such as ChemBioDraw Ultra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

The log $P_1$ indicates the log P value of PC1, L1, and SP1 as described above. The expression "log P value of PC1, L1, and SP1" indicates the log P value of a structure in which PC1, L1, and SP1 are integrated and is not the sum of the log P values of PC1, L1, and SP1. Specifically, the log $P_1$ is calculated by inputting a series of structural formulae of PC1 to SP1 in Formula (1) into the above-described software.

Here, in the calculation of the log $P_1$, in regard to the part of the group represented by PC1 in the series of structural formulae of PC1 to SP1, the structure of the group itself represented by PC1 (for example, Formulae (P1-A) to (P1-D) described above) may be used or a structure of a group that can be PC1 after polymerization of a monomer used to obtain the repeating unit represented by Formula (1) may be used.

Here, specific examples of the latter (the group that can be PC1) are as follows. In a case where PC1 is obtained by polymerization of (meth)acrylic acid ester, PC1 represents a group represented by $CH_2{=}C(R^1)$— ($R^1$ represents a hydrogen atom or a methyl group). Further, PC1 represents ethylene glycol in a case where PC1 is obtained by polymerization of ethylene glycol, and PC1 represents propylene glycol in a case where PC1 is obtained by polymerization of propylene glycol. Further, in a case where PC1 is obtained by polycondensation of silanol, PC1 represents silanol (a compound represented by Formula $Si(R^2)_3(OH)$, and a plurality of $R^2$'s each independently represent a hydrogen atom or an alkyl group, where at least one of the plurality of $R^2$'s represents an alkyl group).

The log $P_1$ may be less than the log $P_2$ or greater than the log $P_2$ in a case where the difference between log $P_1$ and log $P_2$ described above is 4 or greater.

Here, the log P value of a general mesogen group (the log $P_2$ described above) tends to be in a range of 4 to 6. In a case where the log $P_1$ is less than the log $P_2$, the value of log $P_1$ is preferably 1 or less and more preferably 0 or less. Further, in a case where the log P1 is greater than the log $P_2$, the value of log $P_1$ is preferably 8 or greater and more preferably 9 or greater.

In a case where PC1 in Formula (1) is obtained by polymerization of (meth)acrylic acid ester and the log $P_1$ is less than the log $P_2$, the log P value of SP1 in Formula (1) is preferably 0.7 or less and more preferably 0.5 or less. Further, in a case where PC1 in Formula (1) is obtained by polymerization of (meth)acrylic acid ester and the log $P_1$ is greater than the log $P_2$, the log P value of SP1 in Formula (1) is preferably 3.7 or greater and more preferably 4.2 or greater.

Further, examples of the structure having a log P value of 1 or less include an oxyethylene structure and an oxypropylene structure. Examples of the structure having a log P value of 6 or greater include a polysiloxane structure and an alkylene fluoride structure.

(Repeating Units (21) and (22))

From the viewpoint of improving the alignment degree, it is preferable that the polymer liquid crystal compound has a repeating unit having an electron-donating property and/or an electron-withdrawing property at a terminal. More specifically, it is more preferable that the polymer liquid crystal compound has a repeating unit (21) containing a mesogen group and an electron-withdrawing group present at the terminal of the mesogen group and having a op value of greater than 0 and a repeating unit (22) containing a mesogen group and a group present at the terminal of the mesogen group and having a op value of 0 or less. As described above, in a case where the polymer liquid crystal compound has the repeating unit (21) and the repeating unit (22), the alignment degree of the light absorption anisotropic layer to be formed of the polymer liquid crystal compound is further improved as compared with a case where the polymer liquid crystal compound has only one of the repeating unit (21) or the repeating unit (22). The details of the reason for this are not clear, but it is assumed as follows.

That is, it is assumed that since the opposite dipole moments generated in the repeating unit (21) and the repeating unit (22) interact between molecules, the interaction between the mesogen groups in the minor axis direction is strengthened, and the orientation in which the liquid crystals are aligned is more uniform, and as a result, the degree of order of the liquid crystals is considered to be high. In this manner, it is assumed that the aligning properties of the dichroic substance are enhanced, and thus the alignment degree of the light absorption anisotropic layer to be formed increases.

Further, the repeating units (21) and (22) may be the repeating units represented by Formula (1).

The repeating unit (21) contains a mesogen group and an electron-withdrawing group present at the terminal of the mesogen group and having a σp value of greater than 0.

The electron-withdrawing group is a group that is positioned at the terminal of the mesogen group and has a σp value of greater than 0. Examples of the electron-withdrawing group (a group having a σp value of greater than 0) include a group represented by EWG in Formula (LCP-21) described below, and specific examples thereof are also the same as those described below.

The σp value of the electron-withdrawing group described above is greater than 0. From the viewpoint of further increasing the alignment degree of the light absorption anisotropic layer, the σp value is preferably 0.3 or greater and more preferably 0.4 or greater. From the viewpoint that the uniformity of alignment is excellent, the upper limit of the σp value of the electron-withdrawing group is preferably 1.2 or less and more preferably 1.0 or less.

The σp value is a Hammett's substituent constant σp value (also simply referred to as "σp value") and is a parameter showing the intensity of the electron-withdrawing property and the electron-donating property of a substituent, which numerically expresses the effect of the substituent on the acid dissociation equilibrium constant of substituted benzoic acid. The Hammett's substituent constant σp value in the present specification indicates the substituent constant σ in a case where the substituent is positioned at the para position of benzoic acid.

As the Hammett's substituent constant σp value of each group in the present specification, the values described in the document "Hansch et al., Chemical Reviews, 1991, Vol, 91, No. 2, pp. 165 to 195" are employed. Further, the Hammett's substituent constant σp values can be calculated for groups whose Hammett's substituent constant σp values are not described in the document described above using software "ACD/ChemSketch (ACD/Labs 8.00 Release Product Version: 8.08)" based on a difference between the pKa of benzoic acid and the pKa of a benzoic acid derivative having a substituent at the para position.

The repeating unit (21) is not particularly limited as long as the repeating unit (21) contains, at a side chain thereof, a mesogen group and an electron-withdrawing group present at the terminal of the mesogen group and having a σp value of greater than 0, and from the viewpoint of further increasing the alignment degree of the light absorption anisotropic layer, it is preferable that the repeating unit (21) is a repeating unit represented by Formula (LCP-21).

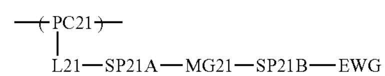

(LCP-21)

In Formula (LCP-21), PC21 represents the main chain of the repeating unit and more specifically the same structure as that for PC1 in Formula (1), L21 represents a single bond or a divalent linking group and more specifically the same structure as that for L1 in Formula (1), SP21A and SP21B each independently represent a single bond or a spacer group and more specifically the same structure as that for SP1 in Formula (1), MG21 represents a mesogen structure and more specifically a mesogen group MG in Formula (LC), and EWG represents an electron-withdrawing group having a σp value of greater than 0.

The spacer group represented by SP21A and SP21B is a group represented by Formulae S1 and S2, and a group having at least one structure selected from the group consisting of an oxyethylene structure, an oxypropylene structure, a polysiloxane structure, and an alkylene fluoride structure or a linear or branched alkylene group having 2 to 20 carbon atoms is preferable. Here, the alkylene group may contain —O—, —O—CO—, —CO—O—, or O—CO—O—.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

It is preferable that SP21B represents a single bond or a linear or branched alkylene group having 2 to 20 carbon atoms. Here, the alkylene group may contain —O—, —O—CO—, —CO—O—, or O—CO—O—.

Among these, from the viewpoint of further increasing the alignment degree of the light absorption anisotropic layer, a single bond is preferable as the spacer group represented by SP21B. In other words, it is preferable that the repeating unit (21) has a structure in which EWG that represents an electron-withdrawing group in Formula (LCP-21) is directly linked to MG21 that represents a mesogen group in Formula (LCP-21). In this manner, it is assumed that in a case where the electron-withdrawing group is directly linked to the mesogen group, the intermolecular interaction due to an appropriate dipole moment works more effectively in the polymer liquid crystal compound, and the orientation in which the liquid crystals are aligned is more uniform, and as a result, the degree of order of the liquid crystals and the alignment degree are considered to be high.

EWG represents an electron-withdrawing group having a σp value of greater than 0. Examples of the electron-withdrawing group having a σp value of greater than 0 includes an ester group (specifically, a group represented by *—C(O)O—$R^E$), a (meth)acryloyl group, a (meth)acryloyloxy group, a carboxy group, a cyano group, a nitro group, a sulfo group, —S(O)(O)—O$R^E$, —S(O)(O)—$R^E$, —O—S(O)(O)—$R^E$, an acyl group (specifically, a group represented by *—C(O)$R^E$), an acyloxy group (specifically, a group represented by *—OC(O)$R^E$), an isocyanate group (—N═C(O)), *—C(O)N$(R^F)_2$, a halogen atom, and an alkyl group substituted with any of these groups (preferably having 1 to 20 carbon atoms). In each of the above-described groups, * represents a bonding position with respect to SP21B. $R^E$ represents an alkyl group having 1 to 20 carbon atoms (preferably 1 to 4 carbon atoms and more preferably 1 or 2 carbon atoms). $R^F$'s each independently represents a hydrogen atom or an alkyl group having 1 to 20 carbon atoms (preferably 1 to 4 carbon atoms and more preferably 1 or 2 carbon atoms).

Among the above-described groups, from the viewpoint of further exhibiting the effects of the present invention, it is preferable that EWG represents a group represented by *—C(O)O—$R^E$, a (meth)acryloyloxy group, a cyano group, or a nitro group.

From the viewpoint that the polymer liquid crystal compound and the dichroic substance can be uniformly aligned while a high alignment degree of the light absorption anisotropic layer is maintained, the content of the repeating unit (21) is preferably 60% by mass or less, more preferably 50% by mass or less, and still more preferably 45% by mass or less with respect to all the repeating units (100% by mass) of the polymer liquid crystal compound.

From the viewpoint of further exhibiting the effects of the present invention, the lower limit of the content of the repeating unit (21) is preferably 1% by mass or greater and more preferably 3% by mass or greater with respect to all the repeating units (100% by mass) of the polymer liquid crystal compound.

In the present invention, the content of each repeating unit contained in the polymer liquid crystal compound is calculated based on the charged amount (mass) of each monomer used for obtaining each repeating unit.

The polymer liquid crystal compound may have only one or two or more kinds of repeating units (21). In a case where the polymer liquid crystal compound has two or more kinds of repeating units (21), there is an advantage in that the solubility of the polymer liquid crystal compound in a solvent is improved and the liquid crystal phase transition temperature is easily adjusted. In the case where the polymer liquid crystal compound has two or more kinds of repeating units (21), it is preferable that the total amount thereof is in the above-described range.

In the case where the polymer liquid crystal compound has two or more kinds of repeating units (21), a repeating unit (21) that does not contain a crosslinkable group in EWG and a repeating unit (21) that contains a polymerizable group in EWG may be used in combination. In this manner, the curing properties of the light absorption anisotropic layer are further improved. Further, preferred examples of the crosslinkable group include a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group.

In this case, from the viewpoint of the balance between the curing properties and the alignment degree of the light absorption anisotropic layer, the content of the repeating unit (21) containing a polymerizable group in EWG is preferably in a range of 1% to 30% by mass with respect to all the repeating units (100% by mass) of the polymer liquid crystal compound.

Hereinafter, examples of the repeating unit (21) will be described, but the repeating unit (21) is not limited to the following repeating units.

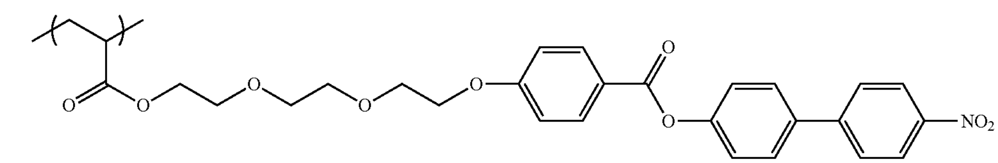

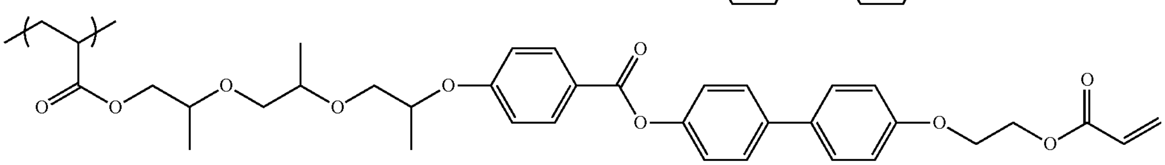

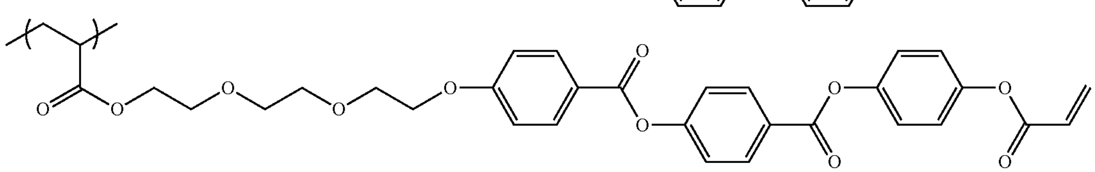

-continued
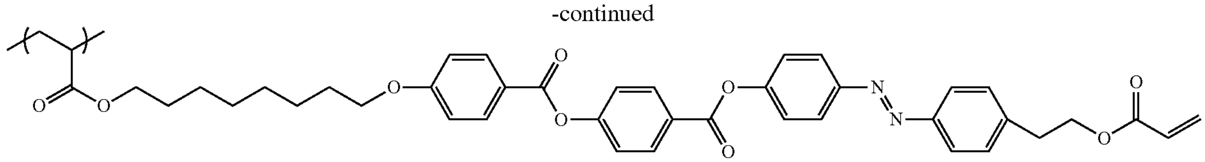
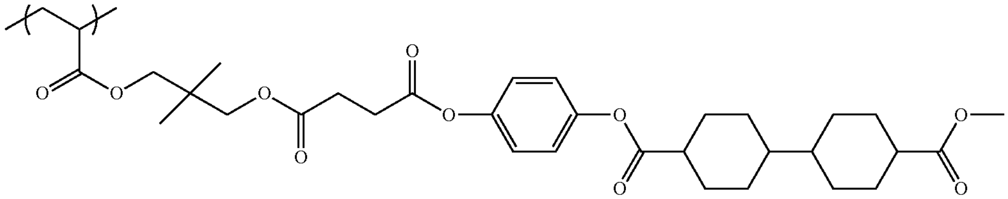
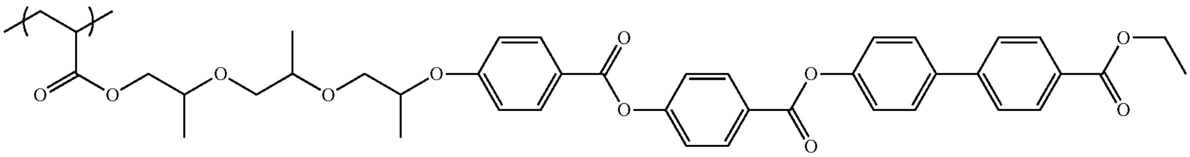
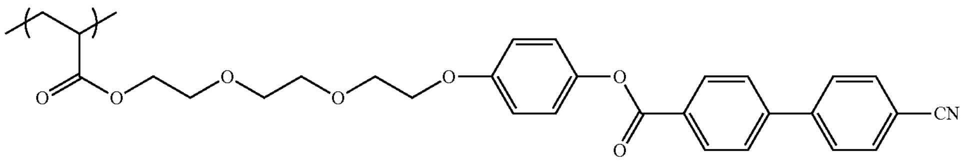
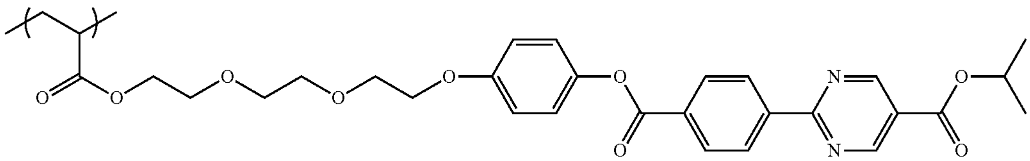
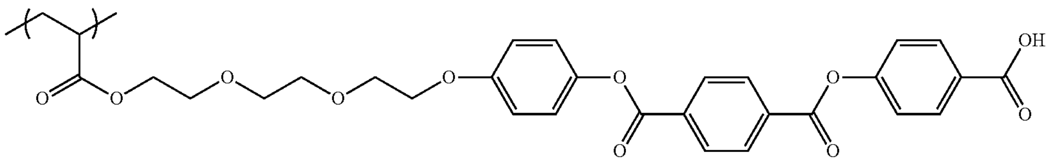
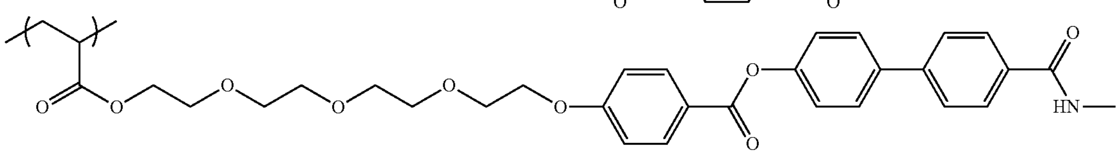
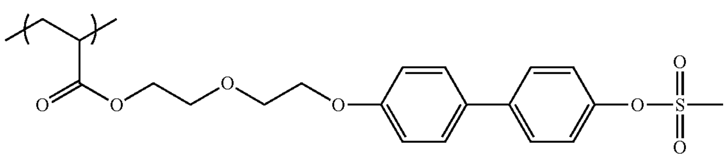
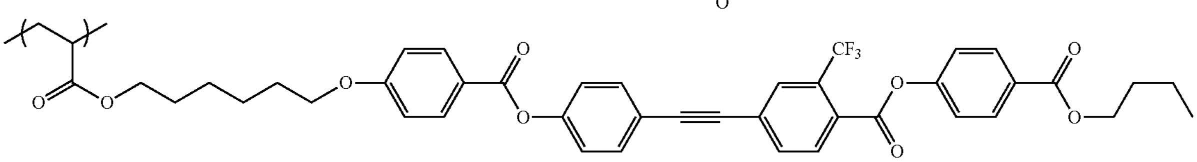
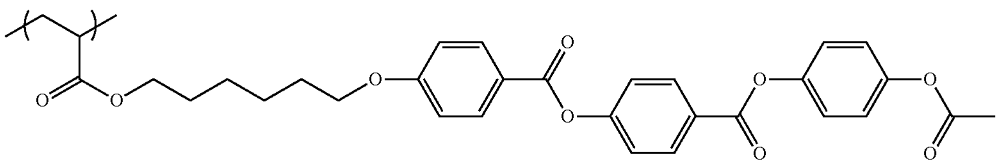
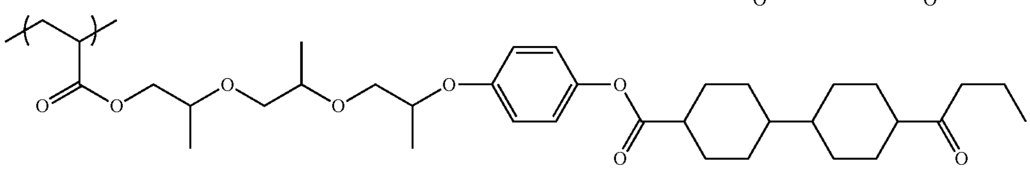

-continued

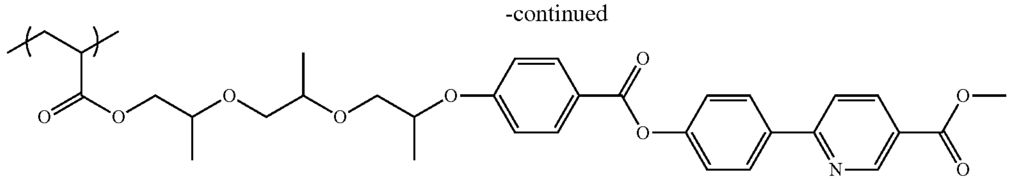

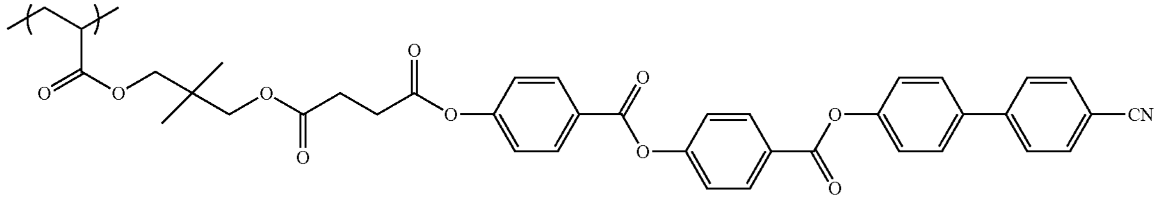

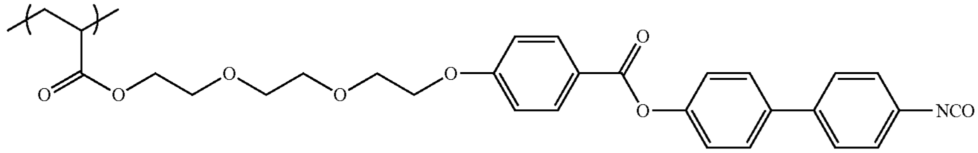

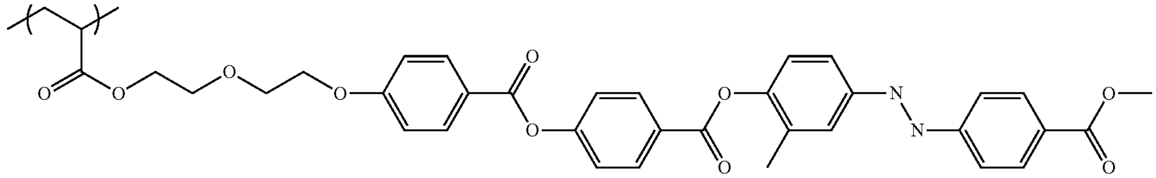

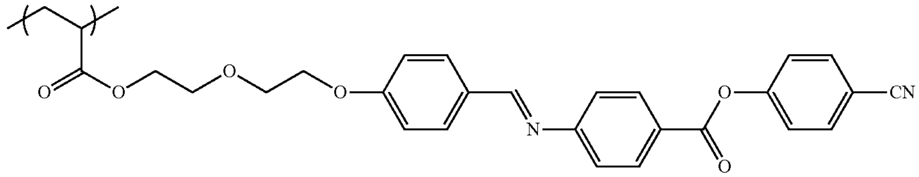

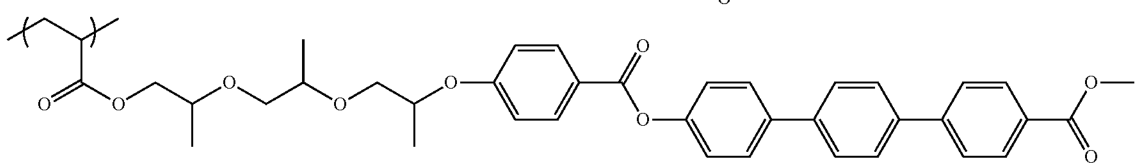

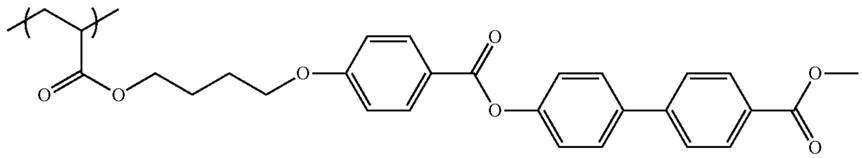

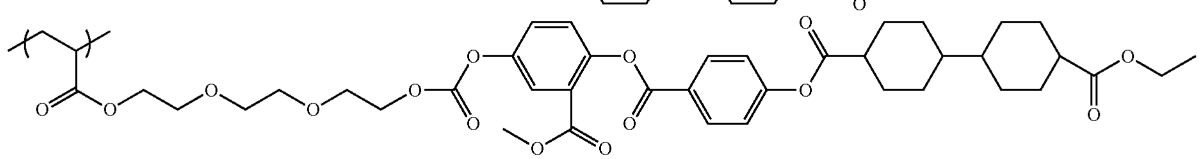

As a result of intensive examination on the composition (content ratio) and the electron-donating property and the electron-withdrawing property of the terminal groups of the repeating unit (21) and the repeating unit (22), the present inventors found that the alignment degree of the light absorption anisotropic layer is further increased by decreasing the content ratio of the repeating unit (21) in a case where the electron-withdrawing property of the electron-withdrawing group of the repeating unit (21) is high (that is, in a case where the σp value is large), and the alignment degree of the light absorption anisotropic layer is further increased by increasing the content ratio of the repeating unit (21) in a case where the electron-withdrawing property of the electron-withdrawing group of the repeating unit (21) is low (that is, in a case where the σp value is close to 0).

The details of the reason for this are not clear, but it is assumed as follows. That is, it is assumed that since the intermolecular interaction due to an appropriate dipole moment works in the polymer liquid crystal compound, the orientation in which the liquid crystals are aligned is more uniform, and as a result, the degree of order of the liquid crystals and the alignment degree of the light absorption anisotropic layer are considered to be high.

Specifically, the product of the σp value of the electron-withdrawing group (EWG in Formula (LCP-21)) in the repeating unit (21) and the content ratio (on a mass basis) of the repeating unit (21) to the polymer liquid crystal compound is preferably in a range of 0.020 to 0.150, more preferably in a range of 0.050 to 0.130, and still more preferably in a range of 0.055 to 0.125. In a case where the product is in the above-described range, the alignment degree of the light absorption anisotropic layer is further increased.

The repeating unit (22) contains a mesogen group and a group present at the terminal of the mesogen group and having a σp value of 0 or less. In a case where the polymer liquid crystal compound has the repeating unit (22), the polymer liquid crystal compound and the dichroic substance can be uniformly aligned.

The mesogen group is a group showing the main skeleton of a liquid crystal molecule that contributes to liquid crystal formation, and the details thereof are as described in the section of MG in Formula (LCP-22) described below, and specific examples thereof are also the same as described below.

The above-described group is positioned at the terminal of the mesogen group and has a σp value of 0 or less. Examples of the above-described group (a group having a σp value of 0 or less) includes a hydrogen atom having a σp value of 0 and a group (electron-donating group) having a σp value of less than 0 and represented by T22 in Formula (LCP-22). Among the above-described groups, specific example of the group having a σp value of less than 0 (electron-donating group) are the same as those for T22 in Formula (LCP-22) described below.

The σp value of the above-described group is 0 or less, and from the viewpoint that the uniformity of alignment is more excellent, the σp value is preferably less than 0, more preferably −0.1 or less, and still more preferably −0.2 or less. The lower limit of the σp value of the above-described group is preferably −0.9 or greater and more preferably −0.7 or greater.

The repeating unit (22) is not particularly limited as long as the repeating unit (22) contains, at a side chain thereof, a mesogen group and a group present at the terminal of the mesogen group and having a σp value of 0 or less, and from the viewpoint of further increasing the uniformity of alignment of liquid crystals, it is preferable that the repeating unit (22) is a repeating unit represented by Formula (PCP-22) which does not correspond to a repeating unit represented by Formula (LCP-21).

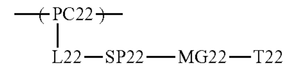

(LCP-22)

In Formula (LCP-22), PC22 represents the main chain of the repeating unit and more specifically the same structure as that for PC1 in Formula (1), L22 represents a single bond or a divalent linking group and more specifically the same structure as that for L1 in Formula (1), SP22 represents a spacer group and more specifically the same structure as that for SP1 in Formula (1), MG22 represents a mesogen structure and more specifically the same structure as the mesogen group MG in Formula (LC), and T22 represents an electron-donating group having a Hammett's substituent constant σp value of less than 0.

T22 represents an electron-donating group having a σp value of less than 0. Examples of the electron-donating group having a σp value of less than 0 include a hydroxy group, an alkyl group having 1 to 10 carbon atoms, an alkoxy group having 1 to 10 carbon atoms, and an alkylamino group having 1 to 10 carbon atoms.

In a case where the number of atoms in the main chain of T22 is 20 or less, the alignment degree of the light absorption anisotropic layer is further improved. Here, "main chain" in T22 indicates the longest molecular chain bonded to MG22, and the number of hydrogen atoms is not included in the number of atoms in the main chain of T22. For example, the number of atoms in the main chain is 4 in a case where T22 represents an n-butyl group, and the number of atoms in the main chain is 3 in a case where T22 represents a sec-butyl group.

Hereinafter, examples of the repeating unit (22) will be described, but the repeating unit (22) is not limited to the following repeating units.

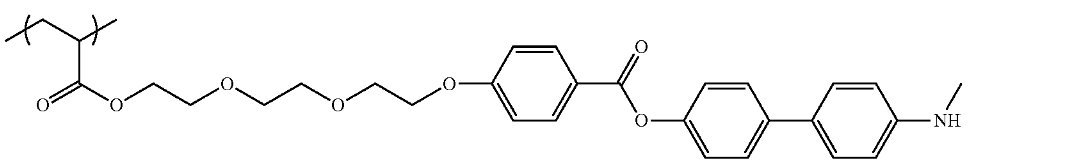

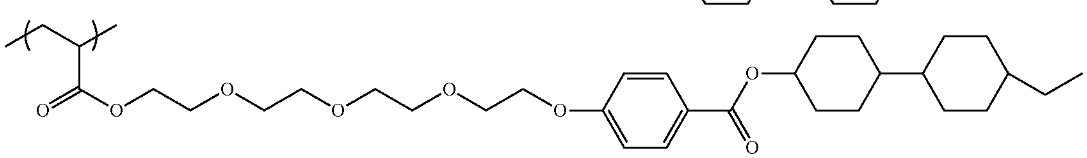

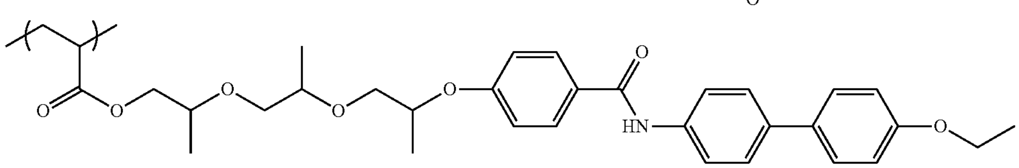

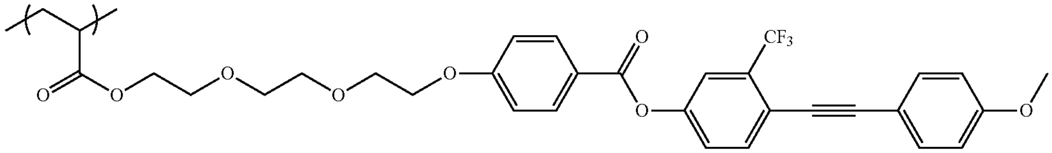

-continued
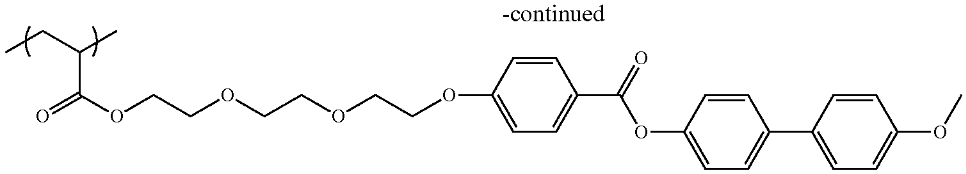
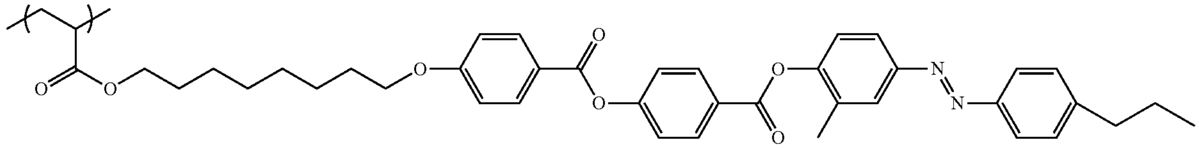
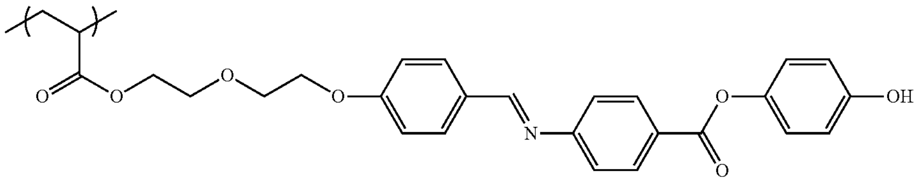
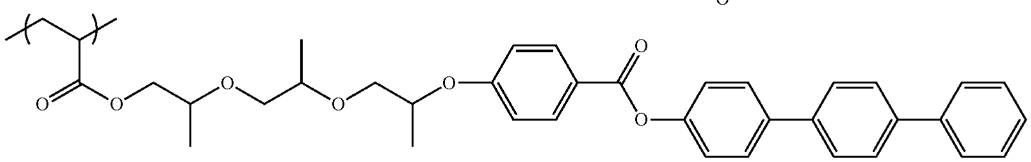
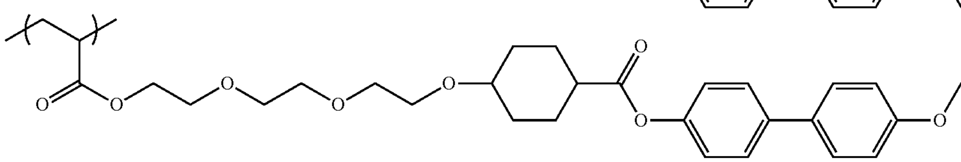
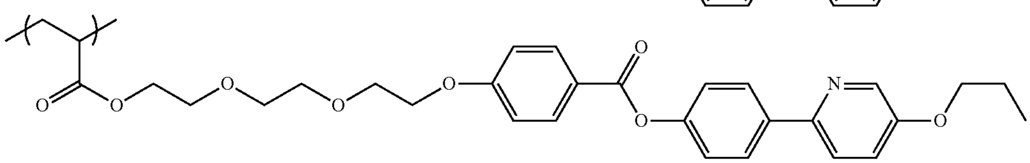
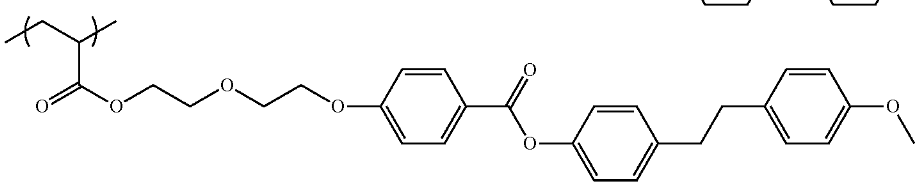
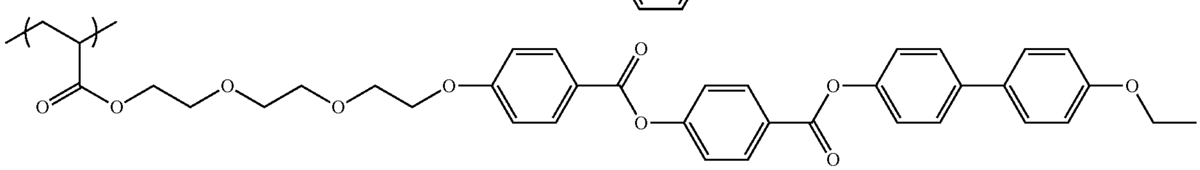
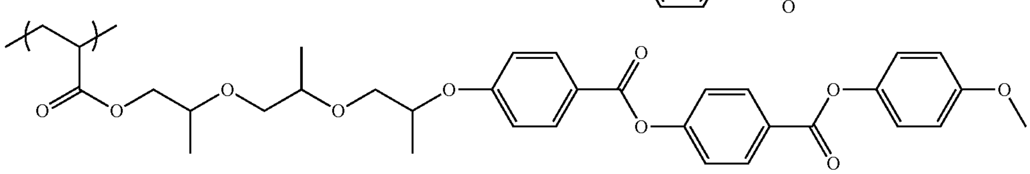
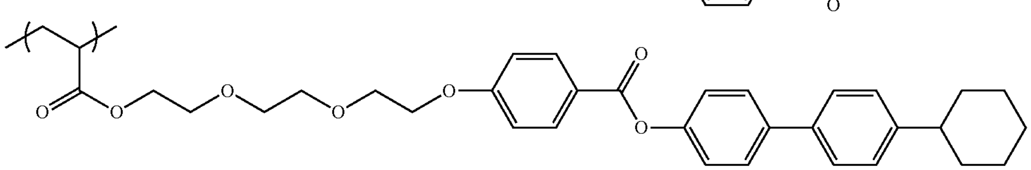
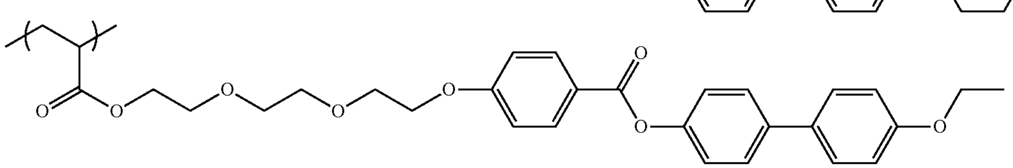

-continued

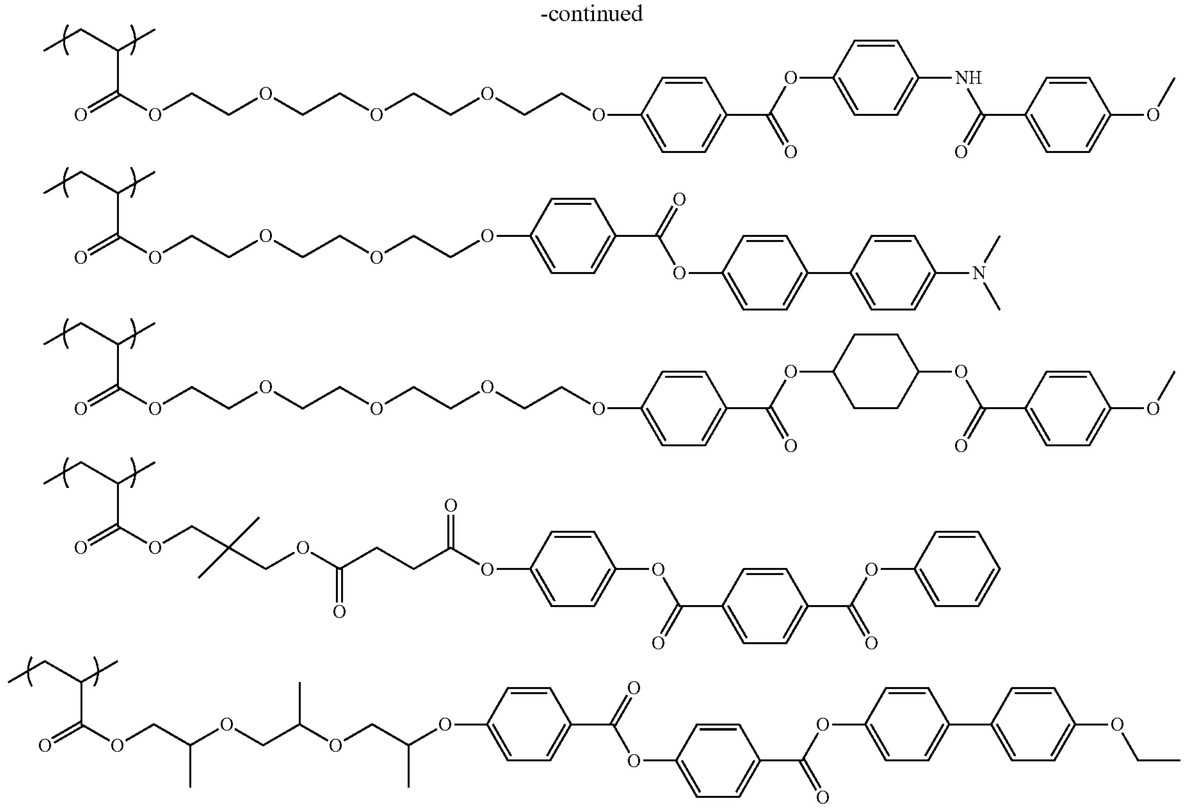

It is preferable that the structures of the repeating unit (21) and the repeating unit (22) have a part in common. It is assumed that the liquid crystals are uniformly aligned as the structures of repeating units are more similar to each other. In this manner, the alignment degree of the light absorption anisotropic layer is further improved.

Specifically, from the viewpoint of further increasing the alignment degree of the light absorption anisotropic layer, it is preferable to satisfy at least one of a condition that SP21A of Formula (LCP-21) has the same structure as that for SP22 of Formula (LCP-22), a condition that MG21 of Formula (LCP-21) has the same structure as that for MG22 of Formula (LCP-22), or a condition that L21 of Formula (LCP-21) has the same structure as that for L22 of Formula (LCP-22), more preferable to satisfy two or more of the conditions, and particularly preferable to satisfy all the conditions.

From the viewpoint that the uniformity of alignment is excellent, the content of the repeating unit (22) is preferably 50% by mass or greater, more preferably 55% or greater, and particularly preferably 60% or greater with respect to all the repeating units (100% by mass) of the polymer liquid crystal compound.

From the viewpoint of improving the alignment degree, the upper limit of the content of the repeating unit (22) is preferably 99% by mass or less and more preferably 97% by mass with respect to all the repeating units (100% by mass) of the polymer liquid crystal compound.

The polymer liquid crystal compound may have only one or two or more kinds of repeating units (22). In a case where the polymer liquid crystal compound has two or more kinds of repeating units (22), there is an advantage in that the solubility of the polymer liquid crystal compound in a solvent is improved and the liquid crystal phase transition temperature is easily adjusted. In a case where the polymer liquid crystal compound has two or more kinds of repeating units (22), it is preferable that the total amount thereof is in the above-described range.

(Repeating Unit (3))

From the viewpoint of improving the solubility in a general-purpose solvent, the polymer liquid crystal compound may have a repeating unit (3) that does not contain a mesogen group. Particularly in order to improve the solubility while suppressing a decrease in the alignment degree, it is preferable that the polymer liquid crystal compound has a repeating unit having a molecular weight of 280 or less as the repeating unit (3) that does not contain a mesogen group. As described above, the reason why the solubility is improved while a decrease in the alignment degree is suppressed by allowing the polymer liquid crystal compound to have a repeating unit having a molecular weight of 280 or less which does not contain a mesogen group is assumed as follows.

That is, it is considered that in a case where the polymer liquid crystal compound has a repeating unit (3) that does not contain a mesogen group in a molecular chain thereof, since a solvent is likely to enter the polymer liquid crystal compound, the solubility is improved, but the alignment degree is decreased in the case of the non-mesogenic repeating unit (3). However, it is assumed that since the molecular weight of the repeating unit is small, the alignment of the repeating unit (1), the repeating unit (21), or the repeating unit (22) containing a mesogen group is unlikely to be disturbed, and thus a decrease in the alignment degree can be suppressed.

It is preferable that the repeating unit (3) is a repeating unit having a molecular weight of 280 or less.

The molecular weight of the repeating unit (3) does not indicates the molecular weight of the monomer used to obtain the repeating unit (3), but indicates the molecular weight of the repeating unit (3) in a state of being incorporated into the polymer liquid crystal compound by polymerization of the monomer.

The molecular weight of the repeating unit (3) is preferably 280 or less, more preferably 180 or less, and still more preferably 100 or less. The lower limit of the molecular weight of the repeating unit (3) is commonly 40 or greater and more preferably 50 or greater. In a case where the molecular weight of the repeating unit (3) is 280 or less, a light absorption anisotropic layer having excellent solubility of the polymer liquid crystal compound and a high alignment degree can be obtained.

Further, in a case where the molecular weight of the repeating unit (3) is greater than 280, the alignment of the liquid crystals in the portion of the repeating unit (1), the repeating unit (21), or the repeating unit (22) is disturbed, and thus the alignment degree is decreased in some cases. Further, since the solvent is unlikely to enter the polymer liquid crystal compound, the solubility of the polymer liquid crystal compound is decreased in some cases.

Specific examples of the repeating unit (3) include a repeating unit (hereinafter, also referred to as "repeating unit (3-1)") that does not contain a crosslinkable group (for example, an ethylenically unsaturated group) and a repeating unit (hereinafter, also referred to as "repeating unit (3-2)") that contains a crosslinkable group.

Repeating Unit (3-1)

Specific examples of the monomer used for polymerization of the repeating unit (3-1) include acrylic acid [72.1], α-alkylacrylic acids (such as methacrylic acid [86.1] and itaconic acid [130.1]), esters and amides derived therefrom (such as N-i-propylacrylamide [113.2], N-n-butylacrylamide [127.2], N-t-butylacrylamide [127.2], N,N-dimethylacrylamide [99.1], N-methylmethacrylamide [99.1], acrylamide [71.1], methacrylamide [85.1], diacetoneacrylamide [169.2], acryloylmorpholine [141.2], N-methylol acrylamide [101.1], N-methylol methacrylamide [115.1], methyl acrylate [86.0], ethyl acrylate [100.1], hydroxyethyl acrylate [116.1], n-propyl acrylate [114.1], i-propyl acrylate [114.2], 2-hydroxypropyl acrylate [130.1], 2-methyl-2-nitropropyl acrylate [173.2], n-butyl acrylate [128.2], i-butyl acrylate [128.2], t-butyl acrylate [128.2], t-pentyl acrylate [142.2], 2-methoxyethyl acrylate [130.1], 2-ethoxyethyl acrylate [144.2], 2-ethoxyethoxyethyl acrylate [188.2], 2,2,2-trifluoroethyl acrylate [154.1], 2,2-dimethylbutyl acrylate [156.2], 3-methoxybutyl acrylate [158.2], ethyl carbitol acrylate [188.2], phenoxyethyl acrylate [192.2], n-pentyl acrylate [142.2], n-hexyl acrylate [156.2], cyclohexyl acrylate [154.2], cyclopentyl acrylate [140.2], benzyl acrylate [162.2], n-octyl acrylate [184.3], 2-ethylhexyl acrylate [184.3], 4-methyl-2-propylpentyl acrylate [198.3], methyl methacrylate [100.1], 2,2,2-trifluoroethyl methacrylate [168.1], hydroxyethyl methacrylate [130.1], 2-hydroxypropyl methacrylate [144.2], n-butyl methacrylate [142.2], i-butyl methacrylate [142.2], sec-butyl methacrylate [142.2], n-octyl methacrylate [198.3], 2-ethylhexyl methacrylate [198.3], 2-methoxyethyl methacrylate [144.2], 2-ethoxyethyl methacrylate [158.2], benzyl methacrylate [176.2], 2-norbornyl methyl methacrylate [194.3], 5-norbornen-2-ylmethyl methacrylate [194.3], and dimethylaminoethyl methacrylate [157.2]), vinyl esters (such as vinyl acetate [86.1]), esters derived from maleic acid or fumaric acid (such as dimethyl maleate [144.1] and diethyl fumarate [172.2]), maleimides (such as N-phenylmaleimide [173.2]), maleic acid [116.1], fumaric acid [116.1], p-styrenesulfonic acid [184.1], acrylonitrile [53.1], methacrylonitrile [67.1], dienes (such as butadiene [54.1], cyclopentadiene [66.1], and isoprene [68.1]), aromatic vinyl compounds (such as styrene [104.2], p-chlorostyrene [138.6], t-butylstyrene [160.3], and α-methylstyrene [118.2]), N-vinylpyrrolidone [111.1], N-vinyloxazolidone [113.1], N-vinyl succinimide [125.1], N-vinylformamide [71.1], N-vinyl-N-methylformamide [85.1], N-vinylacetamide [85.1], N-vinyl-N-methylacetamide [99.1], 1-vinylimidazole [94.1], 4-vinylpyridine [105.2], vinylsulfonic acid [108.1], sodium vinyl sulfonate [130.2], sodium allyl sulfonate [144.1], sodium methallyl sulfonate [158.2], vinylidene chloride [96.9], vinyl alkyl ethers (such as methyl vinyl ether [58.1]), ethylene [28.0], propylene [42.1], 1-butene [56.1], and isobutene [56.1]. Further, the numerical values in the parentheses indicate the molecular weights of the monomers.

The above-described monomers may be used alone or in combination of two or more kinds thereof.

Among the above-described monomers, acrylic acid, α-alkylacrylic acids, esters and amides derived therefrom, acrylonitrile, methacrylonitrile, and aromatic vinyl compounds are preferable.

As monomers other than the above-described monomers, the compounds described in Research Disclosure No. 1955 (July, 1980) can be used.

Hereinafter, specific examples of the repeating unit (3-1) and the molecular weights thereof will be described, but the present invention is not limited to these specific examples.

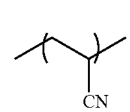
Mw:53

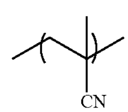
Mw:67

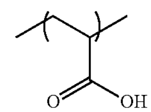
Mw:72

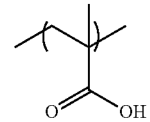
Mw:86

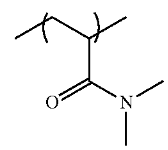
Mw:93

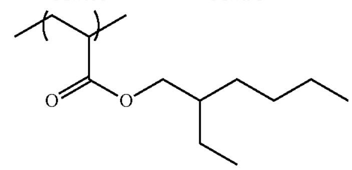
Mw:184

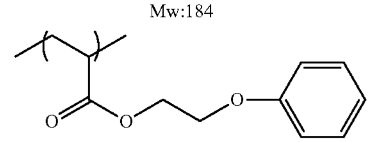
Mw:192

Repeating Unit (3-2)

Specific examples of the crosslinkable group in the repeating unit (3-2) include the groups represented by Formulae (P-1) to (P-30). Among these, a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, and an oxetanyl group are more preferable.

From the viewpoint of easily performing polymerization, it is preferable that the repeating unit (3-2) is a repeating unit represented by Formula (3).

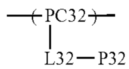

(3)

In Formula (3), PC32 represents the main chain of the repeating unit and more specifically the same structure as that for PC1 in Formula (1), L32 represents a single bond or a divalent linking group and more specifically the same structure as that for L1 in Formula (1), and P32 represents a crosslinkable group represented by any of Formulae (P1) to (P30).

Hereinafter, specific examples of the repeating unit (3-2) and the molecular weights (Mw) thereof will be described, but the present invention is not limited to these specific examples.

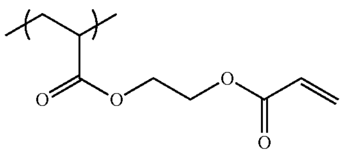

Mw:170.16

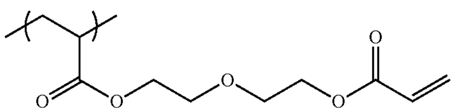

Mw:214.22

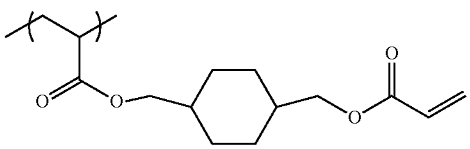

Mw:252.31

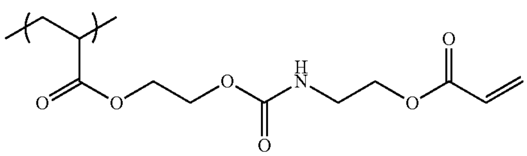

Mw:257.24

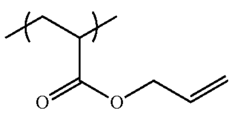

Mw:112.13

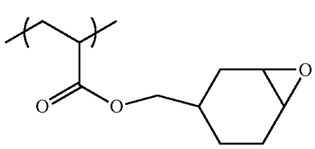

Mw:182.22

-continued

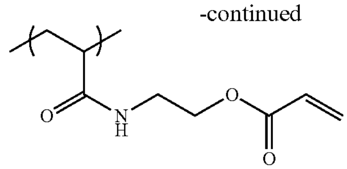

Mw:169.18

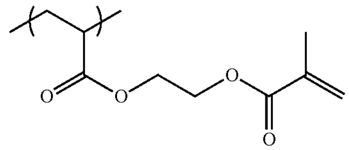

Mw:184.19

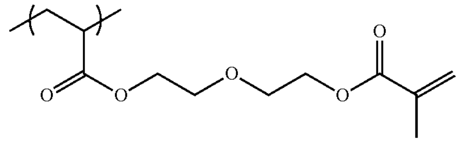

Mw:228.24

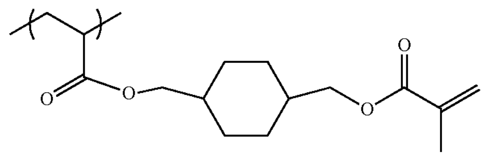

Mw:226.34

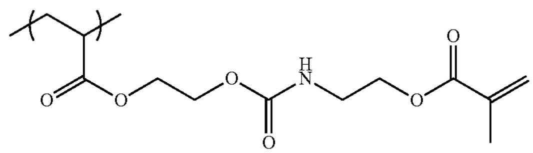

Mw:271.27

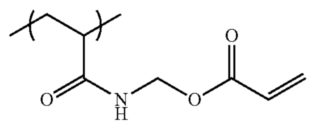

Mw:151.15

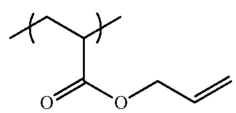

Mw:126.16

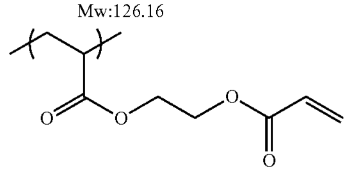

Mw:184.19

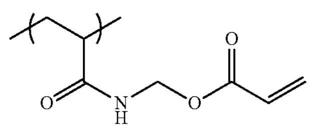

Mw:169.18

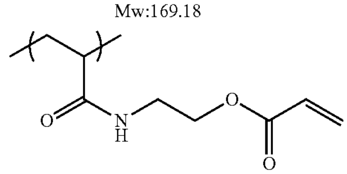

Mw:183.21

-continued

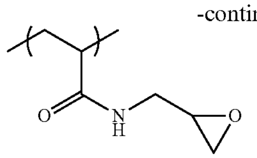

Mw:142.15

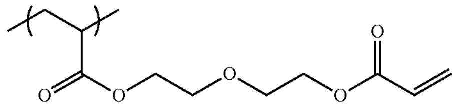

Mw:228.24

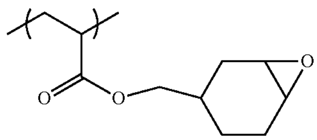

Mw:196.25

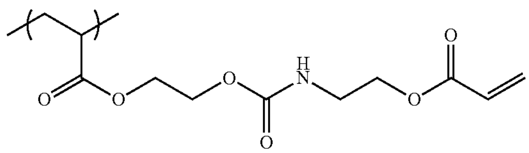

Mw:271.27

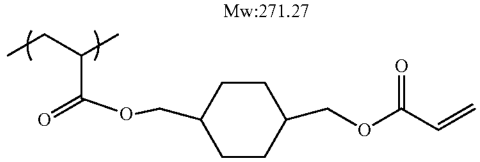

Mw:266.34

The content of the repeating unit (3) is preferably less than 14% by mass, more preferably 7% by mass or less, and still more preferably 5% by mass or less with respect to all the repeating units (100% by mass) of the polymer liquid crystal compound. The lower limit of the content of the repeating unit (3) is preferably 2% by mass or greater and more preferably 3% by mass or greater with respect to all the repeating units (100% by mass) of the polymer liquid crystal compound. In a case where the content of the repeating unit (3) is less than 14% by mass, the alignment degree of the light absorption anisotropic layer is further improved. In a case where the content of the repeating unit (3) is 2% by mass or greater, the solubility of the polymer liquid crystal compound is further improved.

The polymer liquid crystal compound may have only one or two or more kinds of repeating units (3). In a case where the polymer liquid crystal compound has two or more kinds of repeating units (3), it is preferable that the total amount thereof is in the above-described range.

(Repeating Unit (4))

From the viewpoint of improving the adhesiveness and planar uniformity, the polymer liquid crystal compound may have a repeating unit (4) having a flexible structure with a long molecular chain (SP4 in Formula (4) described below). The reason for this is assumed as follows.

That is, in a case where the polymer liquid crystal compound has such a flexible structure having a long molecular chain, entanglement of the molecular chains constituting the polymer liquid crystal compound is likely to occur, and aggregation destruction of the light absorption anisotropic layer (specifically, destruction of the light absorption anisotropic layer) is suppressed. As a result, the adhesiveness between the light absorption anisotropic layer and the underlayer (for example, the base material or the alignment film) is assumed to be improved. Further, it is considered that a decrease in planar uniformity occurs due to the low compatibility between the dichroic substance and the polymer liquid crystal compound. That is, it is considered that in a case where the compatibility between the dichroic substance and the polymer liquid crystal compound is not sufficient, a planar defect (alignment defect) having the dichroic substance to be precipitated as a nucleus occurs. Meanwhile, it is assumed that in the case where the polymer liquid crystal compound has such a flexible structure having a long molecular chain, a light absorption anisotropic layer in which precipitation of the dichroic substance is suppressed and the planar uniformity is excellent is obtained. Here, the expression "planar uniformity is excellent" denotes that the alignment defect occurring in a case where the liquid crystal composition containing the polymer liquid crystal compound is repelled on the underlayer (for example, the base material or the alignment film) is less likely to occur.

The repeating unit (4) is a repeating unit represented by Formula (4).

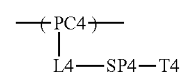

(4)

In Formula (4), PC4 represents the main chain of the repeating unit and more specifically the same structure as that for PC1 in Formula (1), L4 represents a single bond or a divalent linking group and more specifically the same structure as that for L1 in Formula (1) (preferably a single bond), SP4 represents an alkylene group having 10 or more atoms in the main chain, and T4 represents a terminal group and more specifically the same structure as that for T1 in Formula (1).

Specific examples and preferred embodiments of PC4 are the same as those for PC1 in Formula (1), and thus description thereof will not be repeated.

From the viewpoint of further exhibiting the effects of the present invention, it is preferable that L4 represents a single bond.

In Formula (4), SP4 represents an alkylene group having 10 or more atoms in the main chain. Here, one or more of $—CH_2$-'s constituting the alkylene group represented by SP4 may be substituted with "SP—C" described above and particularly preferably at least one group selected from the group consisting of —O—, —S—, $—N(R^{21})—$, —C(═O)—, —C(═S)—, $—C(R^{22})═C(R^{23})—$, an alkynylene group, $—Si(R^{24})(R^{25})—$, —N═N—, $—C(R^{26})═N—N═C(R^{27})—$, $—C(R^{28})═N—$, and $S(═O)_2—$. In addition, $R^{21}$ to $R^{28}$ each independently represent a hydrogen atom, a halogen atom, a cyano group, a nitro group, or a linear or branched alkyl group having 1 to 10 carbon atoms. Further, the hydrogen atoms contained in one or more of $—CH_2—$'s constituting the alkylene group represented by SP4 may be substituted with "SP—H" described above.

The number of atoms in the main chain of SP4 is 10 or greater, and from the viewpoint of obtaining a light absorption anisotropic layer in which at least one of the adhesiveness or the planar uniformity is more excellent, the number of atoms thereof is preferably 15 or greater and more preferably 19 or greater. Further, from the viewpoint of obtaining a light absorption anisotropic layer with a more excellent alignment degree, the upper limit of the number of atoms in the main chain of SP2 is preferably 70 or less, more preferably 60 or less, and still more preferably 50 or less.

Here, "main chain" in SP4 indicates a partial structure required for directly linking L4 and T4 to each other, and "number of atoms in the main chain" indicates the number of atoms constituting the partial structure. In other words, "main chain" in SP4 is a partial structure in which the number of atoms linking L4 and T4 to each other is the smallest. For example, the number of atoms in the main chain in a case where SP4 represents a 3,7-dimethyldecanyl group is 10, and the number of atoms in the main chain in a case where SP4 represents a 4,6-dimethyldodecanyl group is 12. Further, in Formula (4-1), the inside of the frame shown by the dotted quadrangle corresponds to SP4, and the number of atoms in the main chain of SP4 (corresponding to the total number of atoms circled by the dotted line) is 11.

(4-1)

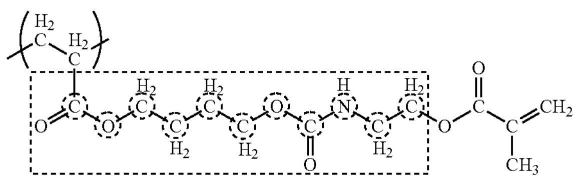

The alkylene group represented by SP4 may be linear or branched.

From the viewpoint of obtaining a light absorption anisotropic layer with a more excellent alignment degree, the number of carbon atoms of the alkylene group represented by SP4 is preferably in a range of 8 to 80, more preferably in a range of 15 to 80, still more preferably in a range of 25 to 70, and particularly preferably in a range of 25 to 60.

From the viewpoint of obtaining a light absorption anisotropic layer with more excellent adhesiveness and planar uniformity, it is preferable that one or more of —$CH_2$—'s constituting the alkylene group represented by SP4 are substituted with "SP—C" described above.

Further, in a case where a plurality of —$CH_2$—'s constituting the alkylene group represented by SP4 are present, it is more preferable that only some of the plurality of —$CH_2$—'s are substituted with "SP—C" described above from the viewpoint of obtaining a light absorption anisotropic layer with more excellent adhesiveness and planar uniformity.

Among examples of "SP—C", at least one group selected from the group consisting of —O—, —S—), —N($R^{21}$)—, —C(═O)—, —C(═S)—, —C($R^{22}$)═C($R^{23}$)—, an alkynylene group, —Si($R^{24}$)($R^{25}$)—, —N═N—, —C($R^{26}$)═N—N═C($R^{27}$)—, —C($R^{28}$)═N—, and S(═O)$_2$— is preferable, and from the viewpoint of obtaining a light absorption anisotropic layer with more excellent adhesiveness and planar uniformity, at least one group selected from the group consisting of —O—, —N($R^{21}$)—, —C(═O)—, and S(═O)$_2$— is more preferable, and at least one group selected from the group consisting of —O—, —N($R^{21}$)—, and C(═O)— is particularly preferable.

Particularly, it is preferable that SP4 represents a group having at least one selected from the group consisting of an oxyalkylene structure in which one or more of —$CH_2$—'s constituting an alkylene group are substituted with —O—, an ester structure in which one or more of —$CH_2$—$CH_2$—'s constituting an alkylene group are substituted with —O— and —C(═O)—, and a urethane bond in which one or more of —$CH_2$—$CH_2$—$CH_2$—'s constituting an alkylene group are substituted with —O—, —C(═O)—, and —NH—.

The hydrogen atoms contained in one or more of —$CH_2$—'s constituting the alkylene group represented by SP4 may be substituted with "SP—H" described above. In this case, one or more hydrogen atoms contained in —$CH_2$— may be substituted with "SP—H". That is, only one hydrogen atom contained in —$CH_2$— may be substituted with "SP—H" or all (two) hydrogen atoms contained in —$CH_2$— may be substituted with "SP—H".

Among the examples of "SP—H", at least one group selected from the group consisting of a halogen atom, a cyano group, a nitro group, a hydroxy group, a linear alkyl group having 1 to 10 carbon atoms, a branched alkyl group having 1 to 10 carbon atoms, and a halogenated alkyl group having 1 to 10 carbon atoms is preferable, and at least one group selected from the group consisting of a hydroxy group, a linear alkyl group having 1 to 10 carbon atoms, and a branched alkyl group having 1 to 10 carbon atoms is more preferable.

As described above, T4 represents the same terminal group as that for T1 and preferably a hydrogen atom, a methyl group, a hydroxy group, a carboxy group, a sulfonic acid group, a phosphoric acid group, a boronic acid group, an amino group, a cyano group, a nitro group, a phenyl group which may have a substituent, or -L-CL (L represents a single bond or a divalent linking group, specific examples of the divalent linking group are the same as those for LW and SPW described above, and CL represents a crosslinkable group, and examples thereof include a group represented by Q1 or Q2, among these, a crosslinkable group represented by any of Formulae (P-1) to (P-30) is preferable), and it is preferable that CL represents a vinyl group, a butadiene group, a (meth)acryl group, a (meth)acrylamide group, a vinyl acetate group, a fumaric acid ester group, a styryl group, a vinylpyrrolidone group, a maleic acid anhydride, a maleimide group, a vinyl ether group, an epoxy group, or an oxetanyl group.

The epoxy group may be an epoxycycloalkyl group, and the number of carbon atoms of the cycloalkyl group moiety in the epoxycycloalkyl group is preferably in a range of 3 to 15, more preferably in a range of 5 to 12, and still more preferably 6 (that is, in a case where the epoxycycloalkyl group is an epoxycyclohexyl group) from the viewpoint that the effects of the present invention are more excellent.

Examples of the substituent of the oxetanyl group include an alkyl group having 1 to 10 carbon atoms. Among the examples, an alkyl group having 1 to 5 carbon atoms is preferable from the viewpoint that the effects of the present invention are more excellent. The alkyl group as a substituent of the oxetanyl group may be linear or branched, but is preferably linear from the viewpoint that the effects of the present invention are more excellent.

Examples of the substituent of the phenyl group include a boronic acid group, a sulfonic acid group, a vinyl group, and an amino group. Among these, from the viewpoint that the effects of the present invention are more excellent, a boronic acid group is preferable.

Specific examples of the repeating unit (4) include the following structures, but the present invention is not limited thereto. Further, in the following specific examples, n1 represents an integer of 2 or greater, and n2 represents an integer of 1 or greater.

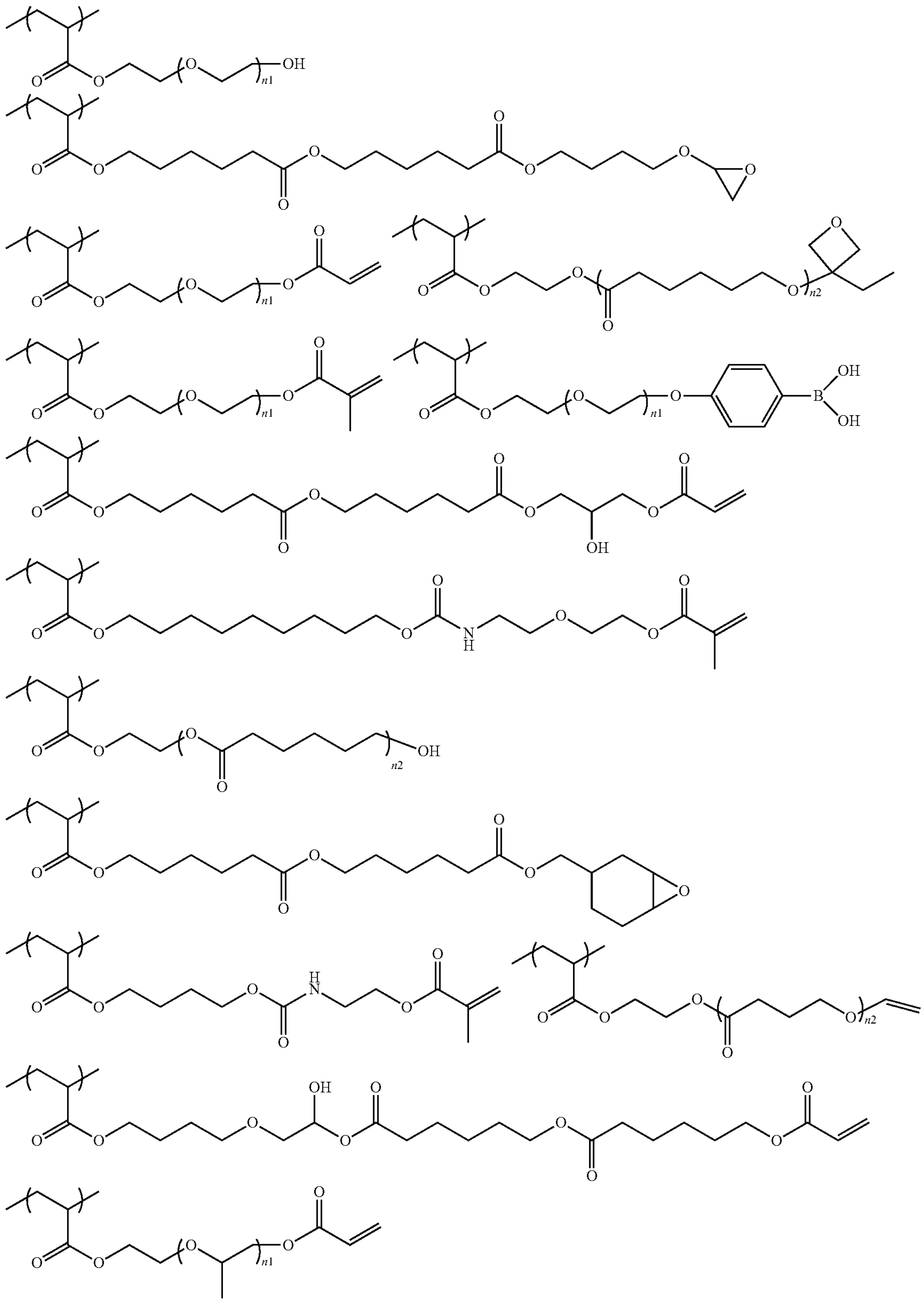

The content of the repeating unit (4) is preferably in a range of 2% to 20% by mass and more preferably in a range of 3% to 18% by mass with respect to all the repeating units (100% by mass) of the polymer liquid crystal compound. In a case where the content of the repeating unit (4) is 2% by mass or greater, a light absorption anisotropic layer having more excellent adhesiveness can be obtained. Further, in a case where the content of the repeating unit (4) is 20% by mass or less, a light absorption anisotropic layer having more excellent planar uniformity can be obtained.

The polymer liquid crystal compound may have only one or two or more kinds of repeating units (4). In a case where the polymer liquid crystal compound has two or more kinds of repeating units (4), the content of the repeating unit (4) indicates the total content of the repeating units (4).

(Repeating Unit (5))

From the viewpoint of the planar uniformity, the polymer liquid crystal compound may have a repeating unit (5) to be introduced by polymerizing a polyfunctional monomer. Particularly in order to improve the planar uniformity while suppressing a decrease in the alignment degree, it is preferable that the polymer liquid crystal compound has 10% by mass or less of the repeating unit (5) to be introduced by polymerizing a polyfunctional monomer. As described above, the reason why the planar uniformity can be improved while a decrease in the alignment degree is suppressed by allowing the side-chain type polymer liquid crystal compound to have 10% by mass or less of the repeating unit (5) is assumed as follows.

The repeating unit (5) is a unit to be introduced to the polymer liquid crystal compound by polymerizing a polyfunctional monomer. Therefore, it is considered that the polymer liquid crystal compound contains a high-molecular-weight body in which a three-dimensional crosslinked structure is formed by the repeating unit (5). Here, since the content of the repeating unit (5) is small, the content of the high-molecular-weight body having the repeating unit (5) is considered to be small.

It is assumed that a light absorption anisotropic layer in which cissing of the liquid crystal composition is suppressed and the planar uniformity is excellent is obtained due to the presence of a small amount of the high-molecular-weight body with the three-dimensional crosslinked structure that has been formed as described above.

Further, it is assumed that the effect of suppressing a decrease in the alignment degree can be maintained because the content of the high-molecular-weight body is small.

It is preferable that the repeating unit (5) to be introduced by polymerizing a polyfunctional monomer is a repeating unit represented by Formula (5).

(5)

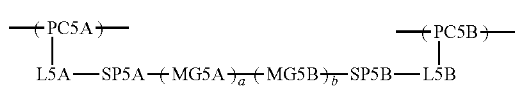

In Formula (5), PC5A and PC5B represent the main chain of the repeating unit and more specifically the same structure as that for PC1 in Formula (1), L5A and L5B represent a single bond or a divalent linking group and more specifically the same structure as that for L1 in Formula (1), SP5A and SP5B represent a spacer group and more specifically the same structure as that for SP1 in Formula (1), MG5A and MG5B represent a mesogen structure and more specifically the same structure as that for the mesogen group MG in Formula (LC), and a and b represent an integer of 0 or 1.

PC5A and PC5B may represent the same group or different groups, but it is preferable that PC5A and PC5B represent the same group from the viewpoint of further improving the alignment degree of the light absorption anisotropic layer.

Both L5A and L5B may represent a single bond, the same group, or different groups, but both L5A and L5B represent preferably a single bond or the same group and more preferably the same group from the viewpoint of further improving the alignment degree of the light ab sorption anisotropic layer.

Both SP5A and SP5B may represent a single bond, the same group, or different groups, but both SP5A and SP5B represent preferably a single bond or the same group and more preferably the same group from the viewpoint of further improving the alignment degree of the light absorption anisotropic layer.

Here, the same group in Formula (5) indicates that the chemical structures are the same as each other regardless of the orientation in which each group is bonded. For example, even in a case where SP5A represents *—$CH_2$—$CH_2$—O—** (* represents a bonding position with respect to L5A, and ** represents a bonding position with respect to MG5A) and SP5B represents *—O—$CH_2$—$CH_2$—** (* represents a bonding position with respect to MG5B, and ** represents a bonding position with respect to L5B), SP5A and SP5B represent the same group.

a and b each independently represent an integer of 0 or 1 and preferably 1 from the viewpoint of further improving the alignment degree of the light absorption anisotropic layer.

a and b may be the same as or different from each other, but from the viewpoint of further improving the alignment degree of the light absorption anisotropic layer, it is preferable that both a and b represent 1.

From the viewpoint of further improving the alignment degree of the light absorption anisotropic layer, the sum of a and b is preferably 1 or 2 (that is, the repeating unit represented by Formula (5) contains a mesogen group) and more preferably 2.

From the viewpoint of further improving the alignment degree of the light absorption anisotropic layer, it is preferable that the partial structure represented by $-(MG5A)_a-(MG5B)_b-$ has a cyclic structure. In this case, from the viewpoint of further improving the alignment degree of the light absorption anisotropic layer, the number of cyclic structures in the partial structure represented by $-(MG5A2)_a-(MG5B)_b-$ is preferably 2 or greater, more preferably in a range of 2 to 8, still more preferably in a range of 2 to 6, and particularly preferably in a range of 2 to 4.

From the viewpoint of further improving the alignment degree of the light absorption anisotropic layer, the mesogen groups represented by MG5A and MG5B each independently have preferably one or more cyclic structures, more preferably 2 to 4 cyclic structures, still more preferably 2 or 3 cyclic structures, and particularly preferably 2 cyclic structures.

Specific examples of the cyclic structure include an aromatic hydrocarbon group, a heterocyclic group, and an alicyclic group. Among these, an aromatic hydrocarbon group and an alicyclic group are preferable.

MG5A and MG5B may represent the same group or different groups, but from the viewpoint of further improving the alignment degree of the light absorption anisotropic layer, it is preferable that MG5A and MG5B represent the same group.

From the viewpoints of exhibiting the liquid crystallinity, adjusting the liquid crystal phase transition temperature, and the availability of raw materials and synthetic suitability and from the viewpoint that the effects of the present invention are more excellent, it is preferable that the mesogen group represented by MG5A and MG5B is the mesogen group MG in Formula (LC).

Particularly in the repeating unit (5), it is preferable that PC5A and PC5B represent the same group, both L5A and L5B represent a single bond or the same group, both SP5A and SP5B represent a single bond or the same group, and MG5A and MG5B represent the same group. In this manner, the alignment degree of the light absorption anisotropic layer is further improved.

The content of the repeating unit (5) is preferably 10% by mass or less, more preferably in a range of 0.001% to 5% by mass, and still more preferably in a range of 0.05% to 3% by mass with respect to the content (100% by mass) of all the repeating units of the polymer liquid crystal compound.

The polymer liquid crystal compound may have only one or two or more kinds of repeating units (5). In a case where the polymer liquid crystal compound has two or more kinds of repeating units (5), it is preferable that the total amount thereof is in the above-described range.

(Star-Shaped Polymer)

The polymer liquid crystal compound may be a star-shaped polymer. The star-shaped polymer in the present invention indicates a polymer having three or more polymer chains extending from the nucleus and is specifically represented by Formula (6).

The star-shaped polymer represented by Formula (6) as the polymer liquid crystal compound can form a light absorption anisotropic layer having a high alignment degree while having high solubility (excellent solubility in a solvent).

AæPI)$n_A$ (6)

In Formula (6), $n_A$ represents an integer of 3 or greater and preferably an integer of 4 or greater. The upper limit of $n_A$ is not limited thereto, but is commonly 12 or less and preferably 6 or less.

A plurality of PI's each independently represent a polymer chain having any of repeating units represented by Formulae (1), (21), (22), (3), (4), and (5). Here, at least one of the plurality of PI's represents a polymer chain having a repeating unit represented by Formula (1).

A represents an atomic group that is the nucleus of the star-shaped polymer. Specific examples of A include structures obtained by removing hydrogen atoms from thiol groups of the polyfunctional thiol compound, described in paragraphs [0052] to [0058] of JP2011-074280A, paragraphs [0017] to [0021] of JP2012-189847A, paragraphs [0012] to [0024] of JP2013-031986A, and paragraphs [0118] to [0142] of JP2014-104631A. In this case, A and PI are bonded to each other through a sulfide bond.

The number of thiol groups of the polyfunctional thiol compound from which A is derived is preferably 3 or greater and more preferably 4 or greater. The upper limit of the number of thiol groups of the polyfunctional thiol compound is commonly 12 or less and preferably 6 or less.

Specific examples of the polyfunctional thiol compound are shown below.

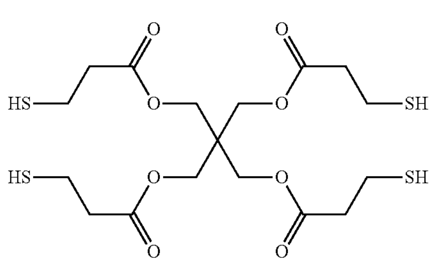

-continued

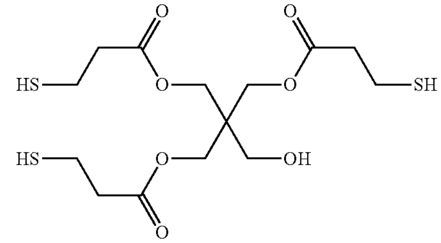

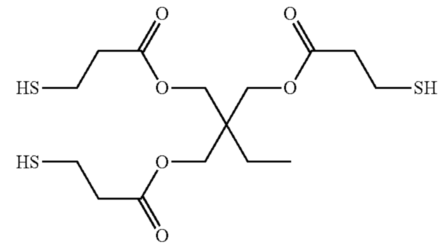

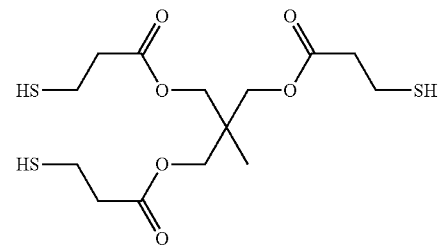

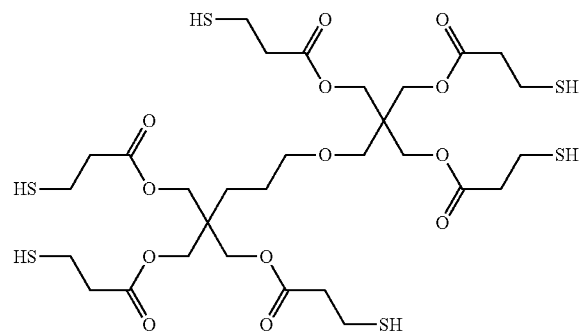

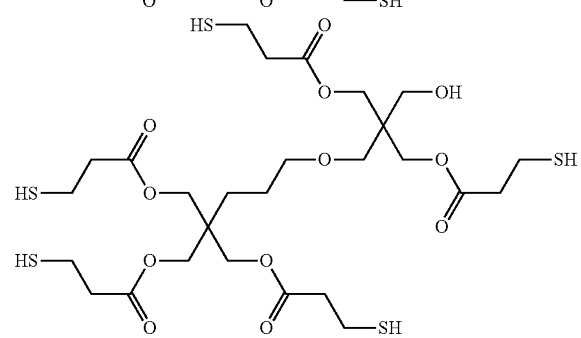

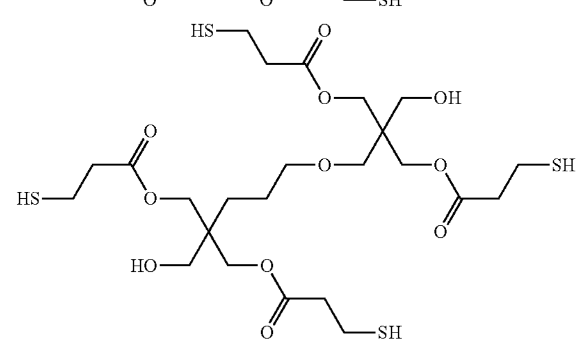

-continued

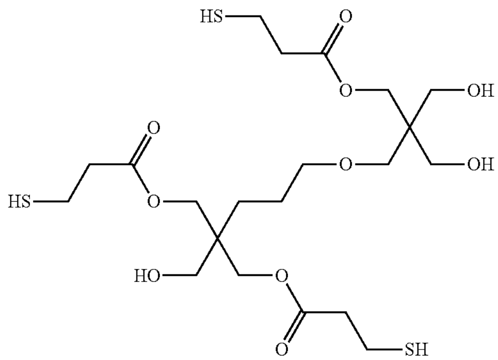

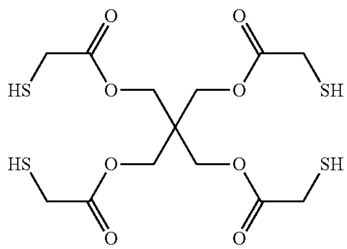

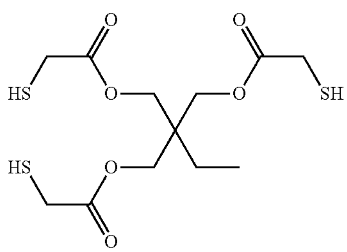

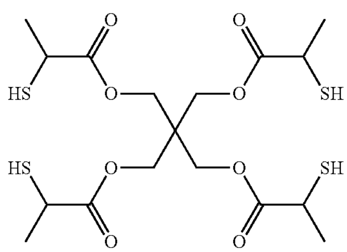

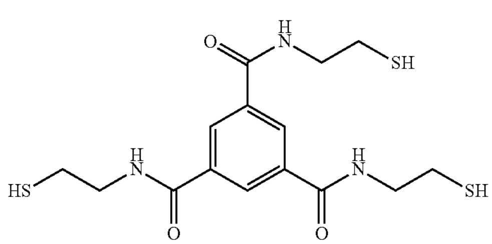

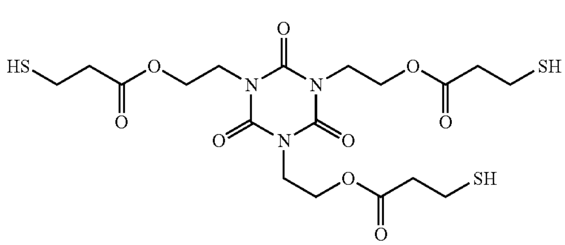

-continued

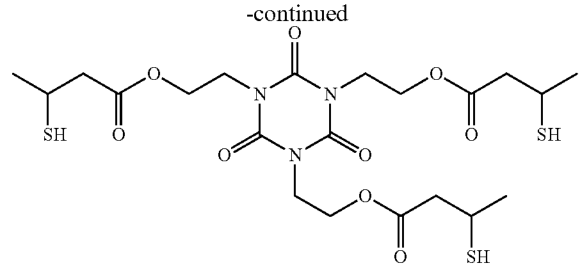

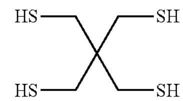

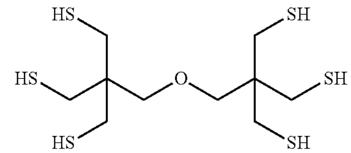

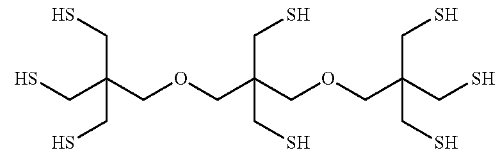

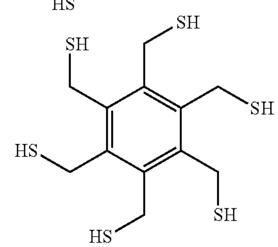

From the viewpoint of improving the alignment degree, the polymer liquid crystal compound may be a thermotropic liquid crystal and a crystalline polymer.

(Thermotropic Liquid Crystal)

A thermotropic liquid crystal is a liquid crystal that shows transition to a liquid crystal phase due to a change in temperature.

The polymer liquid crystal compound is a thermotropic liquid crystal and may exhibit any of a nematic phase or a smectic phase, but it is preferable that the polymer liquid crystal compound exhibits at least the nematic phase from the viewpoint that haze is unlikely to be observed (haze is further enhanced).

The temperature range showing the nematic phase is preferably in a range of room temperature (23° C.) to 450° C. from the viewpoint that the alignment degree of the light absorption anisotropic layer is further increased and haze is unlikely to be observed and more preferably in a range of 40° C. to 400° C. from the viewpoints of the handleability and the manufacturing suitability.

(Crystalline Polymer)

A crystalline polymer is a polymer showing a transition to a crystal phase due to a change in temperature. The crystalline polymer may show a glass transition other than the transition to the crystal phase.

It is preferable that the crystalline polymer is a polymer liquid crystal compound that has a transition from a crystal phase to a liquid crystal phase in a case of being heated (glass transition may be present in the middle of the transition) from the viewpoint that the alignment degree of the light absorption anisotropic layer is further increased and haze is more difficult to observe or a polymer liquid crystal compound that has a transition to a crystal phase in a case where the temperature is lowered after entering a liquid crystal state by being heated (glass transition may be present in the middle of the transition).

The presence or absence of crystallinity of the polymer liquid crystal compound is evaluated as follows.

Two light absorption anisotropic layers of an optical microscope (ECLIPSE E600 POL, manufactured by Nikon Corporation) are disposed so as to be orthogonal to each other, and a sample table is set between the two light absorption anisotropic layers. Further, a small amount of the polymer liquid crystal compound is placed on slide glass, and the slide glass is set on a hot stage placed on the sample table. While the state of the sample is observed, the temperature of the hot stage is increased to a temperature at which the polymer liquid crystal compound exhibits liquid crystallinity, and the polymer liquid crystal compound is allowed to enter a liquid crystal state. After the polymer liquid crystal compound enters the liquid crystal state, the behavior of the liquid crystal phase transition is observed while the temperature of the hot stage is gradually lowered, and the temperature of the liquid crystal phase transition is recorded. In a case where the polymer liquid crystal compound exhibits a plurality of liquid crystal phases (for example, a nematic phase and a smectic phase), all the transition temperatures are also recorded.

Next, approximately 5 mg of a sample of the polymer liquid crystal compound is put into an aluminum pan, and the pan is covered and set on a differential scanning calorimeter (DSC) (an empty aluminum pan is used as a reference). The polymer liquid crystal compound measured in the above-described manner is heated to a temperature at which the compound exhibits a liquid crystal phase, and the temperature is maintained for 1 minute. Thereafter, the calorific value is measured while the temperature is lowered at a rate of 10° C./min. An exothermic peak is confirmed from the obtained calorific value spectrum.

As a result, in a case where an exothermic peak is observed at a temperature other than the liquid crystal phase transition temperature, it can be said that the exothermic peak is a peak due to crystallization and the polymer liquid crystal compound has crystallinity.

Meanwhile, in a case where an exothermic peak is not observed at a temperature other than the liquid crystal phase transition temperature, it can be said that the polymer liquid crystal compound does not have crystallinity.

The method of obtaining a crystalline polymer is not particularly limited, but as a specific example, a method of using a polymer liquid crystal compound having the repeating unit (1) described above is preferable, and a method of using a suitable form among polymer liquid crystal compounds having the repeating unit (1) described above is more preferable.

(Crystallization Temperature)

From the viewpoint that the alignment degree of the light absorption anisotropic layer is further increased and haze is unlikely to be observed, the crystallization temperature of the polymer liquid crystal compound is preferably −50° C. or higher and lower than 150° C., more preferably 120° C. or lower, still more preferably −20° C. or higher and lower than 120° C., and particularly preferably 95° C. or lower. The crystallization temperature of the polymer liquid crystal compound is preferably lower than 150° C. from the viewpoint of reducing haze.

Further, the crystallization temperature is a temperature of an exothermic peak due to crystallization in the above-described DSC.

(Molecular Weight)

From the viewpoint that the effects of the present invention are more excellent, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the alignment degree, the weight-average molecular weight (Mw) of the polymer liquid crystal compound is preferably less than 10000 and more preferably 2000 or greater and less than 10000.

Here, the weight-average molecular weight and the number average molecular weight in the present invention are values measured by the gel permeation chromatography (GPC) method.

Solvent (eluent): N-methylpyrrolidone

Device name: TOSOH HLC-8220GPC

Column: Connect and use three of TOSOH TSKgel Super AWM-H (6 mm×15 cm)

Column temperature: 25° C.

Sample concentration: 0.1% by mass

Flow rate: 0.35 mL/min

Calibration curve: TSK standard polystyrene (manufactured by TOSOH Corporation), calibration curves of 7 samples with Mw of 2800000 to 1050 (Mw/Mn=1.03 to 1.06) are used. The polymer liquid crystal compound may exhibit nematic or smectic liquid crystallinity, but it is preferable that the polymer liquid crystal compound exhibits at least the nematic liquid crystallinity.

The temperature range showing the nematic phase is preferably in a range of 0° C. to 450° C., and preferably in a range of 30° C. to 400° C. from the viewpoints of handleability and manufacturing suitability.

The content of the liquid crystal compound is preferably in a range of 25 to 2000 parts by mass, more preferably in a range of 100 to 1300 parts by mass, and still more preferably in a range of 200 to 900 parts by mass with respect to 100 parts by mass of the content of the dichroic substances in the liquid crystal composition. In a case where the content of the liquid crystal compound is in the above-described ranges, the alignment degree of the polarizer is further improved.

The light absorption anisotropic layer may contain only one or two or more kinds of liquid crystal compounds. In a case where the light absorption anisotropic layer contains two or more kinds of liquid crystal compounds, the content of the liquid crystal compounds denotes the total content of the liquid crystal compounds.

[Dichroic Substance]

The light absorption anisotropic layer used in the present invention contains a dichroic sub stance.

The dichroic substance is not particularly limited, and examples thereof include a visible light absorbing material (such as a dichroic substance or a dichroic azo compound), a light emitting material (such as a fluorescent material or a phosphorescent material), an ultraviolet absorbing material, an infrared absorbing material, a non-linear optical material, a carbon nanotube, and an inorganic material (for example, a quantum rod). Further, known dichroic substances (such as dichroic coloring agents and dichroic dyes) of the related art can be used.

As the dichroic substance to be used, an organic dichroic substance compound is preferable, and a dichroic azo coloring agent compound is more particularly preferable.

The dichroic azo coloring agent compound is not particularly limited, and known dichroic azo coloring agents of the related art can be used, but the compounds described below are preferably used.

In the present invention, the dichroic azo coloring agent compound denotes a coloring agent having different absorbances depending on the direction.

The dichroic azo coloring agent compound may or may not exhibit liquid crystallinity.

In a case where the dichroic azo coloring agent compound exhibits liquid crystallinity, the dichroic azo coloring agent compound may exhibit any of nematic liquid crystallinity or smectic liquid crystallinity. The temperature at which the liquid crystal phase is exhibited is preferably in a range of room temperature (approximately 20° C. to 28° C.) to 300° C. and from the viewpoints of handleability and manufacturing suitability, more preferably in a range of 50° C. to 200° C.

In the present invention, from the viewpoint of adjusting the tint, the light absorption anisotropic layer contains preferably at least one coloring agent compound having a maximal absorption wavelength in a wavelength range of 560 to 700 nm (hereinafter, also referred to as "first dichroic azo coloring agent compound") and at least one coloring agent compound having a maximal absorption wavelength in a wavelength range of 455 nm or greater and less than 560 nm (hereinafter, also referred to as "second dichroic azo coloring agent compound") and specifically more preferably at least a dichroic azo coloring agent compound represented by Formula (1) and a dichroic azo coloring agent compound represented by Formula (2).

In the present invention, three or more kinds of dichroic azo coloring agent compounds may be used in combination. For example, from the viewpoint of making the color of the light absorption anisotropic layer close to black, it is preferable to use a first dichroic azo coloring agent compound, a second dichroic azo coloring agent compound, and at least one coloring agent compound having a maximal absorption wavelength in a wavelength range of 380 nm or greater and less than 455 nm (hereinafter, also referred to as "third dichroic azo coloring agent compound") in combination.

That is, in the present invention, the light absorption anisotropic layer contains preferably two or more kinds of organic dichroic coloring agents with different absorption peak wavelengths and more preferably three or more kinds of organic dichroic coloring agents with different absorption peak wavelengths.

In the present invention, from the viewpoint of further enhancing pressing resistance, it is preferable that the dichroic azo coloring agent compound contains a crosslinkable group.

Specific examples of the crosslinkable group include a (meth)acryloyl group, an epoxy group, an oxetanyl group, and a styryl group. Among these, a (meth)acryloyl group is preferable.

(First Dichroic Azo Coloring Agent Compound)

It is preferable that the first dichroic azo coloring agent compound is a compound having a chromophore which is a nucleus and a side chain bonded to a terminal of the chromophore.

Specific examples of the chromophore include an aromatic ring group (such as an aromatic hydrocarbon group or an aromatic heterocyclic group) and an azo group. In addition, a structure containing both an aromatic ring group and an azo group is preferable, and a bisazo structure containing an aromatic heterocyclic group (preferably a thienothiazole group) and two azo groups is more preferable.

The side chain is not particularly limited, and examples thereof include a group represented by L3, R2, or L4 in Formula (1).

The first dichroic azo coloring agent compound is a dichroic azo coloring agent compound having a maximum absorption wavelength in a wavelength range of 560 nm or greater and 700 nm or less, and from the viewpoint of adjusting the tint of the polarizer, preferably a dichroic azo coloring agent compound having a maximum absorption wavelength in a wavelength range of 560 to 650 nm and more preferably a dichroic azo coloring agent compound having a maximum absorption wavelength in a wavelength range of 560 to 640 nm.

The maximum absorption wavelength (nm) of the dichroic azo coloring agent compound in the present specification is acquired from an ultraviolet visible spectrum in a wavelength range of 380 to 800 nm measured by a spectrophotometer using a solution prepared by dissolving the dichroic azo coloring agent compound in a good solvent.

In the present invention, from the viewpoint of further improving the alignment degree of the light absorption anisotropic layer to be formed, it is preferable that the first dichroic azo coloring agent compound is a compound represented by Formula (1).

(1)

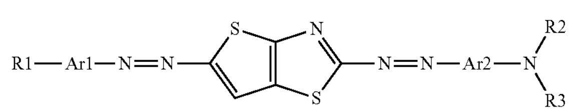

In Formula (1), Ar1 and Ar2 each independently represent a phenylene group which may have a substituent or a naphthylene group which may have a substituent. Among these, a phenylene group is preferable.

In Formula (1), R1 represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group.

Further, —$CH_2$— constituting the alkyl group may be substituted with —O—, —CO—, —C(O)—O—, —O—C(O)—, —$Si(CH_3)_2$—O—$Si(CH_3)_2$—, —N(R1')-, —N(R1')-CO—, —CO—N(R1')-, —N(R1')-C(O)—O—, —O—C(O)—N(R1')-, —N(R1')-C(O)—N(R1')-, —CH═CH—, —N═N—, —C(R1')═CH—C(O)—, or —O—C(O)—O—.

In a case where R1 represents a group other than a hydrogen atom, the hydrogen atom in each group may be substituted with a halogen atom, a nitro group, a cyano group, —N(R1')$_2$, an amino group, —C(R1')≡C(R1')-NO$^2$, —C(R1')≡C(R1')-CN, or —C(R1')≡C(CN)$_2$.

R1' represents a hydrogen atom or a linear or branched alkyl group having 1 to 6 carbon atoms. In a case where a plurality of (R1')'s are present in each group, these may be the same as or different from one another.

In Formula (1), R2 and R3 each independently represent a hydrogen atom, a linear or branched alkyl group having 1 to 20 carbon atoms which may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

Further, —CH$_2$— constituting the alkyl group may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —N2'-, —NR2'-CO—, —CO—NR2', —NR2'-C(O)—O—, —O—C(O)—NR2'-, —NR2'-C(O)—NR2'-, —CH═CH—, —N═N—, —C(R2')=CH—C(O)—, or —O—C(O)—O—.

In a case where R2 and R3 represent a group other than a hydrogen atom, the hydrogen atom of each group may be substituted with a halogen atom, a nitro group, a cyano group, a —OH group, —N(R2')$_2$, an amino group, —C(R2')≡C(R2')-NO$_2$, —C(R2')≡C(R2')-CN, or —C(R2')≡C(CN)$_2$.

R2' represents a hydrogen atom or a linear or branched alkyl group having 1 to 6 carbon atoms. In a case where a plurality of (R2')'s are present in each group, these may be the same as or different from one another.

R2 and R3 may be bonded to each other to form a ring, or R2 or R3 may be bonded to Ar2 to form a ring.

From the viewpoint of the light fastness, it is preferable that R1 represents an electron-withdrawing group and R2 and R3 represent a group having a low electron-donating property.

Specific examples of such a group as R1 include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and examples of groups as R2 and R3 include groups having the following structures. In addition, the groups having the following structures are shown in the form having a nitrogen atom to which R2 and R3 are bonded in Formula (1).

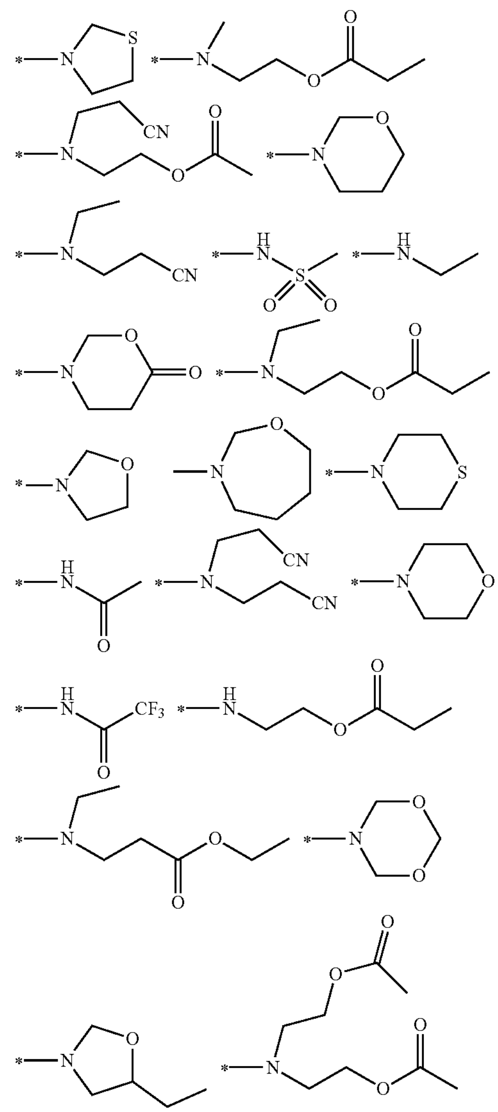

Specific examples of the first dichroic azo coloring agent compound are shown below, but the present invention is not limited thereto.

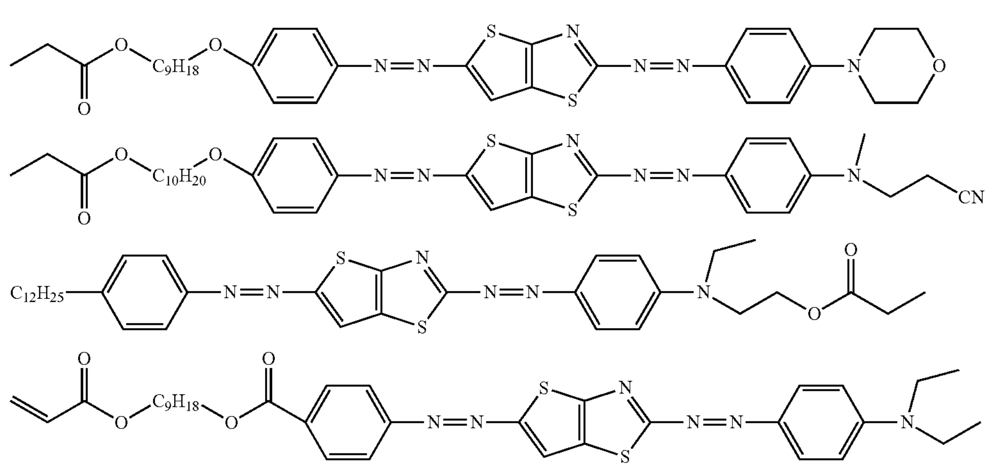

-continued
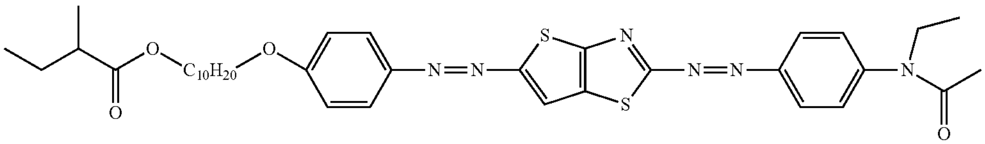
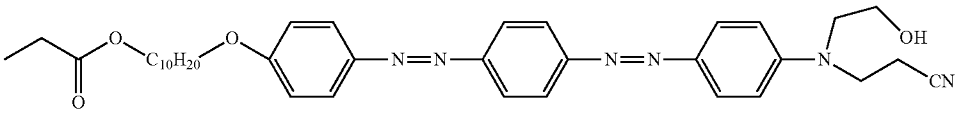
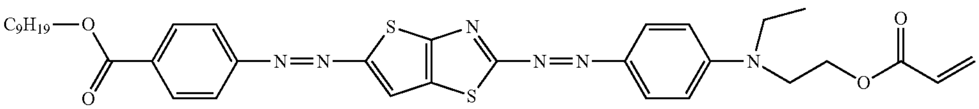
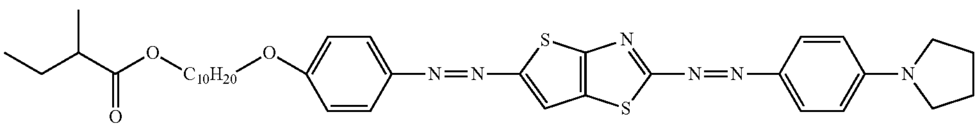
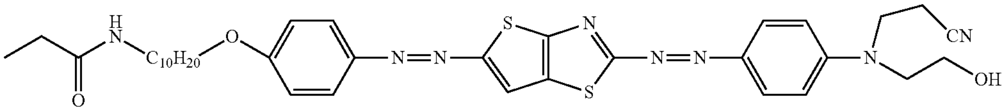
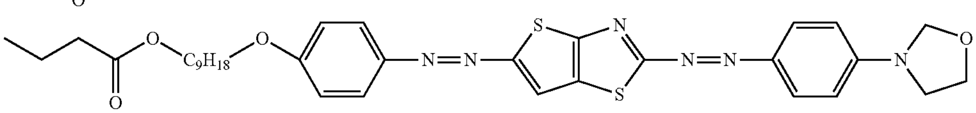
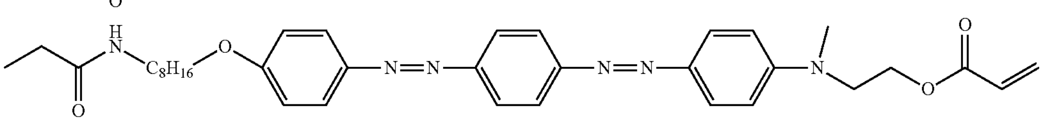
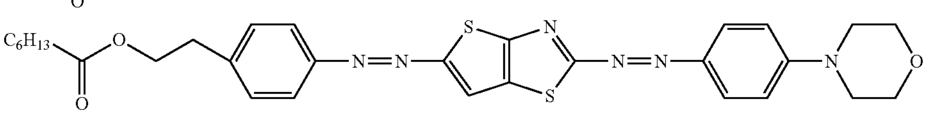
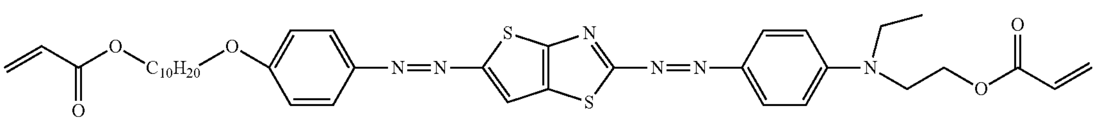
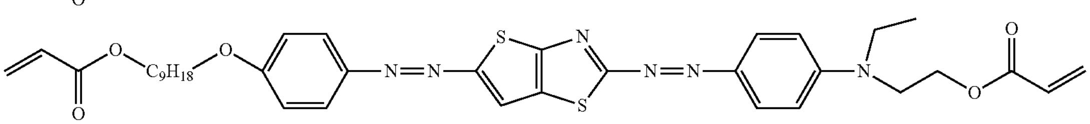
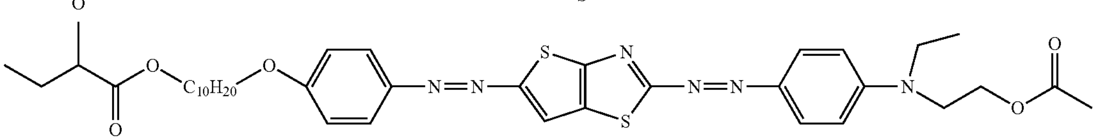
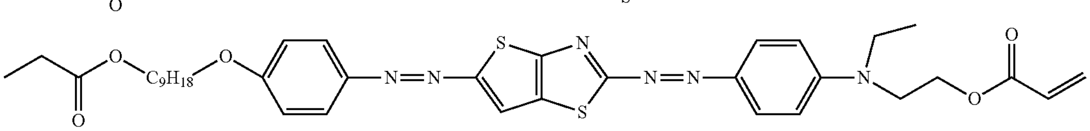
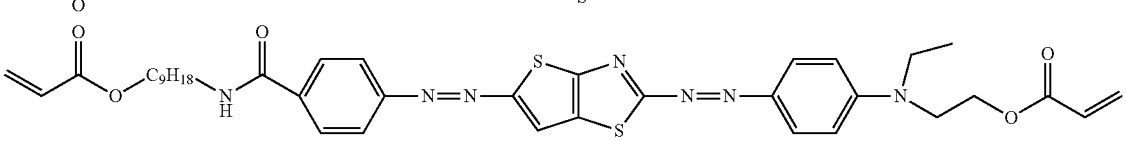

-continued

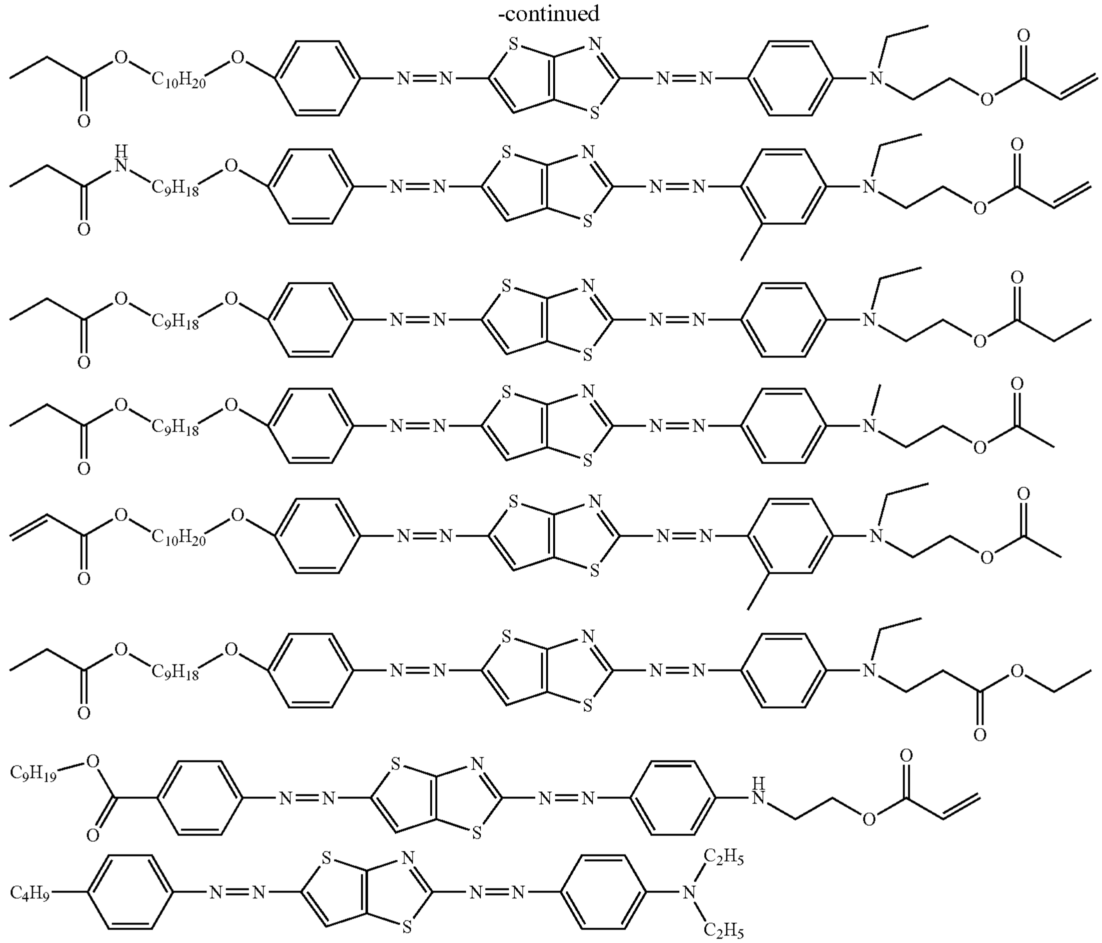

(Second Dichroic Azo Coloring Agent Compound)

The second dichroic azo coloring agent compound is a compound different from the first dichroic azo coloring agent compound, and specifically, the chemical structure thereof is different from that of the first dichroic azo coloring agent compound.

It is preferable that the second dichroic azo coloring agent compound is a compound having a chromophore which is a nucleus of a dichroic azo coloring agent compound and a side chain bonded to a terminal of the chromophore.

Specific examples of the chromophore include an aromatic ring group (such as an aromatic hydrocarbon group or an aromatic heterocyclic group) and an azo group. In addition, a structure containing both an aromatic hydrocarbon group and an azo group is preferable, and a bisazo or trisazo structure containing an aromatic hydrocarbon group and two or three azo groups is more preferable.

The side chain is not particularly limited, and examples thereof include a group represented by R4, R5, or R6 in Formula (2).

The second dichroic azo coloring agent compound is a dichroic azo coloring agent compound having a maximum absorption wavelength in a wavelength range of 455 nm or greater and less than 560 nm. From the viewpoint of adjusting the tint of the polarizer, the second dichroic azo coloring agent compound is preferably a dichroic azo coloring agent compound having a maximum absorption wavelength in a wavelength range of 455 to 555 nm and more preferably a dichroic azo coloring agent compound having a maximum absorption wavelength in a wavelength range of 455 to 550 nm.

In particular, the tint of the polarizer is easily adjusted by using a first dichroic azo coloring agent compound having a maximum absorption wavelength of 560 to 700 nm and a second dichroic azo coloring agent compound having a maximum absorption wavelength of 455 nm or greater and less than 560 nm.

From the viewpoint of further improving the alignment degree of the polarizer, it is preferable that the second dichroic azo coloring agent compound is a compound represented by Formula (2).

$$\mathrm{R4{-}Ar3{-}N{=}N{+}Ar4{-}N{=}N{+}_{n}Ar5{-}N(R5)(R6)} \quad (2)$$

In Formula (2), n represents 1 or 2.

In Formula (2), Ar3, Ar4, and Ar5 each independently represent a phenylene group which may have a substituent, a naphthylene group which may have a substituent, or a heterocyclic group which may have a substituent.

The heterocyclic group may be aromatic or non-aromatic.

The atoms other than carbon constituting the aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

In Formula (2), R4 has the same definition as that for R1 in Formula (1).

In Formula (2), R5 and R6 each have the same definition as that for R2 and R3 in Formula (1).

From the viewpoint of the light fastness, it is preferable that R4 represents an electron-withdrawing group and R5 and R6 represent a group having a low electron-donating property.

Among such groups, specific examples of a case where R4 represents an electron-withdrawing group are the same as the specific examples of a case where R1 represents an electron-withdrawing group, and specific examples of a case where R5 and R6 represent a group having a low electron-donating property are the same as the specific examples of a case where R2 and R3 represent a group having a low electron-donating property.

Specific examples of the second dichroic azo coloring agent compound are shown below, but the present invention is not limited thereto.

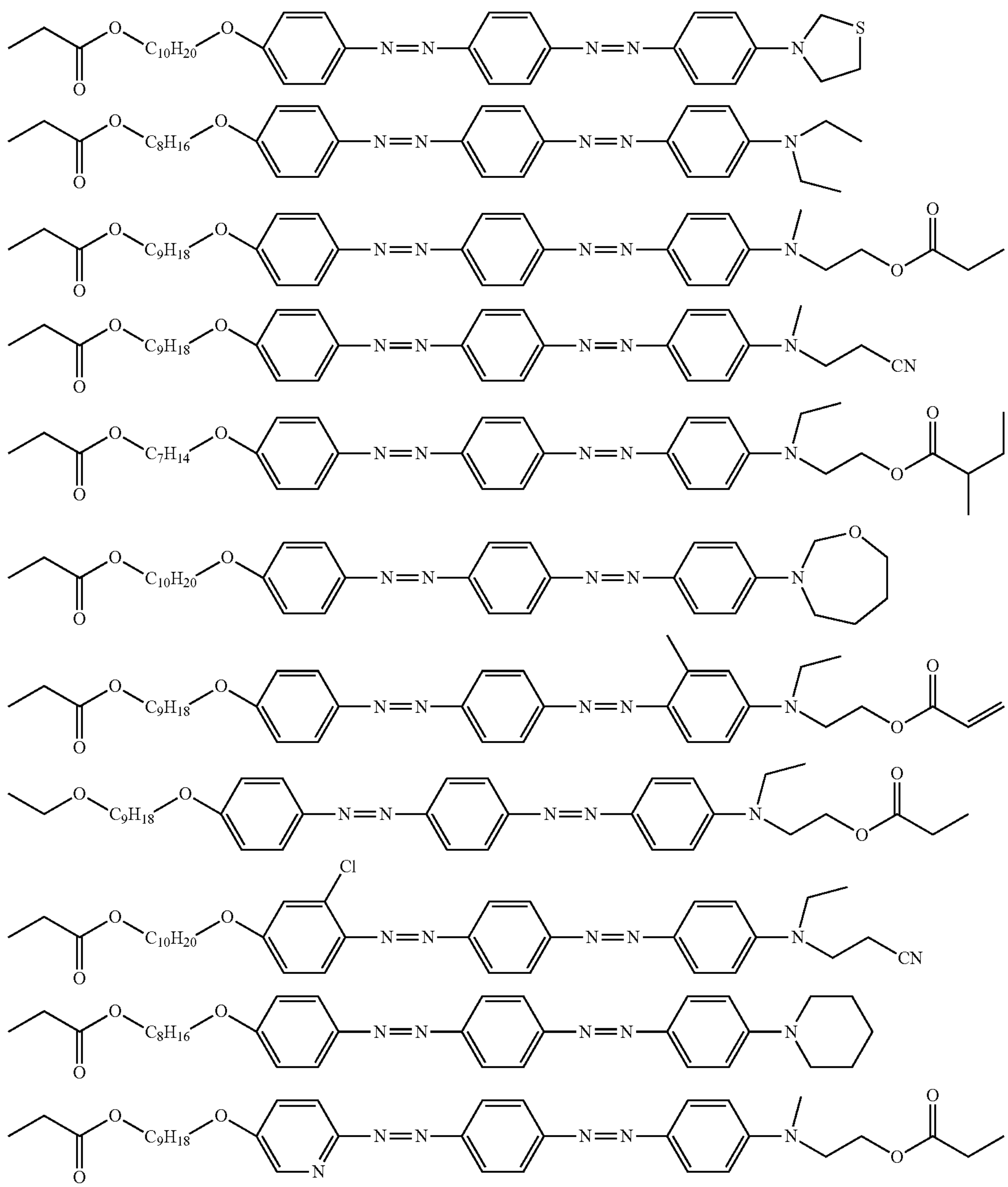

-continued
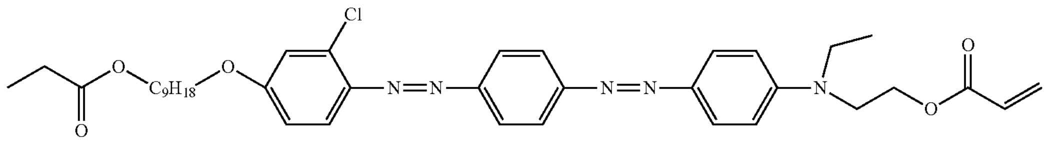
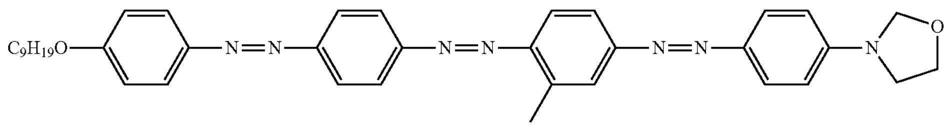
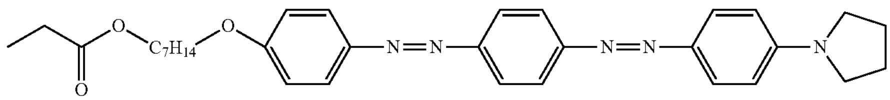
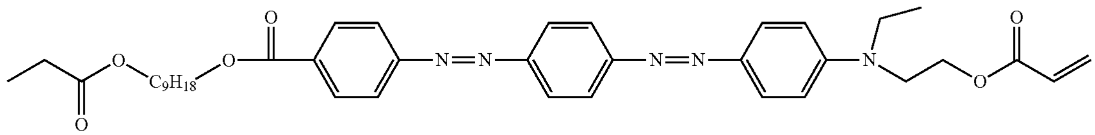
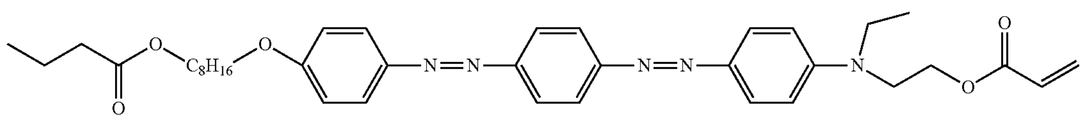
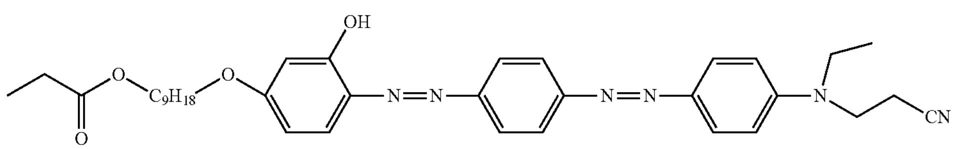
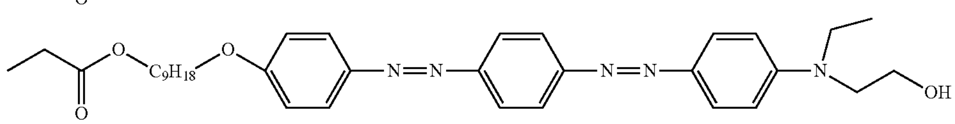
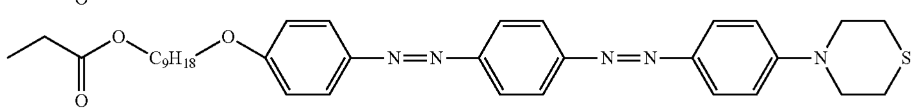
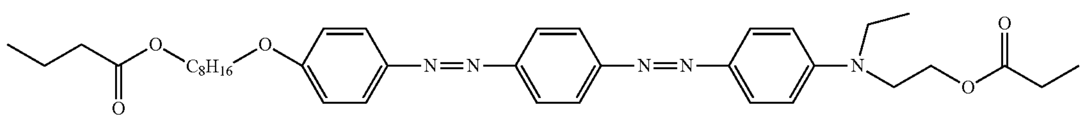
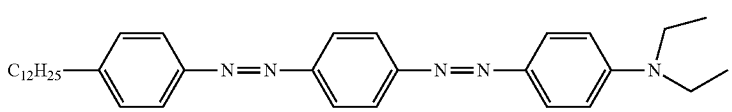
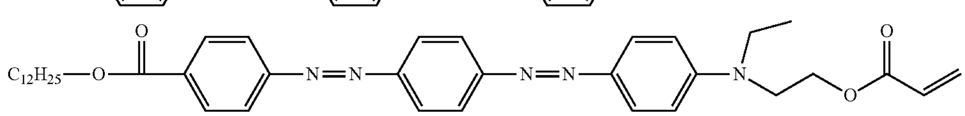
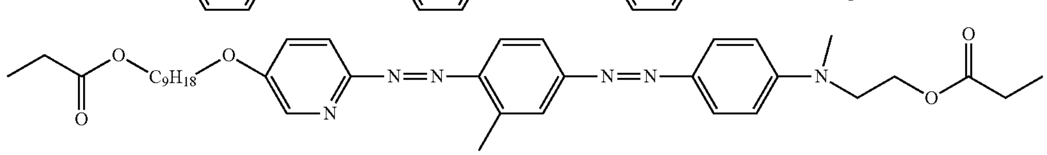
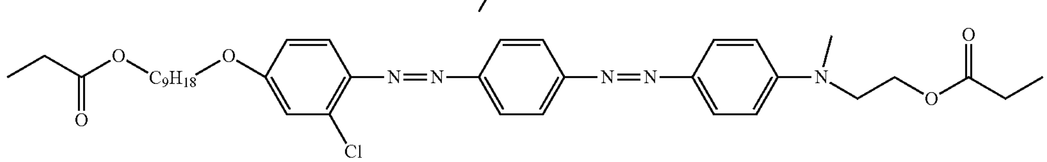
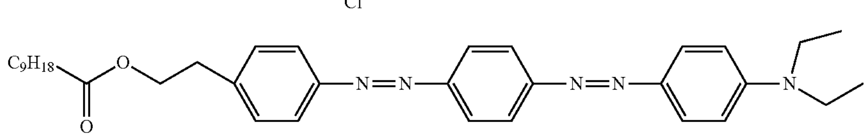

-continued
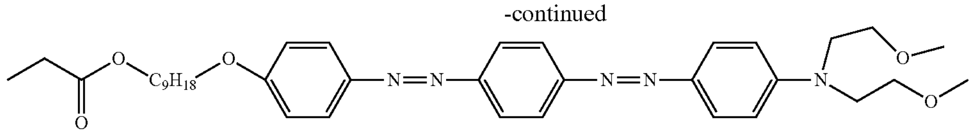
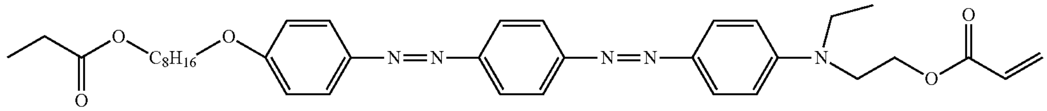
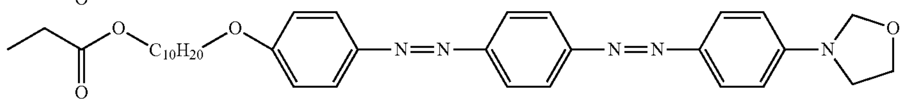
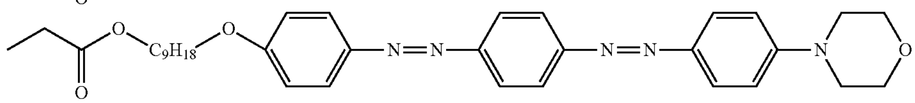
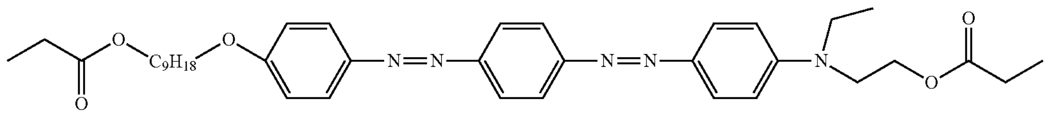
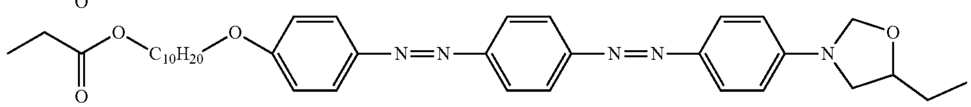
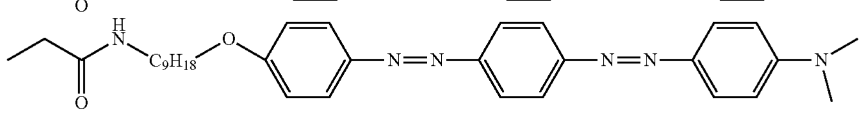
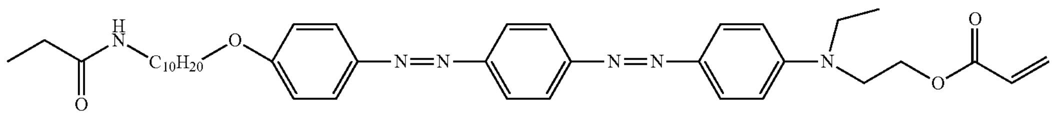
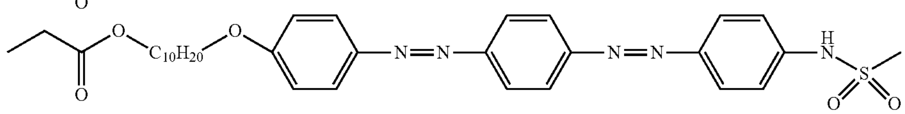
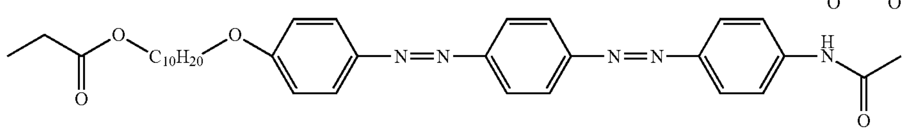
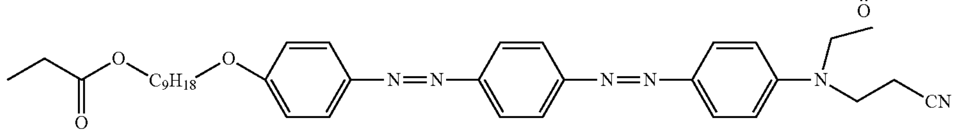
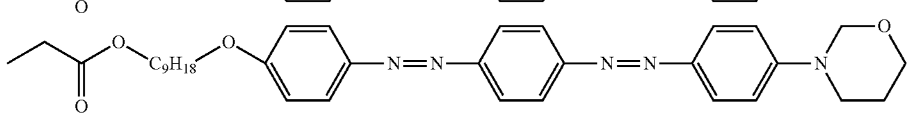
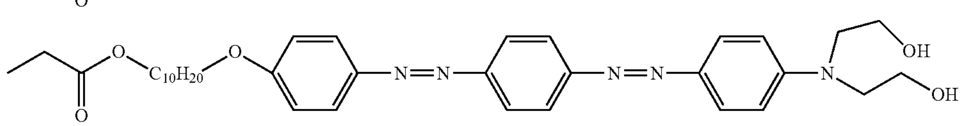
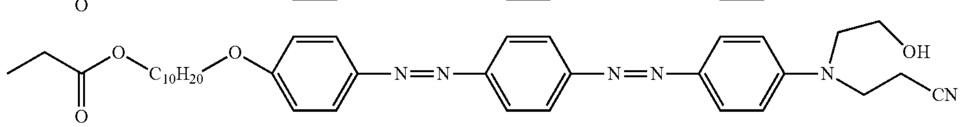
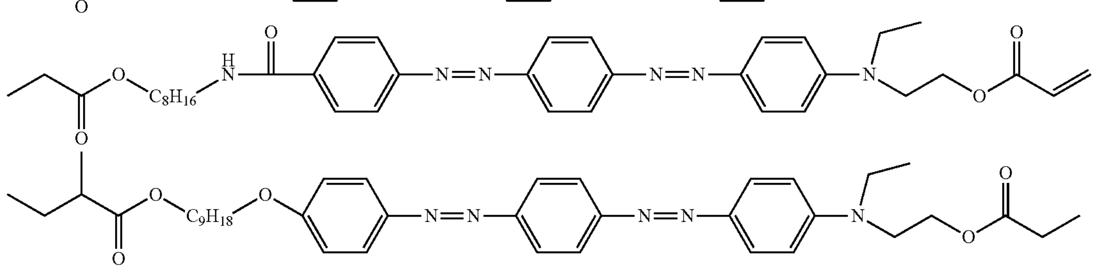

-continued

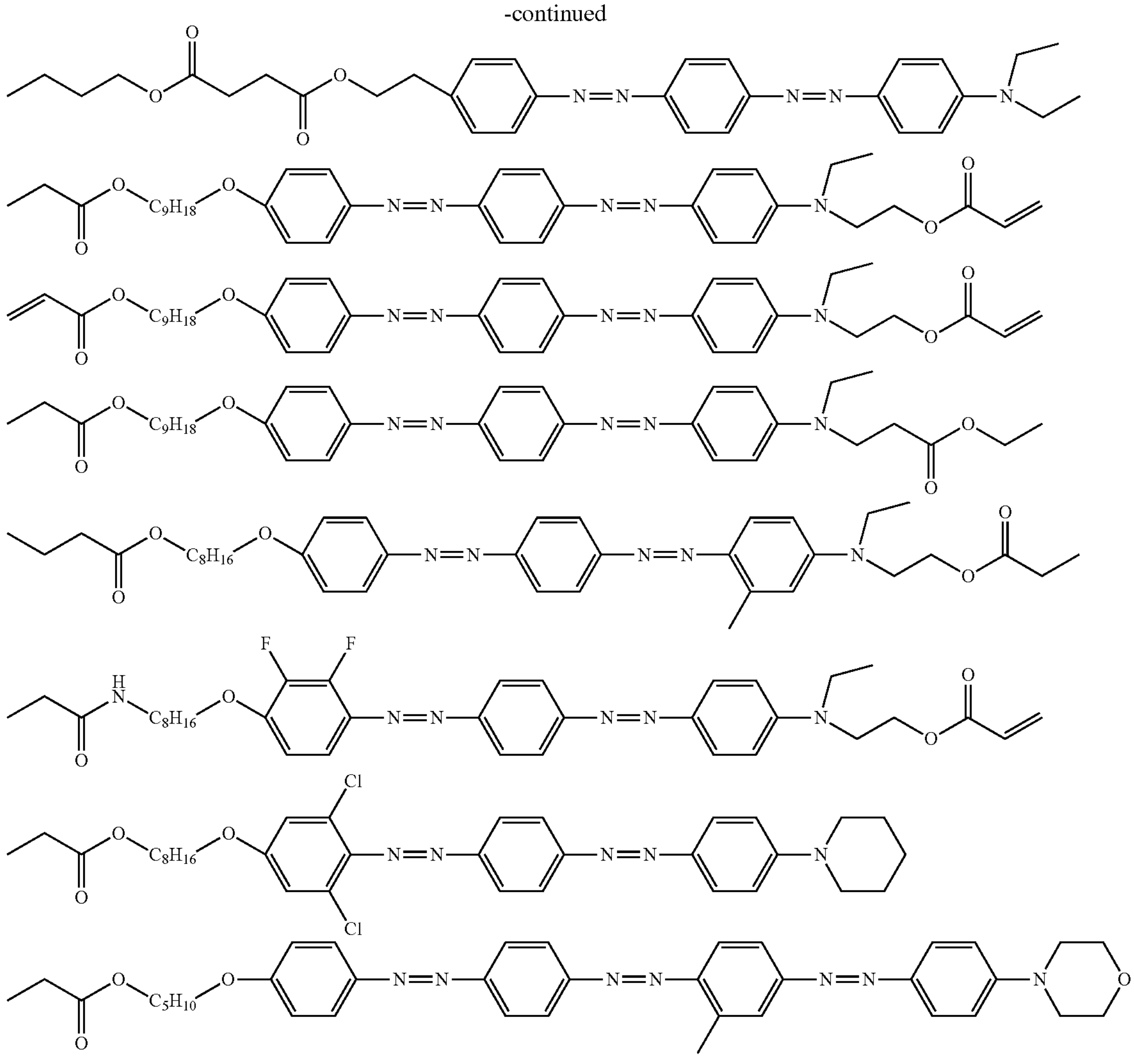

(Difference in Log P Value)

The log P value is an index expressing the hydrophilicity and the hydrophobicity of a chemical structure. An absolute value of a difference (hereinafter, also referred to as "difference in log P value") between the log P value of a side chain of the first dichroic azo coloring agent compound and the log P value of a side chain of the second dichroic azo coloring agent compound is preferably 2.30 or less, more preferably 2.0 or less, still more preferably 1.5 or less, and particularly preferably 1.0 or less. In a case where the difference in log P value is 2.30 or less, since the affinity between the first dichroic azo coloring agent compound and the second dichroic azo coloring agent compound is enhanced and an aligned structure is more easily formed, the alignment degree of the light absorption anisotropic layer is further improved.

Further, in a case where the first dichroic azo coloring agent compound or the second dichroic azo coloring agent compound has a plurality of side chains, it is preferable that at least one difference in log P value is in the above-described ranges.

Here, the side chain of the first dichroic azo coloring agent compound and the side chain of the second dichroic azo coloring agent compound denote a group bonded to a terminal of the above-described chromophore. For example, R1, R2, and R3 in Formula (1) represent a side chain in a case where the first dichroic azo coloring agent compound is a compound represented by Formula (1), and R4, R5, and R6 in Formula (2) represent a side chain in a case where the second dichroic azo coloring agent compound is a compound represented by Formula (2). In particularly, in a case where the first dichroic azo coloring agent compound is a compound represented by Formula (1) and the second dichroic azo coloring agent compound is a compound represented by Formula (2), it is preferable that at least one difference in log P value among the difference in log P value between R1 and R4, the difference in log P value between R1 and R5, the difference in log P value between R2 and R4, and the difference in log P value between R2 and R5 is in the above-described ranges.

Here, the log P value is an index for expressing the properties of the hydrophilicity and hydrophobicity of a chemical structure and is also referred to as a hydrophilic-hydrophobic parameter. The log P value can be calculated using software such as ChemBioDraw Ultra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

(Third Dichroic Azo Coloring Agent Compound)

The third dichroic azo coloring agent compound is a dichroic azo coloring agent compound other than the first dichroic azo coloring agent compound and the second dichroic azo coloring agent compound, and specifically, the chemical structure thereof is different from those of the first dichroic azo coloring agent compound and the second dichroic azo coloring agent compound. In a case where the composition for forming a light absorption anisotropic layer contains the third dichroic azo coloring agent compound, there is an advantage that the tint of the light absorption anisotropic layer is easily adjusted.

The maximum absorption wavelength of the third dichroic azo coloring agent compound is 380 nm or greater and less than 455 nm and preferably in a range of 385 to 454 nm.

It is preferable that the third dichroic azo coloring agent compound contains a dichroic azo coloring agent represented by Formula (6).

(6)

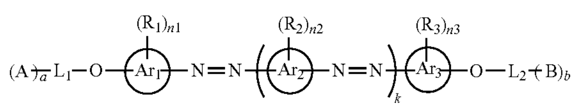

In Formula (6), A and B each independently represent a crosslinkable group.

In Formula (6), a and b each independently represent 0 or 1. From the viewpoint that the alignment degree at 420 nm is excellent, it is preferable that both a and b represent 0.

In Formula (6), $L_1$ represents a monovalent substituent in a case where a represents 0, and $L_1$ represents a single bond or a divalent linking group in a case where a represents 1. Further, $L_2$ represents a monovalent substituent in a case where b represents 0, and $L_2$ represents a single bond or a divalent linking group in a case where b represents 1.

In Formula (6), $Ar_1$ represents a (n1+2)-valent aromatic hydrocarbon group or a heterocyclic group, $Ar_2$ represents a (n2+2)-valent aromatic hydrocarbon group or a heterocyclic group, and $Ar_3$ represents a (n3+2)-valent aromatic hydrocarbon group or a heterocyclic group.

In Formula (6), R1, R2, and R3 each independently represent a monovalent substituent. A plurality of $R_1$'s may be the same as or different from each other in a case of "n1≥2", a plurality of $R_2$'s may be the same as or different from each other in a case of "n2≥2", and a plurality of $R_3$'s may be the same as or different from each other in a case of "n3≥2".

In Formula (6), k represents an integer of 1 to 4. In a case of "k≥2", a plurality of $Ar_2$'s may be the same as or different from each other and a plurality of $R_2$'s may be the same as or different from each other.

In Formula (6), n1, n2, and n3 each independently represent an integer of 0 to 4. Here, an expression of "n1+n2+n3≥0" is satisfied in a case of "k=1", and an expression of "n1+n2+n3≥1" is satisfied in a case of "k≥2".

In Formula (6), examples of the crosslinkable group represented by A and B include the polymerizable groups described in paragraphs [0040] to [0050] of JP2010-244038A. Among these, an acryloyl group, a methacryloyl group, an epoxy group, an oxetanyl group, and a styryl group are preferable from the viewpoint of improving the reactivity and the synthetic suitability, and an acryloyl group and a methacryloyl group are more preferable from the viewpoint of further improving the solubility.

In Formula (6), $L_1$ represents a monovalent substituent in a case where a represents 0, and $L_1$ represents a single bond or a divalent linking group in a case where a represents 1. Further, $L_2$ represents a monovalent substituent in a case where b represents 0, and $L_2$ represents a single bond or a divalent linking group in a case where b represents 1.

As the monovalent substituent represented by $L_1$ and $L_2$, a group to be introduced to increase the solubility of the dichroic substance or a group having an electron-donating property or an electron-withdrawing property which is to be introduced to adjust the color tone of the coloring agent is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an allyl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an imidazolyl group, a pyridyl group, a quinolyl group, a furyl group, a piperidyl group, a morpholino group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a halogen atom (such as a fluorine atom, a chlorine atom, a bromine atom, and an iodine atom), a hydroxy group, a mercapto group, a cyano group, a nitro group, a hydroxamic acid group, a sulfino group, a hydrazino group, an imino group, and an azo group.

These substituents may be further substituted with these substituents. Further, in a case where two or more substituents are present, these may be the same as or different from each other. Further, these may be bonded to each other to form a ring where possible.

As the group in which the above-described substituent is further substituted with the above-described substituent, an $R_B$—(O—$R_A$)$_{na}$— group which is a group in which an alkoxy group is substituted with an alkyl group is exemplified. Here, in the formula, $R_A$ represents an alkylene group having 1 to 5 carbon atoms, $R_B$ represents an alkyl group having 1 to 5 carbon atoms, and na represents an integer of 1 to 10 (preferably an integer of 1 to 5 and more preferably an integer of 1 to 3).

Among these, as the monovalent substituent represented by $L_1$ and $L_2$, an alkyl group, an alkenyl group, an alkoxy group, and groups in which these groups are further substituted with these groups (for example, $R_B$—(O—$R_A$)$_{na}$— group) are preferable, an alkyl group, an alkoxy group, and groups in which these groups are further substituted with these groups (for example, an $R_B$—(O—$R_A$)$_{na}$— group) are more preferable.

Examples of the divalent linking group represented by $L_1$ and $L_2$ include —O—, —S—, —CO—, —COO—, —OCO—, —O—CO—O—, —CO—N$R_N$—, —O—CO—N$R_N$—, —N$R_N$—CO—N$R_N$—, —$SO_2$—, —SO—, an alkylene group, a cycloalkylene group, an alkenylene group, and a group obtained by combining two or more of these groups.

Among these, a group obtained by combining an alkylene group with one or more groups selected from the group consisting of —O—, —COO—, —OCO— and —O—CO—O— is preferable.

Here, $R_N$ represents a hydrogen atom or an alkyl group. In a case where a plurality of $R_N$'s are present, the plurality of $R_N$'s may be the same as or different from each other.

From the viewpoint of further improving the solubility of the dichroic substance, the number of atoms in the main chain of at least one of $L_1$ or $L_2$ is preferably 3 or greater, more preferably 5 or greater, still more preferably 7 or greater, and particularly preferably 10 or greater. Further, the upper limit value of the number of atoms in the main chain is preferably 20 or less and more preferably 12 or less.

In addition, from the viewpoint of further improving the alignment degree of the light absorption anisotropic layer, the number of atoms of the main chain of at least one of $L_1$ or $L_2$ is preferably in a range of 1 to 5.

Here, in a case where A is present in Formula (6), "main chain" of $L_1$ denotes a portion required for directly linking "A" with the "0" atom linked to $L_1$, and "number of atoms in the main chain" denotes the number of atoms constituting the above-described portion. Similarly, in a case where B is present in Formula (6), "main chain" of $L_2$ denotes a portion required for directly linking "B" with the "0" atom linked to $L_2$, and "number of atoms in the main chain" denotes the number of atoms constituting the above-described portion. Further, "number of atoms in the main chain" does not include the number of atoms in a branched chain described below.

Further, in a case where A is not present, "number of atoms in the main chain" in $L_1$ denotes the number of atoms in $L_1$ that does not have a branched chain. In a case where B is not present, "number of atoms in the main chain" in $L_2$ denotes the number of atoms in $L_2$ that does not have a branched chain.

Specifically, in Formula (D1), the number of atoms in the main chain of $L_1$ is 5 (the number of atoms in the dotted frame on the left side of Formula (D1)), and the number of atoms in the main chain of $L_2$ is 5 (the number of atoms in the dotted frame on the right side of Formula (D1)). Further, in Formula (D10), the number of atoms in the main chain of $L_1$ is 7 (the number of atoms in the dotted frame on the left side of Formula (D10)), and the number of atoms in the main chain of $L_2$ is 5 (the number of atoms in the dotted frame on the right side of Formula (D10)).

In Formula (6), $Ar_1$ represents an (n1+2)-valent (for example, trivalent in a case where n1 represents 1) aromatic hydrocarbon group or heterocyclic group, $Ar_2$ represents an (n2+2)-valent (for example, trivalent in a case where n2 represents 1) aromatic hydrocarbon group or heterocyclic group, and $Ar_3$ represents an (n3+2)-valent (for example, trivalent in a case where n3 represents 1) aromatic hydrocarbon group or heterocyclic group. Here, $Ar_1$ to $Ar_3$ can be respectively rephrased as a divalent aromatic hydrocarbon group or a divalent heterocyclic group substituted with n1 to n3 substituents ($R_1$ to $R_3$ described below).

D1

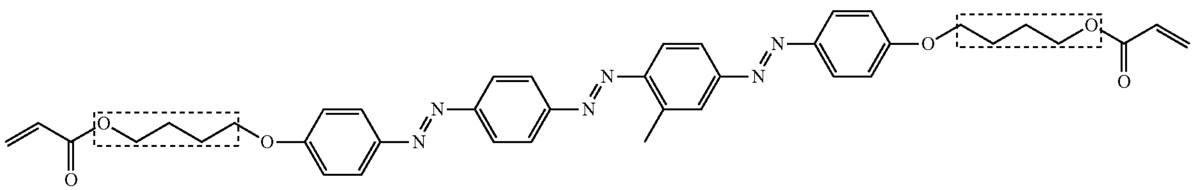

D10

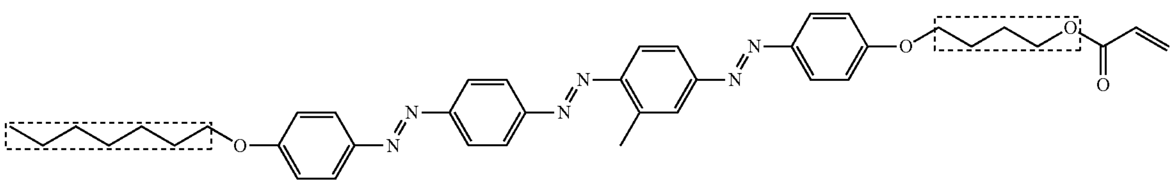

$L_1$ and $L_2$ may have a branched chain.

Here, in a case where A is present in Formula (6), "branched chain" of $L_1$ denotes a portion other than a portion required for directly linking "A" with the "0" atom linked to $L_1$ in Formula (6). Similarly, in a case where B is present in Formula (6), "branched chain" of $L_2$ denotes a portion other than a portion required for directly linking "B" with the "0" atom linked to $L_2$ in Formula (6).

Further, in a case where A is not present in Formula (6), "branched chain" of $L_1$ denotes a portion other than the longest atomic chain (that is, the main chain) extending from the "0" atom linked to $L_1$ in Formula (6) which is the starting point. Similarly, in a case where B is not present in Formula (6), "branched chain" of $L_2$ denotes a portion other than the longest atomic chain (that is, the main chain) extending from the "0" atom linked to $L_2$ in Formula (6) which is a starting point.

The number of atoms in the branched chain is preferably 3 or less. In a case where the number of atoms in the branched chain is set to 3 or less, there is an advantage that the alignment degree of the light absorption anisotropic layer is further improved. Further, the number of atoms in the branched chain does not include the number of hydrogen atoms.

The divalent aromatic hydrocarbon group represented by $Ar_1$ to $Ar_3$ may be monocyclic or may have a bicyclic or higher cyclic fused ring structure. From the viewpoint of further improving the solubility, the number of rings of the divalent aromatic hydrocarbon group is preferably 1 to 4, more preferably 1 or 2, and still more preferably 1 (that is, a phenylene group).

Specific examples of the divalent aromatic hydrocarbon group include a phenylene group, an azulene-diyl group, a naphthylene group, a fluorene-diyl group, an anthracene-diyl group, and a tetracene-diyl group. From the viewpoints of further improving the solubility, a phenylene group or a naphthylene group is preferable, and a phenylene group is more preferable.

Specific examples of the third dichroic azo coloring agent compound are shown below, but the present invention is not limited thereto. In the following specific examples, n represents an integer of 1 to 10.

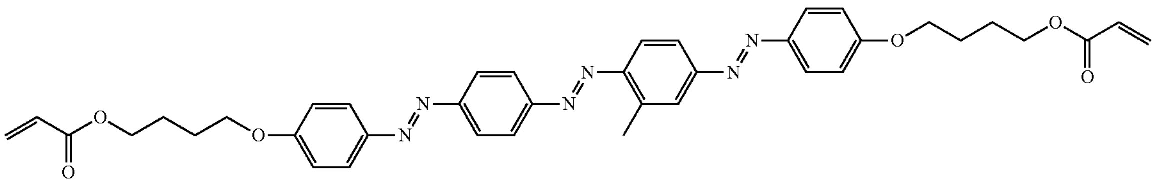
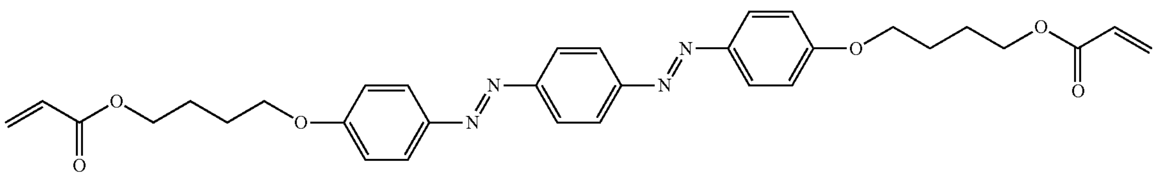
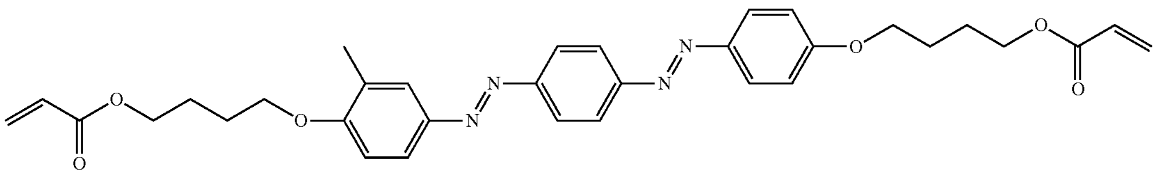
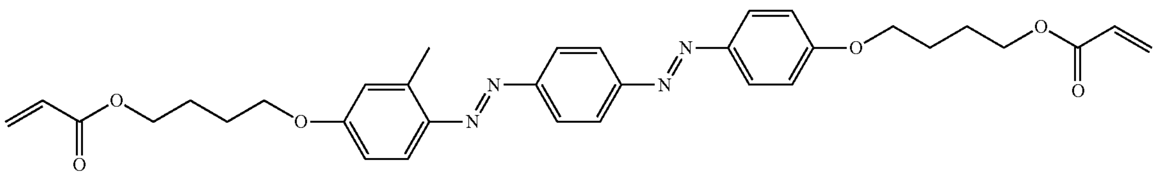
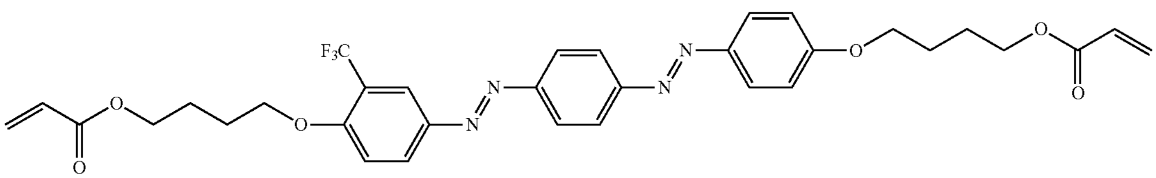
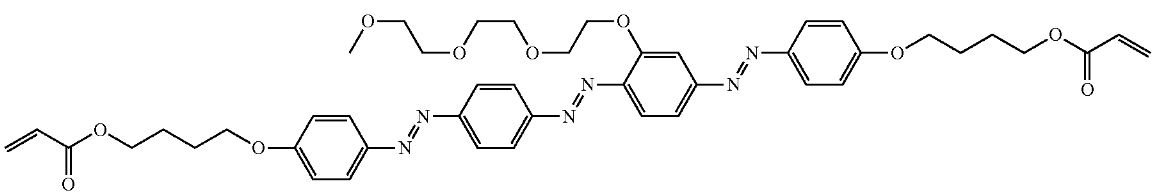
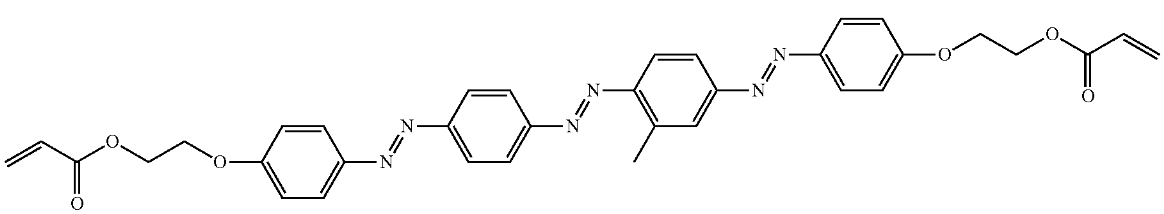
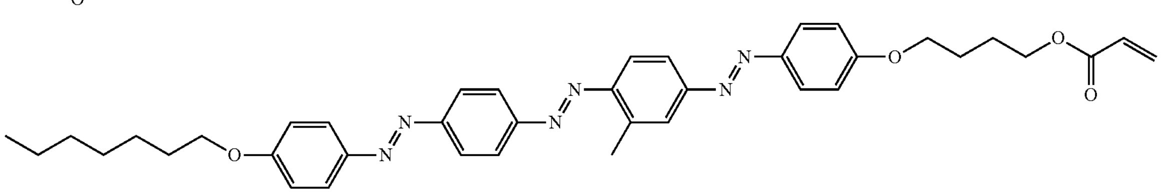
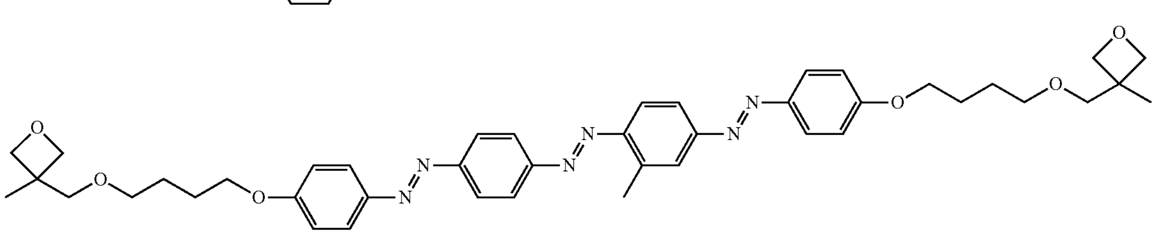

-continued
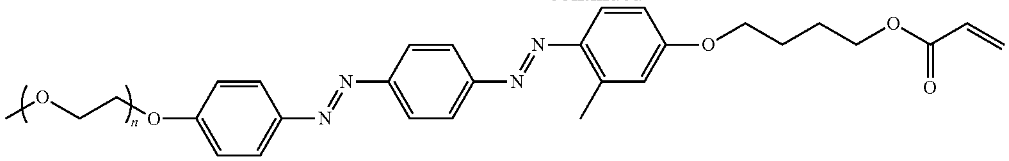
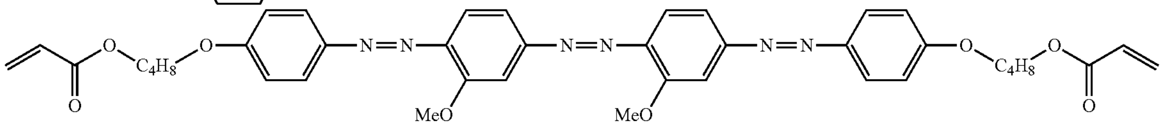
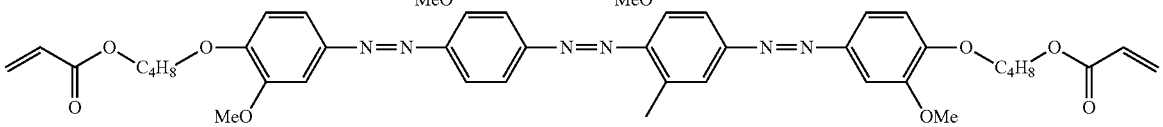
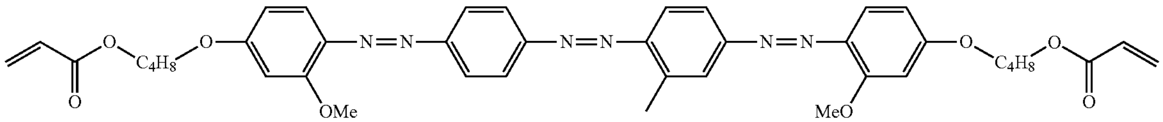
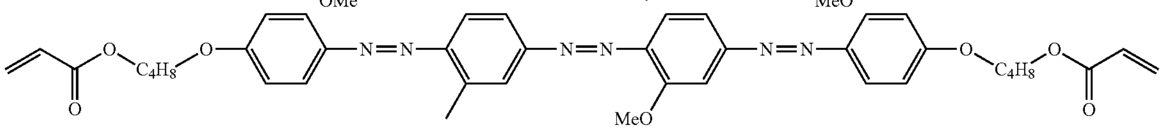
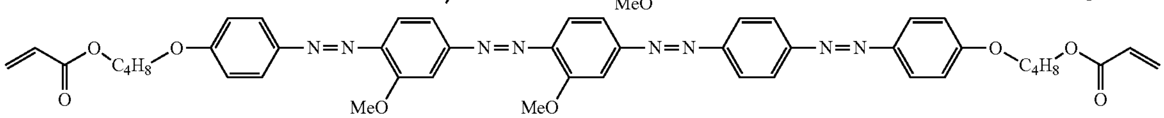
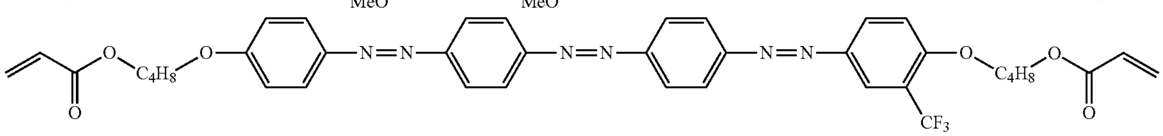
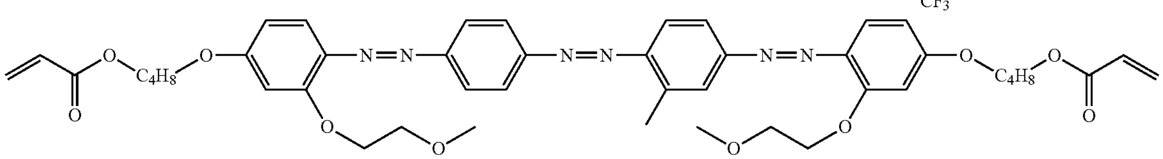
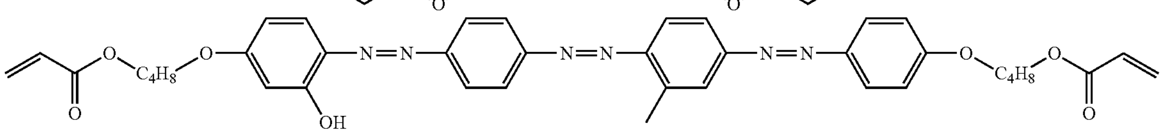
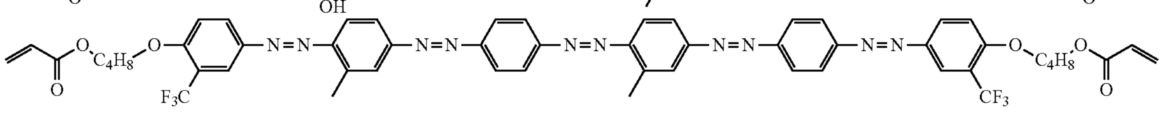
From the viewpoint that the alignment degree at 420 nm is excellent, a structure in which the third dichroic azo coloring agent compound does not contain a radically polymerizable group is preferable. Examples thereof include the following structures.
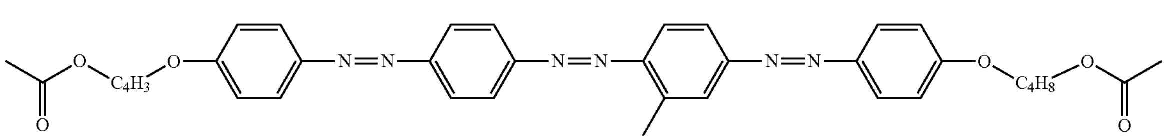
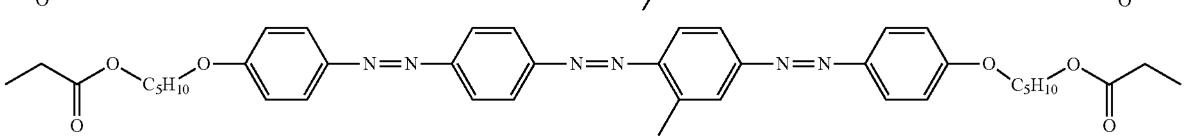

-continued

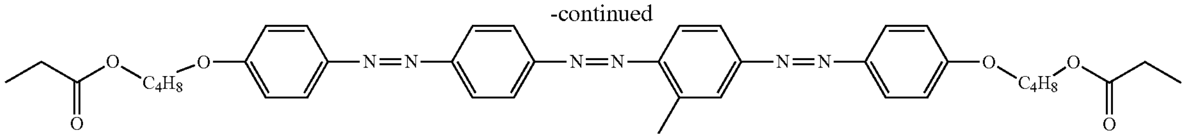

From the viewpoint that the alignment degree at a wavelength of 420 nm is particularly excellent, it is more preferable that the third dichroic azo coloring agent compound is a dichroic substance having a structure represented by Formula (1-1).

(1-1)

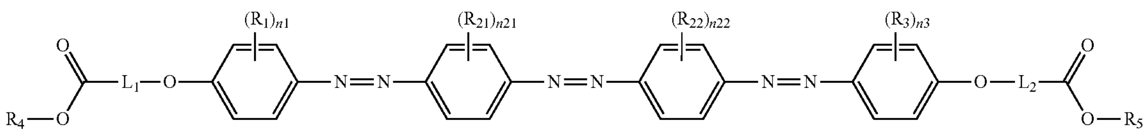

In Formula (1-1), $R_1$, $R_3$, $R_4$, $R_5$, n1, n3, $L_1$, and $L_2$ each have the same definition as that for $R_1$, $R_3$, $R_4$, $R_5$, n1, n3, $L_1$, and $L_2$ of Formula (1).

In Formula (1-1), $R_{21}$ and $R_{22}$ each independently have the same definition as that for $R^2$ in Formula (1).

In Formula (1-1), n21 and n22 each independently have the same definition as that for n2 in Formula (1).

An expression of "n1+n21+n22+n3≥1" is satisfied, and "n1+n21+n22+n3" is preferably in a range of 1 to 9 and more preferably in a range of 1 to 5.

Specific examples of the specific dichroic substance will be described below, but the present invention is not limited thereto.

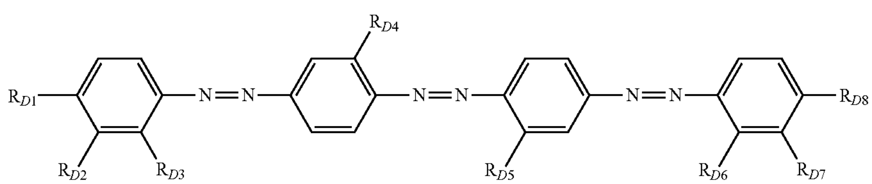

| No | $R_{D1}$ | $R_{D2}$ | $R_{D3}$ | $R_{D4}$ | $R_{D5}$ | $R_{D6}$ | $R_{D7}$ | $R_{D8}$ |
|---|---|---|---|---|---|---|---|---|
| D1 | $OC_4H_8C(O)OCH_2CH_3$ | H | H | H | $CH_3$ | H | H | $OC_4H_8C(O)OCH_2CH_3$ |
| D2 | $OC_4H_8C(O)OCH_3$ | H | H | H | $CH_3$ | H | H | $OC_4H_8C(O)OCH_3$ |
| D3 | $OC_4H_8C(O)OCH_2CH_3$ | H | H | H | $CH_3$ | H | H | $OC_{11}H_{23}$ |
| D4 | $OC_4H_8C(O)OCH_2CH_3$ | H | H | H | $CH_3$ | H | H | $OC_5H_{11}$ |
| D5 | $OC_4H_8C(O)OCH_2CH_3$ | H | H | H | $CH_3$ | H | H | $OCH_2CH_3$ |
| D6 | $OC_4H_8C(O)OCH_2CH_3$ | H | H | H | $CH_3$ | H | Cl | $OC_4H_8C(O)OCH_2CH_3$ |
| D7 | $OC_3H_6C(O)OCH_2CH_3$ | H | H | H | $CH_3$ | H | H | $OC_3H_6C(O)OCH_2CH_3$ |
| D8 | $OC_3H_6C(O)OCH_2CH_3$ | H | H | Cl | H | Cl | H | $OC_3H_6C(O)OCH_2CH_3$ |
| D9 | $OC_9H_{18}C(O)OCH_2CH_3$ | H | H | H | $CH_3$ | H | H | $OC_9H_{18}C(O)OCH_2CH_3$ |
| D10 | $OC_4H_8C(O)OCH_2CH{=}CH_2$ | H | H | H | $CH_3$ | H | H | $OC_4H_8C(O)OCH_2CH{=}CH_2$ |
| D11 | $OC_4H_8C(O)OCH_2CH_3$ | H | H | H | Cl | H | H | $OC_4H_8C(O)OCH_2CH_3$ |
| D12 | $OC_6H_4C(O)OCH_2CH_3$ | H | H | H | $CH_3$ | H | H | $OC_6H_4C(O)OCH_2CH_3$ |

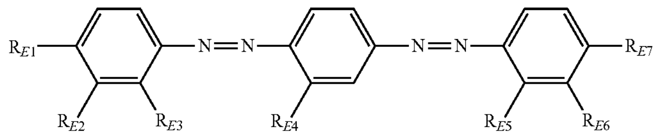

| No | $R_{E1}$ | $R_{E2}$ | $R_{E3}$ | $R_{E4}$ | $R_{E5}$ | $R_{E6}$ | $R_{E7}$ |
|---|---|---|---|---|---|---|---|
| E1 | $OC_4H_8C(O)OCH_2CH_3$ | H | H | H | H | H | $OC_4H_8C(O)OCH_2CH_3$ |
| E2 | $OC_4H_8C(O)OCH_3$ | H | H | H | H | H | $OC_4H_8C(O)OCH_3$ |
| E3 | $OC_4H_8C(O)OCH_2CH_3$ | Cl | H | H | H | Cl | $OC_4H_8C(O)OCH_2CH_3$ |
| E4 | $OC_4H_8C(O)OCH_2CH_3$ | H | H | H | H | Cl | $OC_5H_{11}$ |
| E5 | $OC_4H_8C(O)OCH_2CH_3$ | H | H | $CH_3$ | H | H | $OCH_2CH_3$ |
| E6 | $OC_3H_6C(O)OCH_2CH_3$ | H | H | H | H | H | $OC_3H_6C(O)OCH_2CH_3$ |
| E7 | $OC_9H_{18}C(O)OCH_2CH_3$ | H | H | H | H | H | $OC_9H_{18}C(O)OCH_2CH_3$ |
| E8 | $OC_4H_8C(O)OCH_2CH{=}CH_2$ | H | H | H | H | H | $OC_4H_8C(O)OCH_2CH{=}CH_2$ |

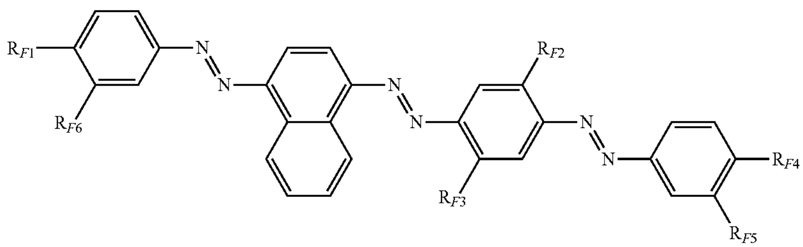

| No | $R_{F1}$ | $R_{F2}$ | $R_{F3}$ | $R_{F4}$ | $R_{F5}$ | $R_{F6}$ |
|---|---|---|---|---|---|---|
| F1 | $OC_4H_8C(O)OCH_2CH_3$ | H | H | $OC_4H_8C(O)OCH_2CH_3$ | H | H |
| F2 | $OC_4H_8C(O)OCH_2CH_3$ | H | $CH_3$ | $OC_4H_8C(O)OCH_3$ | H | H |
| F3 | $OC_3H_6C(O)OCH_2CH_3$ | H | H | $OC_3H_5C(O)OCH_2CH_3$ | H | Cl |

(Content of Dichroic Substance)

The content of the dichroic substance is preferably in a range of 5% to 30% by mass, more preferably in a range of 15% to 28% by mass, and still more preferably in a range of 20% to 30% by mass with respect to the total mass of the solid content of the light absorption anisotropic layer. In a case where the content of the dichroic substance is in the above-described ranges, a light absorption anisotropic layer having a high alignment degree can be obtained even in a case where the light absorption anisotropic layer is formed into a thin film. Therefore, a light absorption anisotropic layer having excellent flexibility is likely to be obtained. Further, in a case where the content thereof is greater than 30% by mass, internal reflection due to an increase in the refractive index is difficult to suppress.

From the viewpoint of increasing the contrast between the illuminance at the center of the viewing angle and the illuminance in a direction deviated from the center of the viewing angle, the content of the dichroic substance per unit area is preferably 0.2 $g/m^2$ or greater, more preferably 0.3 $g/m^2$ or greater, and still more preferably 0.5 $g/m^2$ or greater. The upper limit thereof is not particularly limited, but is typically 1.0 $g/m^2$ or less in many cases.

The content of the first dichroic azo coloring agent compound is preferably in a range of 40 to 90 parts by mass and more preferably in a range of 45 to 75 parts by mass with respect to 100 parts by mass of the total content of the dichroic substance in the composition for forming a light absorption anisotropic layer.

The content of the second dichroic azo coloring agent compound is preferably in a range of 6 to 50 parts by mass and more preferably in a range of 8 to 35 parts by mass with respect to 100 parts by mass of the total content of the dichroic substance in the composition for forming a light absorption anisotropic layer.

The content of the third dichroic azo coloring agent compound is preferably in a range of 3 to 35 parts by mass and more preferably in a range of 5 to 30 parts by mass with respect to 100 parts by mass of the content of the dichroic azo coloring agent compound in the composition for forming a light absorption anisotropic layer.

The content ratio between the first dichroic azo coloring agent compound, the second dichroic azo coloring agent compound, and the third dichroic azo coloring agent compound used as necessary can be optionally set in order to adjust the tint of the light absorption anisotropic layer. Here, the content ratio of the second dichroic azo coloring agent compound to the first dichroic azo coloring agent compound (second dichroic azo coloring agent compound/first dichroic azo coloring agent compound) is preferably in a range of 0.1 to 10, more preferably in a range of 0.2 to 5, and particularly preferably in a range of 0.3 to 0.8 in terms of moles. In a case where the content ratio of the second dichroic azo coloring agent compound to the first dichroic azo coloring agent compound is in the above-described ranges, the alignment degree is increased.

The light absorption anisotropic layer of the present invention can be formed of, for example, a composition for forming a light absorption anisotropic layer containing the above-described organic dichroic substance.

The composition for forming a light absorption anisotropic layer may contain components other than the organic dichroic substance, and examples thereof include a liquid crystal compound, a solvent, a vertical alignment agent, a polymerizable component, a polymerization initiator (for example, a radical polymerization initiator), and a leveling agent. In this case, the light absorption anisotropic layer according to the embodiment of the present invention contains a solid component other than a liquid component (such as a solvent).

Further, the first alignment layer of the present invention can be formed in the same manner as that for the light absorption anisotropic layer by using a composition obtained by removing the dichroic substance from the composition for forming the light absorption anisotropic layer.

(Polymerizable Component)

Examples of the polymerizable component include a compound containing an acrylate (such as an acrylate monomer). In this case, the light absorption anisotropic layer according to the embodiment of the present invention contains a polyacrylate obtained by polymerizing the compound containing an acrylate.

Examples of the polymerizable component include the compounds described in paragraph 0058 of JP2017-122776A.

In a case where the composition for forming a light absorption anisotropic layer contains a polymerizable component, the content of the polymerizable component is preferably in a range of 3 to 20 parts by mass with respect to 100 parts by mass of the total amount of the organic dichroic substance and the liquid crystal compound in the composition for forming a light absorption anisotropic layer.

(Vertical Alignment Agent)

In the present invention, the composition may contain a vertical alignment agent as necessary. Examples of the vertical alignment agent include a boronic acid compound and an onium salt.

As the boronic acid compound, a compound represented by Formula (30) is preferable.

Formula (30)

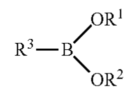

In Formula (30), $R^1$ and $R^2$ each independently represent a hydrogen atom, a substituted or unsubstituted aliphatic hydrocarbon group, a substituted or unsubstituted aryl group, or a substituted or unsubstituted heterocyclic group.

$R^3$ represents a substituent containing a (meth)acryl group.

Specific examples of the boronic acid compound include a boronic acid compound represented by General Formula (I) described in paragraphs [0023] to [0032] of JP2008-225281A.

As the boronic acid compound, compounds shown below are also preferable.

I-34)

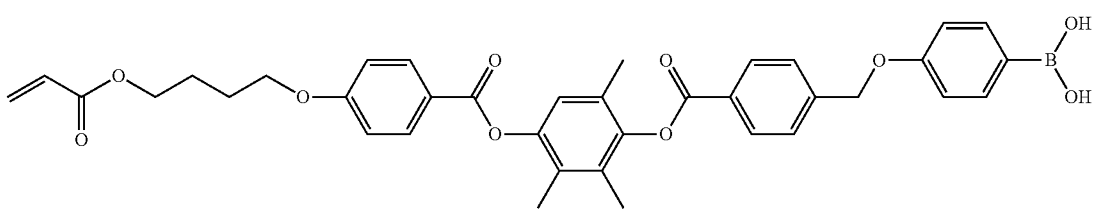

I-35)

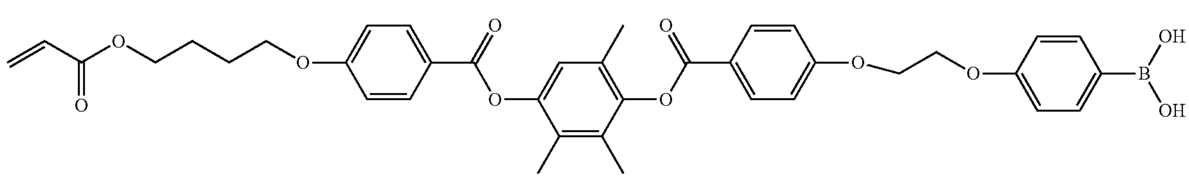

I-36)

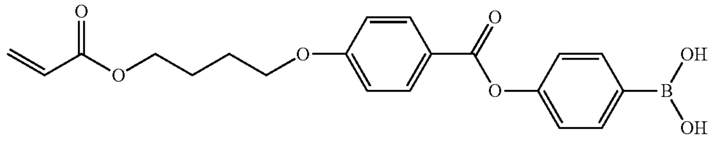

As the onium salt, a compound represented by Formula (31) is preferable.

Formula (31)

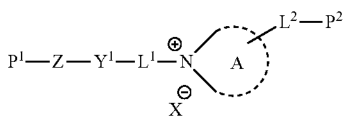

In Formula (31), the ring A represents a quaternary ammonium ion consisting of a nitrogen-containing heterocyclic ring. X represents an anion. $L^1$ represents a divalent linking group. $L^2$ represents a single bond or a divalent linking group. $Y^1$ represents a divalent linking group having a 5- or 6-membered ring as a partial structure. Further, Z represents a divalent linking group containing an alkylene group having 2 to 20 carbon atoms as a partial structure. Further, $P^1$ and $P^2$ each independently represent a monovalent substituent having a polymerizable ethylenically unsaturated bond.

Specific examples of the onium salt include the onium salts described in paragraphs 0052 to 0058 of JP2012-208397A, the onium salts described in paragraphs 0024 to 0055 of JP2008-026730A, and the onium salts described in JP2002-37777A.

The content of the vertical alignment agent in the composition is preferably in a range of 0.1% to 400% by mass and more preferably in a range of 0.5% to 350% by mass with respect to the total mass of the liquid crystal compound.

The vertical alignment agent may be used alone or in combination of two or more kinds thereof. In a case where two or more kinds of vertical alignment agents are used, the total amount thereof is preferably in the above-described ranges.

(Leveling Agent)

It is preferable that the composition contains a leveling agent described below. In a case where the composition contains a leveling agent, surface roughness due to dry air applied to the surface of the light absorption anisotropic layer is suppressed, and the dichroic substance is more uniformly aligned in the light absorption anisotropic layer.

The leveling agent can also be used as a so-called surfactant.

The leveling agent is not particularly limited, and a leveling agent having a fluorine atom (fluorine-based leveling agent) or a leveling agent having a silicon atom (silicon-based leveling agent) is preferable, and a fluorine-based leveling agent is more preferable.

Examples of the fluorine-based leveling agent include fatty acid esters of polyvalent carboxylic acids in which a part of a fatty acid is substituted with a fluoroalkyl group and polyacrylates having a fluoro substituent. Particularly in a case where a rod-like compound is used as the dichroic substance and the liquid crystal compound, a leveling agent having a repeating unit derived from a compound represented by Formula (40) is preferable from the viewpoint of promoting the vertical alignment of the dichroic substance and the liquid crystal compound.

Formula (40)

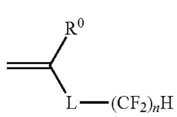

$R^0$ represents a hydrogen atom, a halogen atom, or a methyl group.

L represents a divalent linking group. It is preferable that L represents an alkylene group having 2 to 16 carbon atoms, and optional —$CH_2$— that is not adjacent to the alkylene group may be substituted with —O—, —COO—, —CO—, or —CONH—.

n represents an integer of 1 to 18.

The leveling agent having a repeating unit derived from a compound represented by Formula (40) may further have other repeating units.

Examples of the other repeating units include a repeating unit derived from a compound represented by Formula (41).

Formula (41)

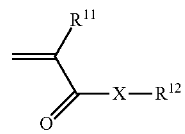

$R^{11}$ represents a hydrogen atom, a halogen atom, or a methyl group.

X represents an oxygen atom, a sulfur atom, or —$N(R^{13})$—. $R^{13}$ represents a hydrogen atom or an alkyl group having 1 to 8 carbon atoms.

$R^{12}$ represents a hydrogen atom, an alkyl group which may have a substituent, or an aromatic group which may have a substituent. Further, the number of carbon atoms of the alkyl group is preferably in a range of 1 to 20. The alkyl group may be any of linear, branched, or cyclic.

Further, examples of the substituent that the alkyl group may have include a poly(alkyleneoxy) group and a polymerizable group. The definition of the polymerizable group is as described above.

In a case where the leveling agent has a repeating unit derived from a compound represented by Formula (40) and a repeating unit derived from a compound represented by Formula (41), the content of the repeating unit derived from the compound represented by Formula (40) is preferably in a range of 10% to 90% by mole and more preferably in a range of 15% to 95% by mole with respect to all the repeating units of the leveling agent.

In the case where the leveling agent has a repeating unit derived from a compound represented by Formula (40) and a repeating unit derived from a compound represented by Formula (41), the content of the repeating unit derived from the compound represented by Formula (41) is preferably in a range of 10% to 90% by mole and more preferably in a range of 5% to 85% by mole with respect to all the repeating units of the leveling agent.

Further, examples of the leveling agent include a leveling agent having a repeating unit derived from a compound represented by Formula (42) in place of the repeating unit derived from a compound represented by Formula (40).

Formula (42)

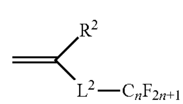

$R^2$ represents a hydrogen atom, a halogen atom, or a methyl group.

$L^2$ represents a divalent linking group.

n represents an integer of 1 to 18.

Specific examples of the leveling agent include the compounds described in paragraphs 0046 to 0052 of JP2004-331812A and the compounds described in paragraphs 0038 to 0052 of JP2008-257205A.

The content of the leveling agent in the composition is preferably in a range of 0.001% to 10% by mass and more preferably in a range of 0.01% to 5% by mass with respect to the total mass of the liquid crystal compound.

The leveling agent may be used alone or in combination of two or more kinds thereof. In a case where two or more leveling agents are used, it is preferable that the total amount thereof is in the above-described ranges.

(Polymerization Initiator)

It is preferable that the composition for forming a light absorption anisotropic layer contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-27384A), and acylphosphine oxide compounds (JP1988-40799B (JP-S63-40799B), JP1993-29234B (JP-H5-29234B), JP1998-95788A (JP-H10-95788A), and JP1998-29997A (JP-H10-29997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02 (all manufactured by BASF SE).

In a case where the composition for forming a light absorption anisotropic layer contains a polymerization initiator, the content of the polymerization initiator is preferably in a range of 0.01 to 30 parts by mass and more preferably in a range of 0.1 to 15 parts by mass with respect to 100 parts by mass of the total amount of the dichroic substance and the polymer liquid crystal compound in the composition for forming a light absorption anisotropic layer. The durability of the light absorption anisotropic film is enhanced in a case where the content of the polymerization initiator is 0.01 parts by mass or greater, and the alignment degree of the light absorption anisotropic film is enhanced in a case where the content thereof is 30 parts by mass or less.

The polymerization initiator may be used alone or in combination of two or more kinds thereof. In a case where the composition contains two or more kinds of polymerization initiators, it is preferable that the total amount of the polymerization initiators is in the above-described ranges.

(Solvent)

From the viewpoints of the workability and the like, it is preferable that the composition for forming a light absorption anisotropic layer used in the present invention contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tetrahydropyran, and dioxolane), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, N-ethylpyrrolidone, and 1,3-dimethyl-2-imidazolidinone), and heterocyclic compounds (such as pyridine and N-methylimidazole), and water. These solvents may be used alone or in combination of two or more kinds thereof.

Among these solvents, from the viewpoint of exhibiting the effect of the excellent solubility, ketones (particularly cyclopentanone and cyclohexanone), ethers (particularly tetrahydrofuran, cyclopentyl methyl ether, tetrahydropyran, and dioxolane), and amides (particularly dimethylformamide, dimethylacetamide, N-methylpyrrolidone, and N-ethylpyrrolidone) are preferable.

In a case where the composition for forming a light absorption anisotropic layer contains a solvent, the content of the solvent is preferably in a range of 80% to 99% by mass, more preferably in a range of 83% to 97% by mass, and particularly preferably in a range of 85% to 95% by mass with respect to the total mass of the composition for forming a light absorption anisotropic layer.

These solvents may be used alone or in combination of two or more kinds thereof. In a case where the composition contains two or more kinds of solvents, it is preferable that the total amount of the solvents is in the above-described range.

The light absorption anisotropic film of the present invention may include only the light absorption anisotropic layer and the first alignment layer or may be a laminate having other layers as necessary.

For example, the light absorption anisotropic film according to the embodiment of the present invention includes the second alignment layer as a preferable embodiment in addition to the light absorption anisotropic layer 2 and the first alignment layer 3, and further Includes the barrier layer 1 and the TAC film 5 as illustrated in FIG. 2.

[Support]

The light absorption anisotropic film according to the embodiment of the present invention may include a support for supporting the light absorption anisotropic film. In the light absorption anisotropic film 101 illustrated in FIG. 2, the TAC film 5 is a support.

It is preferable that the support is disposed such that the surface thereof is on a side opposite to the air layer. Further, in a case where the light absorption anisotropic film includes a protective layer for protecting the light absorption anisotropic layer, it is preferable that the support is disposed on a surface opposite to a side where the protective layer is provided.

As the support, known transparent resin films, transparent resin plates, transparent resin sheets, and the like can be used without particular limitation. Examples of the transparent resin film include a cellulose acylate film (such as a cellulose triacetate film (refractive index of 1.48), a cellulose diacetate film, a cellulose acetate butyrate film, or a cellulose acetate propionate film), a polyethylene terephthalate film, a polyether sulfone film, a polyacrylic resin film, a polyurethane-based resin film, a polyester film, a polycarbonate film, a polysulfone film, a polyether film, a polymethylpentene film, a polyether ketone film, and a (meth)acrylonitrile film.

Among these, a cellulose acylate film which is highly transparent, has a small optical birefringence, is easily produced, and is typically used as a protective film of a polarizing plate is preferable, and a cellulose triacetate film is particularly preferable.

The thickness of the support is typically in a range of 20 μm to 100 μm.

In the present invention, it is particularly preferable that the support is a cellulose ester-based film having a film thickness 20 to 70 μm.

[Protective Layer]

It is also preferable that the light absorption anisotropic film according to the embodiment of the present invention includes a protective layer for protecting the light absorption anisotropic layer. As the protective layer, various known layers (films) can be used as long as the light absorption anisotropic layer can be protected, and suitable examples thereof include a barrier layer.

The light absorption anisotropic film illustrated in FIG. 2 includes the barrier layer 1 on the surface of the light absorption anisotropic layer 2 (on a side opposite to the support).

Here, the barrier layer is also referred to as a gas-shielding layer (oxygen-shielding layer) and has a function of protecting the polarizer of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Refractive Index Adjusting Layer]

In the laminate of the present invention, the above-described light absorption anisotropic layer contains a dichroic substance, and internal reflection due to a high refractive index of the light absorption anisotropic layer may be a problem.

In that case, it is preferable that the refractive index adjusting layer is present. The refractive index adjusting layer is a layer disposed in contact with the light absorption anisotropic layer and has an in-plane average refractive index of 1.55 or greater and 1.70 or less at a wavelength of 550 nm. It is preferable that the refractive index adjusting layer is a refractive index adjusting layer for performing so-called index matching.

<Other Layers>

In addition to the above-described layers, the light absorption anisotropic film according to the embodiment of the present invention may include layers (films and membranes) exhibiting various functions, such as a retardation layer, an antireflection layer, and various filters, as necessary.

Further, the light absorption anisotropic film according to the embodiment of the present invention is not limited to, for example, the configuration illustrated in FIG. 2 and can be configured to have various layers as long as the configuration has a light absorption anisotropic layer.

For example, the light absorption anisotropic film according to the embodiment of the present invention may be formed of only the light absorption anisotropic layer and the first alignment layer, may be formed of the light absorption anisotropic layer, the first alignment layer, and the second alignment layer, or may be formed of the light absorption anisotropic layer, the first alignment layer, and the barrier layer.

<Method of Forming Light Absorption Anisotropic Layer>

A method of forming the light absorption anisotropic layer is not particularly limited, and examples thereof include a method of sequentially performing a step of applying the above-described composition for forming a light absorption anisotropic layer to form a coating film (hereinafter, also referred to as "coating film forming step") and a step of aligning the liquid crystal compound and the dichroic substance contained in the coating film (hereinafter, also referred to as "aligning step").

Further, the liquid crystal component is a component that also contains an organic dichroic substance having liquid crystallinity in a case where the above-described organic dichroic substance has liquid crystallinity, in addition to the above-described liquid crystal compound.

Further, the first alignment layer can be formed in the same manner as that for the light absorption anisotropic layer by using a composition obtained by removing the organic dichroic substance from the composition for forming the light absorption anisotropic layer as described above.

(Coating Film Forming Step)

The coating film forming step is a step of applying a composition for forming a light absorption anisotropic layer to form a coating film.

The composition for forming a light absorption anisotropic layer can be easily applied by using the composition for forming a light absorption anisotropic layer which contains the above-described solvent or using a liquid such as a melt obtained by heating the composition for forming a light absorption anisotropic layer.

Specific examples of the method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Aligning Step)

The aligning step is a step of aligning the liquid crystal component contained in the coating film. In this manner, a light absorption anisotropic layer is obtained.

The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystal components contained in the composition for forming a light absorption anisotropic layer may be aligned by the coating film forming step or the drying treatment described above. For example, in an embodiment in which the composition for forming a light absorption anisotropic layer is prepared as a coating solution containing a solvent, a coating film having light absorption anisotropy (that is, a light absorption anisotropic film) is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal components contained in the coating film can be fixed. The cooling means is not particularly limited and can be performed according to a known method.

The light absorption anisotropic film can be obtained by performing the above-described steps.

Further, in the description above, examples of the aligning step, that is, a method of aligning the liquid crystal components contained in the coating film include a drying treatment and a heat treatment, but the aligning step is not limited thereto, and known alignment treatments can be used.

(Other Steps)

The method of forming the light absorption anisotropic layer may include a step of curing the light absorption anisotropic layer after the aligning step (hereinafter, also referred to as "curing step").

The curing step is performed by heating the light absorption anisotropic layer and/or irradiating the layer with light (exposing the layer to light), for example, in a case where the light absorption anisotropic layer contains a crosslinkable group (polymerizable group). Between these, it is preferable that the curing step is performed by irradiating the layer with light.

Various kinds of light (electromagnetic wave) such as infrared rays, visible light, and ultraviolet rays can be used as the light for curing, but ultraviolet rays are preferable. The curing may be carried out by using a light source that emits light having a specific wavelength (wavelength range) or irradiating the layer with transmitted light through a filter that transmits only light having a specific wavelength (wavelength range) as the above-described light.

Further, the curing may be carried out by irradiating the layer with ultraviolet rays or the like while heating the layer.

In a case where the curing is performed while the layer is heated by being irradiated with light, the heating temperature during the irradiation with light depends on the transition temperature of the liquid crystal component contained in the liquid crystal film to a liquid crystal phase, but is preferably in a range of 25° to 140° C.

Further, the irradiation with light may be performed in a nitrogen atmosphere. In a case where the curing of the liquid crystal film proceeds by radical polymerization, from the viewpoint of reducing inhibition of polymerization by oxygen, it is preferable that the irradiation with light is performed in a nitrogen atmosphere.

The thickness of the light absorption anisotropic layer is not particularly limited, but is preferably in a range of 100 to 8000 nm and more preferably in a range of 300 to 5000 nm from the viewpoint of reducing the size and the weight.

[Patterning of Light Absorption Anisotropic Layer]

The light absorption anisotropic layer of the light absorption anisotropic film according to the embodiment of the present invention may be a light absorption anisotropic layer which has a region A and a region B in the plane and has different transmittance central axes in each region. In a case where light emitting pixels are controlled by patterning each liquid crystal pixel, the center of the visual field in a narrow visual field can be switched.

Further, the light absorption anisotropic layer used in the present invention can be a light absorption anisotropic layer which has a region C and a region D in the plane and has different transmittances at an angle inclined by 30° with respect to the normal direction from the transmittance central axis in the plane provided with the transmittance central axis and the normal line of the film surface in the region C and the region D. In this case, it is preferable that the light absorption anisotropic layer is a light absorption anisotropic layer in which the transmittance at an angle inclined by 30° with respect to the normal direction from the transmittance central axis of the region C is 50% or less and the transmittance at an angle inclined by 30° with respect to the normal direction from the transmittance central axis of the region D is 80% or greater.

The viewing angle dependence in some regions can be strengthened or weakened by performing the patterning. In this manner, highly confidential information can also be displayed only in the region where the viewing angle dependence is strengthened. Further, design with excellent designability can be carried out by controlling the viewing angle dependence as a display device for each display position. Further, in a case where the light emitting pixels are controlled by performing patterning for each pixel of the liquid crystal, it is possible to switch between a narrow viewing angle and a wide viewing angle.

In the description below, the light absorption anisotropic layer having two or more different regions in a plane as described above will also be referred to as "patterned light absorption anisotropic layer" for convenience.

[Pattern Forming Method]

As described above, the method of forming the patterned light absorption anisotropic layer having two or more different regions in the plane is not limited, and various known methods as described in, for example, WO2019/176918A can be used. Examples thereof include a method of forming a pattern by changing the irradiation angle of ultraviolet rays to be applied to a photo-alignment film, a method of controlling the thickness of a patterned light absorption anisotropic layer in the plane, a method of unevenly distributing a dichroic substance compound in a patterned light absorption anisotropic layer, and a method of post-processing an optically uniform patterned light absorption anisotropic layer.

Examples of the method of controlling the thickness of the patterned light absorption anisotropic layer in a plane include a method of using lithography, a method of using imprinting, and a method of forming a patterned light absorption anisotropic layer on a base material having an uneven structure.

Examples of the method of unevenly distributing a dichroic substance compound in the patterned light absorption anisotropic layer include a method of extracting a dichroic substance by solvent immersion (bleaching).

Further, examples of the method of post-processing an optically uniform patterned light absorption anisotropic layer include a method of cutting a part of a flat light absorption anisotropic layer by laser processing or the like.

The viewing angle control system according to the embodiment of the present invention includes the above-described light absorption anisotropic film according to the embodiment of the present invention and a polarizer.

[Polarizer]

The polarizer used in the viewing angle control system according to the embodiment of the present invention is not particularly limited as long as the polarizer is a member having a function of converting light into specific linearly polarized light, and a known polarizer can be used.

As the polarizer, an iodine-based polarizer, a dye-based polarizer formed of a dichroic dye, a polyene-based polarizer, or the like is used.

Examples of the iodine-based polarizer and the dye-based polarizer include a coating type polarizer and a stretching type polarizer, and both polarizers can be applied. A polarizer in which a dichroic organic coloring agent is aligned by using alignment of the liquid crystal compound is preferable as the coating type polarizer, and a polarizer prepared by adsorbing iodine or a dichroic dye on polyvinyl alcohol and stretching the polyvinyl alcohol is preferable as the stretching type polarizer.

Further, examples of the method of obtaining a polarizer by stretching and dyeing a laminated film in which a polyvinyl alcohol layer is formed on a base material include methods described in JP5048120B, JP5143918B, JP4691205B, JP4751481B, and JP4751486B, and known techniques relating to these polarizers can also be preferably used.

Among these, from the viewpoints of the availability and the excellent degree of polarization, a polarizer containing a polyvinyl alcohol-based resin (a polymer having $—CH_2—CHOH—$ as a repeating unit, particularly at least one selected from the group consisting of polyvinyl alcohol and ethylene-vinyl alcohol copolymers) is preferable.

In the present invention, the thickness of the polarizer is not particularly limited, but is preferably in a range of 3 μm to 60 μm, more preferably in a range of 5 μm to 20 μm, and still more preferably in a range of 5 μm to 10 μm.

The light absorption anisotropic film and the polarizer in the viewing angle control system according to the embodiment of the present invention may be laminated via a bonding agent such as a pressure sensitive adhesive or an adhesive, or the polarizer may be directly coated with the first alignment layer and the light absorption anisotropic layer so that the layers are laminated on the polarizer.

[Pressure Sensitive Adhesive Layer]

It is preferable that the pressure sensitive adhesive layer in the present invention is a transparent and optically isotropic pressure sensitive adhesive similar to that used in a typical image display device, and a pressure sensitive type adhesive is typically used.

The pressure sensitive adhesive layer of the present invention may be blended with appropriate additives such as a crosslinking agent (such as an isocyanate-based crosslinking agent or an epoxy-based crosslinking agent), a viscosity imparting agent (such as a rosin derivative resin, a polyterpene resin, a petroleum resin, or an oil-soluble phenol resin), a plasticizer, a filler, an antiaging agent, a surfactant, an ultraviolet absorbing agent, a light stabilizer, and an antioxidant in addition to a parent material (pressure sensitive adhesive).

The thickness of the pressure sensitive adhesive layer is typically in a range of 20 to 500 μm and preferably in a range of 20 to 250 μm. The required adhesive strength or rework suitability may not be obtained in a case where the thickness thereof is less than 20 μm, and the pressure sensitive adhesive may protrude or bleed out from the peripheral end portion of the image display device in a case where the thickness thereof is greater than 500 μm.

[Adhesive Layer]

The adhesive exhibits adhesiveness due to drying and/or a reaction after bonding.

A polyvinyl alcohol-based adhesive (PVA-based adhesive) exhibits adhesiveness due to drying and is capable of bonding materials to each other.

Specific examples of the curable adhesive that exhibits adhesiveness due to a reaction include an active energy ray-curable adhesive such as a (meth) acrylate-based adhesive and a cationic polymerization curable adhesive.

Examples of the curable component in the (meth)acrylate-based adhesive include a compound containing a (meth) acryloyl group and a compound containing a vinyl group. Further, as the cationic polymerization curable adhesive, a compound containing an epoxy group or an oxetanyl group can also be used. The compound containing an epoxy group is not particularly limited as long as the compound contains at least two epoxy groups in a molecule, and various generally known curable epoxy compounds can be used. Preferred examples of the epoxy compound include a compound (aromatic epoxy compound) containing at least two epoxy groups and at least one aromatic ring in a molecule and a compound (alicyclic epoxy compound) containing at least two epoxy groups in a molecule, in which at least one of the epoxy groups is formed between two adjacent carbon atoms constituting an alicyclic ring.

Among these, an ultraviolet curable adhesive that is cured by irradiation with ultraviolet rays is preferably used from the viewpoint of heat deformation resistance.

Each of the adhesive layer and the pressure sensitive adhesive layer may be obtained by imparting the ultraviolet absorbing ability to the layer using a method of performing a treatment with an ultraviolet absorbing agent such as a salicylic acid ester-based compound, a benzophenol-based compound, a benzotriazole-based compound, a cyanoacrylate-based compound, or a nickel complex salt-based compound.

The pressure sensitive adhesive layer or the adhesive layer may be appropriately attached to the light absorption anisotropic film and/or the polarizer by a known method.

For example, the pressure sensitive adhesive layer or the adhesive layer may be attached thereto by a method of preparing 10% to 40% by weight of a pressure sensitive adhesive solution obtained by dissolving or dispersing a base polymer or a composition thereof in a solvent consisting of a single substance or a mixture of an appropriate solvent such as toluene or ethyl acetate and directly attaching the solution onto the light absorption anisotropic film and/or the polarizer by an appropriate development method such as a casting method or a coating method or a method of forming a pressure sensitive adhesive layer on a support as described above and transporting the support.

Further, as the method of attaching the pressure sensitive adhesive layer or the adhesive layer to the light absorption anisotropic film and/or the polarizer, a method of preparing a coating solution containing a parent material forming the pressure sensitive adhesive layer, and as necessary, thermally expandable particles, an additive, a solvent, and the like, directly coating the support with the coating solution, pressure-bonding the support via a release liner to prepare a pressure sensitive adhesive sheet, and pressure-bonding and transferring (transporting) the sheet from the support can also be used. Further, as the method of attaching the pressure sensitive adhesive layer or the adhesive layer to the light absorption anisotropic film and/or the polarizer, a method of coating an appropriate release liner (release paper or the like) with the above-described coating solution to form a thermally expandable pressure sensitive adhesive layer and pressure-bonding and transferring the thermally expandable pressure sensitive adhesive layer from the release liner can also be used.

The pressure sensitive adhesive layer and the adhesive layer may be provided on one or both surfaces of the light absorption anisotropic film and/or the polarizer as layers obtained by superimposing different kinds of layers with different compositions. In addition, in a case where the layers are provided on both surfaces thereof, different kinds of pressure sensitive adhesive layers with different compositions and different thicknesses can be provided on the front and rear surfaces of the light absorption anisotropic film and/or the polarizer.

Further, the light absorption anisotropic film and/or the polarizer may be subjected to a surface reforming treatment before the adhesive or the pressure sensitive adhesive is attached thereto for the purpose of improving the adhesiveness or the like. Specific examples of the treatment include a corona treatment, a plasma treatment, a primer treatment, and a saponification treatment.

The image display device according to the embodiment of the present invention is obtained by providing the viewing angle control system according to the embodiment of the present invention on at least one main surface of a display panel.

In the image display device according to the embodiment of the present invention, an angle φ between a plane having the transmittance central axis of the light absorption anisotropic layer and the normal line of the light absorption anisotropic film and the absorption axis of the polarizer is preferably in a range of 45° to 90°, more preferably in a range of 80° to 90°, and still more preferably in a range of 88° to 90°.

As the angle φ is closer to 90°, an illuminance contrast between a direction in which a display image displayed by the image display device is easy to see and a direction in which the image is difficult to see can be provided.

[Display Panel]

The display panel used in the image display device according to the embodiment of the present invention is not particularly limited, and examples thereof include a liquid crystal cell, an organic electroluminescence (hereinafter, abbreviated as "EL") display panel, and a plasma display panel. Among these, a liquid crystal cell or an organic EL display panel is preferable. That is, it is preferable that the image display device according to the embodiment of the present invention is a liquid crystal display device formed of a liquid crystal cell as a display panel or an organic EL display device formed of an organic EL display panel as a display panel.

Preferred examples of the liquid crystal display device which is an example of the image display device according to the embodiment of the present invention include an aspect of a device having the above-described viewing angle control system (the light absorption anisotropic film and the polarizer) according to the embodiment of the present invention and the liquid crystal cell.

In the present invention, it is preferable to use a polarizer of the viewing angle control system according to the embodiment of the present invention as a front-side or rear-side polarizer among the polarizers provided on both sides of the liquid crystal cell. Alternatively, a polarizer of the viewing angle control system according to the embodiment of the present invention can also be used as a front-side and a rear-side polarizer.

Some display panels are thin and can be molded into a curved surface. Since the light absorption anisotropic film according to the embodiment of the present invention is thin and easily bent, the light absorption anisotropic film can be suitably applied to an image display device having a curved display surface.

Further, some display panels have a pixel density of greater than 250 ppi and are capable of high-definition display. The light absorption anisotropic film according to the embodiment of the present invention can be suitably applied to such a high-definition display panel without causing moire.

Hereinafter, the liquid crystal cell constituting the liquid crystal display device will be described in detail.

[Liquid Crystal Cell]

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules are substantially horizontally aligned at the time of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystal molecules are substantially vertically aligned at the time of no voltage application. The concept of the liquid crystal cell in a VA mode includes (1) a liquid crystal cell in a VA mode in a narrow sense where rod-like liquid crystal molecules are aligned substantially vertically at the time of no voltage application and substantially horizontally at the time of voltage application (described in JP1990-176625A (JP-H2-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3)

a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, pp. 58 to 59 (1998)), and (4) a liquid crystal cell in a SURVIVAL mode (presented at LCD International 98).

Further, the liquid crystal cell may be of any of a patterned vertical alignment (PVA) type, a photo-alignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. In regard to the IPS mode, a method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

In a case where the display cell and the viewing angle control system according to the embodiment of the present invention are required to be bonded to each other in the image display device according to the embodiment of the present invention, the bonding may be performed in a known method by the method of using a bonding agent and the like exemplified in the section of the bonding of the light absorption anisotropic film and the polarizer in the viewing angle control system described above.

EXAMPLES

Hereinafter, the present invention will be described in more detail based on the following examples. The materials, the reagents, the amounts of substances and the proportions of the substances, the operations, and the like shown in the following examples can be appropriately changed within a range not departing from the scope of the present invention. Therefore, the scope of the present invention is not limited to the following specific examples.

Example 1

A light absorption anisotropic film including a light absorption anisotropic layer in which an organic dichroic substance was obliquely aligned was prepared as described below.

<Preparation of Transparent Support 1 with Second Alignment Layer>

The surface of a cellulose acylate film 1 (TAC base material with a thickness of 40 μm; TG40, manufactured by FUJIFILM Corporation) was saponified with an alkaline solution and coated with the following coating solution 1 for forming a second alignment layer using a wire bar. The support on which the coating film had been formed was dried with hot air at 60° C. for 60 seconds and further dried with hot air at 100° C. for 120 seconds to form a second alignment layer 1, thereby obtaining a TAC film with a second alignment layer.

The film thickness of the second alignment layer was 0.5 μm.

The prepared TAC film with a second alignment layer was used by performing a rubbing treatment on the surface of the second alignment layer.

Coating Solution 1 for Forming Second Alignment Layer

- Modified polyvinyl alcohol shown below: 3.80 parts by mass
- Initiator Irg2959: 0.20 parts by mass
- Water: 70 parts by mass
- Methanol: 30 parts by mass

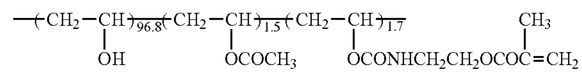

Modified polyvinyl alcohol

<Preparation of First Alignment Layer>

The second alignment layer of the prepared TAC film with a second alignment layer was coated with the following composition T1 for forming a first alignment layer using a wire bar, thereby forming a coating layer T1 with a first alignment layer.

Next, the coating layer T1 with a first alignment layer was heated at 120° C. for 30 seconds, and the coating layer T1 with a first alignment layer was cooled to room temperature (23° C.). Next, the coating layer was further heated at 80° C. for 60 seconds and cooled to room temperature again.

Thereafter, the coating layer was irradiated with an LED lamp (central wavelength of 365 nm) for 1 second under an irradiation condition of an illuminance of 200 mW/cm$^2$, thereby forming a first alignment layer T1 on the second alignment layer 1. Hereinafter, the prepared support with the first alignment layer T1 will be referred to as a support Z1 with the first alignment layer.

The film thickness of the first alignment layer T1 was 0.60 μm.

Composition of Composition T1 for Forming First Alignment Layer

- Low-molecular-weight liquid crystal compound M-1 shown below: 95.69 parts by mass
- Polymerization initiator (IRGACURE OXE-02, manufactured by BASF SE): 4.049 parts by mass
- Surfactant F-1 (leveling agent) shown below: 0.2620 parts by mass
- Cyclopentanone: 660.6 parts by mass
- Tetrahydrofuran: 660.6 parts by mass

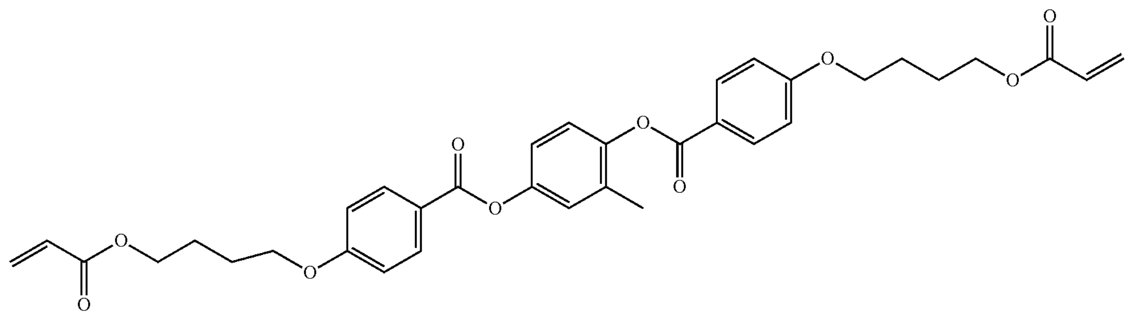

Low-molecular-weight liquid crystal compound M-1

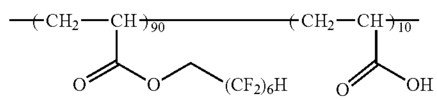

Surfactant F-1

(Measurement of Alignment Angle of First Alignment Layer on Air Interface Side)

As conceptually illustrated in FIG. 5, the prepared support Z1 with a first alignment layer was cut in parallel with the thickness direction (normal direction) using a microtome (rotary microtome: RM2265, manufactured by Leica Biosystems), thereby preparing a section 43 having a thickness of 2 μm.

With respect to the section 43, the alignment angle of the liquid crystal compound of the first alignment layer T1 on the air interface side was measured from the cut surface side using a polarization microscope. That is, with respect to the section 43, an angle between the alignment axis (optical axis) of the liquid crystal compound of the first alignment layer T1 on the air interface side and the normal line of the first alignment layer T1 was measured from the cut surface side. The air layer-side interface of the first alignment layer T1 is an interface on the light absorption anisotropic layer side that is later formed.

In the measurement using a polarization microscope, as conceptually illustrated in FIG. 6, the polarizer and the analyzer were disposed in crossed nicols, the azimuthal angle at which light extinguished on the air interface side of the first alignment layer T1 was observed while the azimuthal angle of the section 43 was allowed to move, a sensitive color plate (λ plate) was inserted, the color in the vicinity of the air layer-side interface was observed, the direction of the slow axis in the section 43 was investigated, and the alignment angle of the liquid crystal compound at the air layer-side interface was determined. Further, the alignment angle of the liquid crystal compound was measured by cutting out three sections 43 (n=3), and the average value thereof was defined as the alignment angle of the liquid crystal compound of the first alignment layer T1 on the air interface side.

In the present example, the alignment angle of the liquid crystal compound of the first alignment layer T1 on the air interface side was 22° with respect to the normal direction of the first alignment layer.

Further, even in the following examples, the alignment angle of the liquid crystal compound at the interface of the first alignment layer T1 on the air interface side (light absorption anisotropic layer side) was measured in the same manner as described above.

The alignment angle of the liquid crystal compound is listed in Table 1.

<Formation of Light Absorption Anisotropic Layer P1>

The obtained first alignment layer T1 was coated with the following composition P1 for forming a light absorption anisotropic layer using a wire bar, thereby forming a coating layer P1.

Next, the coating layer P1 was heated at 120° C. for 30 seconds, and the coating layer P1 was cooled to room temperature (23° C.).

Next, the coating layer was heated at 80° C. for 60 seconds and cooled to room temperature again.

Thereafter, the coating layer was irradiated with an LED lamp (central wavelength of 365 nm) for 1 second under an irradiation condition of an illuminance of 200 $mW/cm^2$, thereby forming a light absorption anisotropic layer P1 on the alignment layer 1.

The film thickness of the formed light absorption anisotropic layer P1 was 1.4 μm, and the surface energy thereof was 26.5 mN/m.

The surface energy was acquired by measuring the contact angle of pure water and diiodomethane with respect to the measured surface using an automatic contact angle meter CA-V type (manufactured by Kyowa Interface Science Co., Ltd.) in an indoor environment of 25° C. and 50% RH according to an OWENS and Wendt method.

Composition of Composition P1 for Forming Light Absorption Anisotropic Layer

- Dichroic substance D-1 shown below: 7.356 parts by mass
- Dichroic substance D-2 shown below: 3.308 parts by mass
- Dichroic substance D-3 shown below: 11.02 parts by mass
- Polymer liquid crystal compound P-1 shown below: 43.29 parts by mass
- Low-molecular-weight liquid crystal compound M-1: 31.75 parts by mass
- Polymerization initiator IRGACURE OXE-02 (manufactured by BASF SE): 3.175 parts by mass
- Surfactant F-2 shown below (leveling agent): 0.1027 parts by mass
- Cyclopentanone: 514.4 parts by mass
- Tetrahydrofuran: 514.4 parts by mass

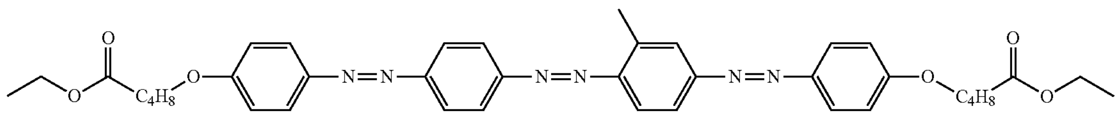

Dichroic substance D-1

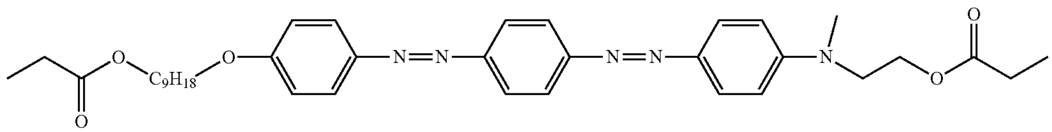

Dichroic substance D-2

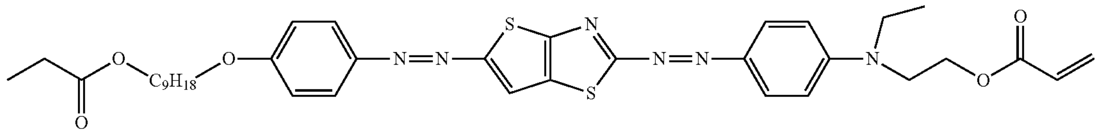

Dichroic substance D-3

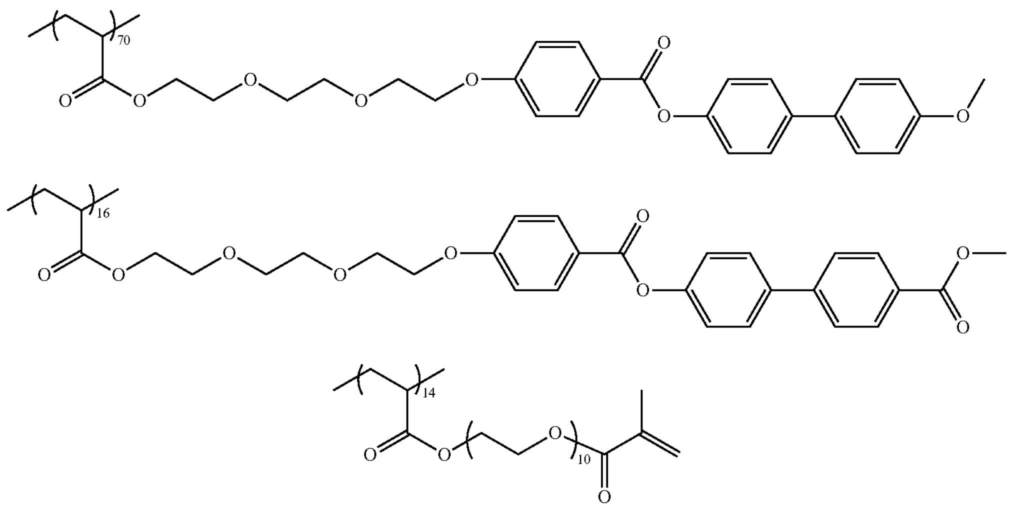

Polymer liquid crystal compound P-1

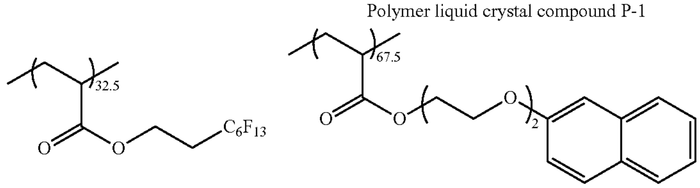

Surfactant F-2

<Formation of Barrier Layer B1>

The light absorption anisotropic layer P1 prepared above was coated with the following composition B1 for forming a barrier layer using a wire bar and dried at 80° C. for 5 minutes, thereby forming a barrier coating layer B 1.

Next, the barrier coating layer B1 was irradiated with an LED lamp (central wavelength of 365 nm) for 2 seconds under an irradiation condition of an illuminance of 150 $mW/cm^2$ in an environment of an oxygen concentration of 100 ppm and a temperature of 60° C., thereby forming a barrier layer B1 on the light absorption anisotropic layer P1.

The thickness of the barrier layer B1 was 1.0 The obtained layer was defined as a light absorption anisotropic film P1.

(Composition B1 for Forming Barrier Layer)

Modified polyvinyl alcohol shown below: 3.80 parts by mass

Initiator Irg2959: 0.20 parts by mass

Water: 70 parts by mass

Methanol: 30 parts by mass

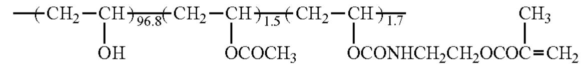

Modified polyvinyl alcohol

<Measurement of Angle θ of Transmittance Central Axis of Light Absorption Anisotropic Layer>

With respect to the light absorption anisotropic film P1 prepared above, the angle θ of the transmittance central axis of the light absorption anisotropic layer was measured by measuring the Mueller matrix of the light absorption anisotropic layer at a wavelength of 550 nm using AxoScan OPMF-1 (manufactured by Opto Science, Inc.).

The Mueller matrix was measured by optionally selecting 15 sites with a sample size of 20 cm×30 cm in the plane of the sample.

As described above, the transmittance central axis denotes the direction in which the transmittance is the highest in a case where the transmittance is measured by changing the inclination angle (polar angle) and the inclination direction (azimuthal angle) with respect to the normal direction of the main surface of the light absorption anisotropic layer.

In the measurement, first, an azimuthal angle at which the transmittance central axis was inclined was searched for.

Next, the Mueller matrix was measured while the polar angle θ which was an angle with respect to the normal direction of the light absorption anisotropic film was changed from −70° to 70° by 1° in a plane having the normal direction of the light absorption anisotropic layer along the azimuthal angle (the plane having the transmittance central axis and orthogonal to the layer surface).

Based on the measurement results of the Mueller matrix, the angle θ at which the transmittance was maximized was derived. The angle θ at which the transmittance is maximized is the direction of the transmittance central axis of the light absorption anisotropic layer, that is, the angle between the transmittance central axis of the light absorption anisotropic layer and the normal line of the light absorption anisotropic layer.

The average value of the measured angles θ at 15 sites was acquired, and this average value was defined as an angle between the transmittance central axis of the light absorption anisotropic layer and the normal line of the light absorption anisotropic layer in the light absorption anisotropic film. Hereinafter, this angle will be referred to as an average angle θ of the transmittance central axis.

The average angle θ of the transmittance central axis is listed in Table 1.

Further, the average angle θ of the transmittance central axis was measured in the same manner as described above for each of the following light absorption anisotropic films. Similarly, the results are listed in Table 1.

<Preparation of Laminate A1>

A polarizing plate 1 in which the thickness of the polarizer was 8 μm and one surface of the polarizer was exposed was prepared by the same method as that for a polarizing plate 02 with a one-surface protective film described in WO2015/166991A.

Figure 4:
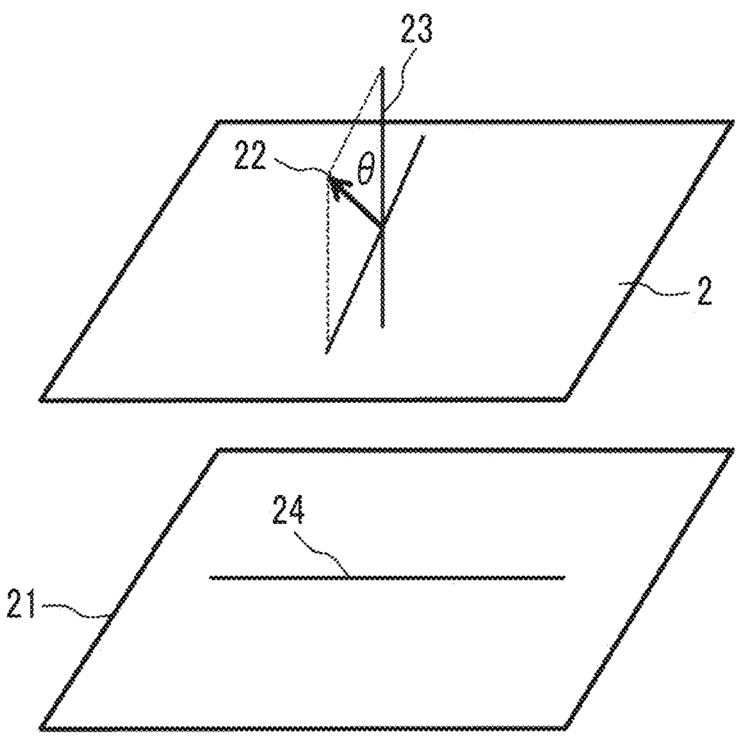
FIG. 4 is a view illustrating a positional relationship between a direction of a transmittance central axis of a light absorption anisotropic layer and an absorption axis of a polarizer in examples.

The surface of the polarizing plate 1 in which the polarizer was exposed and the surface of the light absorption anisotropic film P1 prepared above were subjected to a corona treatment. Next, both surfaces subjected to the corona treatment were made to face each other, and the polarizing plate 1 and the light absorption anisotropic film P1 were bonded to each other using the following PVA adhesive 1, thereby preparing a laminate A1. In this case, the angle between the plane having the transmittance central axis 22 of the light absorption anisotropic layer 2 and the normal line 23 of the light absorption anisotropic layer 2 (light absorption anisotropic film) and the absorption axis 24 of the polarizer 21 was 90° as conceptually illustrated in FIG. 4.

(Preparation of PVA Adhesive 1)

20 parts of methylol melamine with respect to 100 parts of a polyvinyl alcohol-based resin containing an acetoacetyl group (average degree of polymerization: 1200, degree of saponification: 98.5% by mole, degree of acetoacetylation: 5% by mole) was dissolved in pure water under a temperature condition of 30° C. to prepare an aqueous solution in which the concentration of solid contents was adjusted to 3.7% by mass.

<Preparation of Image Display Device B1>

A Wi-Fi model iPad Air (registered trademark, the same applies hereinafter, manufactured by APPLE, Inc.) with a capacity of 16 GB, which is an IPS mode liquid crystal display device, was disassembled to take out the liquid crystal cell.

The laminate A1 prepared above was bonded to the surface formed by peeling the viewing-side polarizing plate off from the liquid crystal cell such that the polarizing plate 1 side was the liquid crystal cell side, using the following pressure sensitive adhesive sheet 1. Here, the bonding was made such that the direction of the absorption axis of the polarizing plate 1 was the longitudinal direction of the liquid crystal screen.

The device was reassembled after the bonding to the liquid crystal cell, thereby preparing an image display device B1.

(Preparation of Pressure Sensitive Adhesive Sheet 1)

Next, an acrylate-based polymer was prepared according to the following procedures. 95 parts by weight of butyl acrylate and 5 parts by weight of acrylic acid were polymerized by a solution polymerization method in a reaction container equipped with a cooling pipe, a nitrogen introduction pipe, a thermometer, and a stirrer, thereby obtaining an acrylate-based polymer A1 with an average molecular weight of 2000000 and a molecular weight distribution (Mw/Mn) of 3.0.

Next, the obtained acrylate-based polymer A1 (100 parts by mass), CORONATE L (75 mass % ethyl acetate solution of trimethylolpropane adduct of tolylene isocyanate, number of isocyanate groups in one molecule: 3, manufactured by Nippon Polyurethane Industry Co., Ltd.) (1.0 parts by mass), and a silane coupling agent KBM-403 (manufactured by Shin-Etsu Chemical Co., Ltd.) (0.2 parts by mass) were mixed with each other, and ethyl acetate was finally added to the mixture such that the concentration of total solid contents reached 10% by mass, thereby preparing a composition for forming a pressure sensitive adhesive.

A separate film subjected to a surface treatment with a silicone-based release agent was coated with the composition using a die coater and dried in an environment of 90° C. for 1 minute, thereby obtaining an acrylate-based pressure sensitive adhesive sheet. The film thickness was 25 and the storage elastic modulus was 0.1 MPa.

Example 2

A light absorption anisotropic film P2, a laminate A2, and an image display device B2 were prepared in the same manner as in Example 1 except that the composition of the first alignment layer was changed to the following composition T2 for forming a first alignment layer.

The film thickness of the first alignment layer was 0.64 and the surface energy thereof was 41.3 mN/m.

Further, the film thickness of the light absorption anisotropic layer was 1.4 and the surface energy thereof was 26.5 mN/m.

Composition of Composition T2 for Forming First Alignment Layer

- Polymer liquid crystal compound P-1: 55.20 parts by mass
- Low-molecular-weight liquid crystal compound M-1: 40.49 parts by mass
- Polymerization initiator (IRGACURE OXE-02, manufactured by BASF SE): 4.049 parts by mass
- Surfactant F-1 (leveling agent): 0.2620 parts by mass
- Cyclopentanone: 660.6 parts by mass
- Tetrahydrofuran: 660.6 parts by mass

Example 3

A light absorption anisotropic film P3, a laminate A3, and an image display device B3 were prepared in the same manner as in Example 2 except that the light absorption anisotropic layer 3 was formed of the following composition P2 for forming a light absorption anisotropic layer and the film thickness of the light absorption anisotropic layer was set to 4.0 μm.

Here, the low-molecular-weight liquid crystal compounds M-2 and M-3 exhibiting a smectic phase were confirmed in advance by observing the liquid crystal phase while changing the temperature using a hot stage for a microscope (manufactured by METTLER TOLEDO) and a polarization microscope.

The film thickness of the first alignment layer was 0.64 μm.

Composition of Composition P2 for Forming Light Absorption Anisotropic Layer

- Dichroic substance D-1: 2.872 parts by mass
- Dichroic substance D-2: 1.026 parts by mass
- Dichroic substance D-3: 4.513 parts by mass
- Low-molecular-weight liquid crystal compound M-2 shown below: 67.90 parts by mass
- Low-molecular-weight liquid crystal compound M-3 shown below: 22.56 parts by mass
- Polymerization initiator IRGACURE OXE-02 (manufactured by BASF SE): 0.8205 parts by mass
- Surfactant F-2 (leveling agent): 0.1000 parts by mass
- Cyclopentanone: 1846.2 parts by mass
- Benzyl alcohol: 102.6 parts by mass

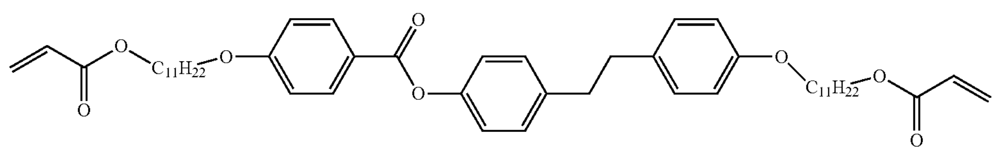

Low-molecular-weight liquid crystal compound M-2

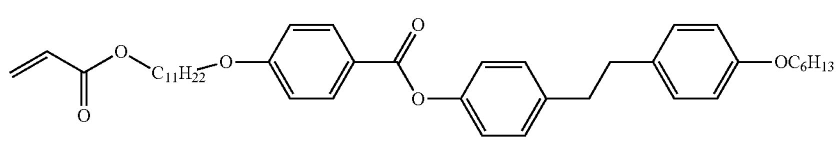

Low-molecular-weight liquid crystal compound M-3

Example 4

A light absorption anisotropic film P4, a laminate A4, and an image display device B4 were prepared in the same manner as in Example 2 except that the light absorption anisotropic layer 4 was formed of the following composition P3 for forming a light absorption anisotropic layer and the film thickness of the light absorption anisotropic layer was set to 4.0 μm.

Here, the low-molecular-weight liquid crystal compounds M-4 and M-5 exhibiting a smectic phase were confirmed in advance by observing the liquid crystal phase while changing the temperature using a hot stage for a microscope (manufactured by METTLER TOLEDO) and a polarization microscope.

The film thickness of the first alignment layer was 0.64 μm.

Composition of Composition P3 for Forming Light Absorption Anisotropic Layer

- Dichroic substance D-1: 2.872 parts by mass
- Dichroic substance D-2: 1.026 parts by mass
- Dichroic substance D-3: 4.513 parts by mass
- Low-molecular-weight liquid crystal compound M-4 shown below: 67.90 parts by mass
- Low-molecular-weight liquid crystal compound M-5 shown below: 22.56 parts by mass
- Polymerization initiator IRGACURE OXE-02 (manufactured by BASF SE): 0.8205 parts by mass
- Surfactant F-2 (leveling agent): 0.1000 parts by mass
- Cyclopentanone: 1846.2 parts by mass
- Benzyl alcohol: 102.6 parts by mass

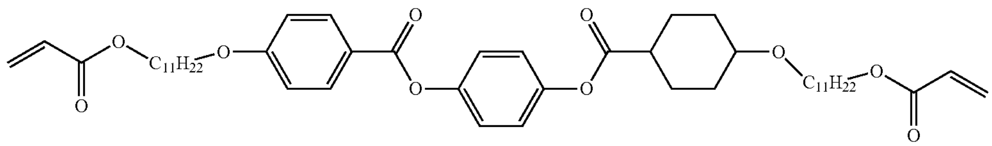

Low-molecular-weight liquid crystal compound M-4

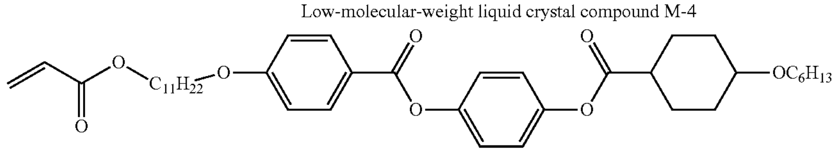

Low-molecular-weight liquid crystal compound M-5

Example 5

A light absorption anisotropic film P5, a laminate A5, and an image display device B5 were prepared in the same manner as in Example 2 except that the light absorption anisotropic layer 5 was formed of the following composition P4 for forming a light absorption anisotropic layer and the film thickness of the light absorption anisotropic layer was set to 1.4 μm.

The film thickness of the first alignment layer was 0.64 μm.

Composition of Composition P4 for Forming Light Absorption Anisotropic Layer

- Dichroic substance D-1: 1.720 parts by mass
- Dichroic substance D-2: 0.7736 parts by mass
- Dichroic substance D-3: 2.578 parts by mass
- Polymer liquid crystal compound P-1: 43.29 parts by mass
- Low-molecular-weight liquid crystal compound M-1: 31.75 parts by mass
- Polymerization initiator IRGACURE OXE-02 (manufactured by BASF SE): 3.175 parts by mass
- Surfactant F-2 shown below (leveling agent): 0.1027 parts by mass
- Cyclopentanone: 436.5 parts by mass
- Tetrahydrofuran: 436.5 parts by mass Example 6

A light absorption anisotropic film P6, a laminate A6, and an image display device B6 were prepared in the same manner as in Example 2 except that the light absorption anisotropic layer 6 was formed of the following composition P5 for forming a light absorption anisotropic layer and the film thickness of the light absorption anisotropic layer was set to 1.4 μm.

The film thickness of the first alignment layer was 0.64 μm.

Composition of Composition P5 for Forming Light Absorption Anisotropic Layer

- Dichroic substance D-1: 1.094 parts by mass
- Dichroic substance D-2: 0.4917 parts by mass
- Dichroic substance D-3: 1.639 parts by mass
- Polymer liquid crystal compound P-1: 43.29 parts by mass
- Low-molecular-weight liquid crystal compound M-1: 31.75 parts by mass
- Polymerization initiator IRGACURE OXE-02 (manufactured by BASF SE): 3.175 parts by mass
- Surfactant F-2 (leveling agent): 0.1027 parts by mass
- Cyclopentanone: 432.2 parts by mass
- Tetrahydrofuran: 432.2 parts by mass Comparative Example 1

A PVA alignment layer which had not been subjected to a rubbing treatment was coated with the following composition for forming a photo-alignment layer without providing a second alignment layer, dried at 90° C. for 1 minute to form a coating film E1 of the composition for forming a photo-alignment layer, and the coating film E1 was exposed to ultraviolet rays inclined obliquely above the photo-alignment film at an angle of 30° with respect to the normal line of the coating film, thereby forming a photo-alignment layer E1.

A light absorption anisotropic film P7, a laminate A7, and an image display device B7 were prepared in the same manner as in Example 1, except that the photo-alignment layer 1 was used as a formation surface of the light absorption anisotropic layer.

The thickness of the photo-alignment film was 0.1 μm.

Composition of Composition for Forming Photo-Alignment Layer

- photo-alignment material E-1 shown below: 0.3 parts by mass
- 2-Butoxyethanol: 41.6 parts by mass
- Dipropylene glycol monomethyl ether: 41.6 parts by mass
- Pure water: 16.5 parts by mass Photo-alignment material E-1

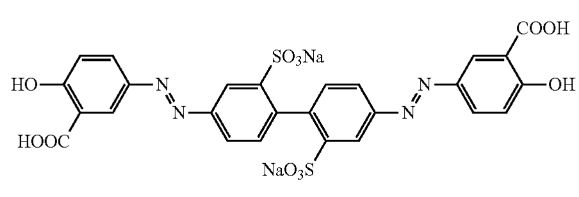

[Evaluation of Performance]

(1) Evaluation of Transmittance Central Axis

The coefficient of variation of the angle θ was acquired based on the measurement results of the angle θ of the transmittance central axis at 15 sites and the average value of the angle θ (average angle θ) for each of the prepared light absorption anisotropic films P1 to P7. The coefficient of variation is a value obtained by dividing the average value by the standard deviation, and the variation increases as the value increases.

The coefficient of variation of the angle θ is considered to be the main factor for determining the in-plane brightness unevenness, and the results are ranked as follows.

AAA: The coefficient of variation was less than 9%

AA: The coefficient of variation was 10% or greater and less than 12%

A: The coefficient of variation was 12% or greater and less than 15%

B: The coefficient of variation was 15% or greater and less than 20%

C: The coefficient of variation was 20% or greater and less than 25%

D: The coefficient of variation was 25% or greater (2) Evaluation of Brightness Unevenness in Image Display Device A sample image was displayed on the screen using each of the image display devices B1 to B7 prepared by the above-described procedures, and the brightness unevenness in the front direction was sensory evaluated.

AAA: The brightness unevenness was extremely small.

AA: The brightness unevenness was small.

A: The brightness unevenness was not noticeable.

B: The brightness unevenness was slightly noticeable.

C: The brightness unevenness was noticeable.

D: The brightness unevenness was extremely noticeable.

The evaluation results are listed in Table 1.

TABLE 1

| | | | | | | Light absorption anisotropic layer | | | | |
|---|---|---|---|---|---|---|---|---|---|---|
| | | | First alignment layer | | | | | Transmittance central axis | | |
| | Under layer Compo-sition | Second alignment layer Compo-sition | Composition | Alignment angle of liquid crystal compound | Other alignment layers Compo-sition | Composition | Concen-tration of dichroic coloring agent | Average angle θ | Coefficient of variation of angle θ | Brightness uneven-ness in display image |
| Example 1 | None | PVA subjected to rubbing treatment | T1 (low-molecular-weight liquid crystal) | 22° | None | P1 (low-molecular-weight liquid crystal + polymer liquid crystal + organic dichroic coloring agent) | 21.7% | 34° | AA | AA |
| Example 2 | None | PVA subjected to rubbing treatment | T2 (low-molecular-weight liquid crystal + polymer liquid crystal) | 19° | None | P1 (low-molecular-weight liquid crystal + polymer liquid crystal + organic dichroic coloring agent) | 21.7% | 30° | AAA | AAA |
| Example 3 | None | PVA subjected to rubbing treatment | T2 (Low-molecular-weight liquid crystal + polymer liquid crystal) | 21° | None | P3 (low-molecular-weight liquid crystal showing smectic phase + organic dichroic coloring agent) | 8.4% | 32° | A | A |
| Example 4 | None | PVA subjected to rubbing treatment | T2 (low-molecular-weight liquid crystal + polymer liquid crystal) | 20° | None | P3 (low-molecular-weight liquid crystal showing smectic phase + organic dichroic coloring agent) | 8.4% | 31° | A | A |
| Example 5 | None | PVA subjected to rubbing treatment | T2 (low-molecular-weight liquid crystal + polymer liquid crystal) | 19° | None | P4 (low-molecular-weight liquid crystal + polymer liquid crystal + organic dichroic coloring agent) | 6.1% | 30° | B | B |
| Example 6 | None | PVA subjected to rubbing treatment | T2 (low-molecular-weight liquid crystal + polymer liquid crystal) | 19° | None | P5 (low-molecular-weight liquid crystal + polymer liquid crystal + organic dichroic coloring agent) | 4.0% | 30° | C | C |

TABLE 1-continued

| | | | First alignment layer | | | Light absorption anisotropic layer | | | | |
|---|---|---|---|---|---|---|---|---|---|---|
| | | | | | | | | Transmittance central axis | | |
| | Under layer Composition | Second alignment layer Composition | Composition | Alignment angle of liquid crystal compound | Other alignment layers Composition | Composition | Concentration of dichroic coloring agent | Average angle θ | Coefficient of variation of angle θ | Brightness unevenness in display image |
| Comparative Example 1 | PVA not subjected to rubbing treatment | None | None | None | E-1 (photo-alignment film) | P1 (low-molecular-weight liquid crystal + polymer liquid crystal + organic dichroic coloring agent) | 21.7% | 35° | D | D |

The alignment angle of the liquid crystal compound in the first alignment layer is an alignment angle of the liquid crystal compound at an air layer -side interface (light absorption anisotropic layer side)

According to the light absorption anisotropic film of the present invention in which the first alignment layer was provided adjacent to the light absorption anisotropic layer, it was found that the coefficient of variation (relative value of variation) of the direction θ of the transmittance central axis and the brightness unevenness of the displayed image were values smaller than those of the comparative examples, and thus a high-quality image display device can be obtained.

In the light absorption anisotropic film in which the first alignment layer was formed of the polymer liquid crystal compound and the light absorption anisotropic film in which the content of the organic dichroic substance in the light absorption anisotropic layer was large, particularly the coefficient of variation (variation) of the angle θ and the brightness unevenness of the displayed image were small and the quality was excellent.

Further, even in the light absorption anisotropic film in which the light absorption anisotropic layer was formed of the liquid crystal compound exhibiting a smectic phase and the image display device, the coefficient of variation of the angle θ and the brightness unevenness were small and the quality was high.

Further, as the coefficient of variation of the angle θ decreases, the brightness unevenness of the image of the image display device also decreases, and the correspondence relationship is also shown therebetween.

As shown in the results, it was found that the viewing angle characteristics are uniformly controlled while a load such as the exposure equipment cost is avoided by the present invention.

EXPLANATION OF REFERENCES

100: liquid crystal display device
101: light absorption anisotropic film
102: viewing-side polarizer
103: liquid crystal cell
104: backlight-side polarizer
105: backlight
1: barrier layer
2: light absorption anisotropic layer
3: first alignment layer
4: second alignment layer
5: TAC film
11: liquid crystal molecule
13: dichroic dye D-1
14: dichroic dye D-2
15: dichroic dye D-3
21: polarizer
22: transmittance central axis direction (polar angle θ)
23: normal line of light absorption anisotropic layer
24: absorption axis direction of polarizer

What is claimed is:

1. A light absorption anisotropic film comprising:

a light absorption anisotropic layer; and a first alignment layer adjacent to the light absorption anisotropic layer, wherein the light absorption anisotropic layer contains a liquid crystal compound and an organic dichroic substance, an angle between a transmittance central axis of the light absorption anisotropic layer and a normal line of the light absorption anisotropic layer is 5° or greater and less than 45°, the first alignment layer is a layer formed by fixing a hybrid-aligned polymerizable liquid crystal compound in which an alignment direction of the compound in a thickness direction continuously changes from one surface side to the other surface side, and a ratio of a mass of the organic dichroic substance to a total mass of a solid content in the light absorption anisotropic layer is 20% to 30% by mass.

2. The light absorption anisotropic film according to claim 1, wherein the first alignment layer is a layer formed of a composition having a polymerizable polymer liquid crystal.

3. The light absorption anisotropic film according to claim 2, wherein an angle between an alignment axis of the polymerizable liquid crystal compound at an interface of the first alignment layer on the light absorption anisotropic layer side and a normal line of the first alignment layer is in a range of 2° to 50°.

4. The light absorption anisotropic film according to claim 2, wherein the liquid crystal compound of the light absorption anisotropic layer includes a polymerizable liquid crystal compound, and the polymerizable liquid crystal compound includes a liquid crystal compound exhibiting a smectic phase.

5. The light absorption anisotropic film according to claim 2, further comprising:

a second alignment layer disposed adjacent to a side of the first alignment layer opposite to a side of the light absorption anisotropic layer and consisting of polyvinyl alcohol or polyimide.

6. A viewing angle control system comprising:

a polarizer; and the light absorption anisotropic film according to claim 2.

7. An image display device comprising:

the viewing angle control system according to claim 6 which is disposed on at least one main surface of a display panel.

8. The light absorption anisotropic film according to claim 1, wherein an angle between an alignment axis of the polymerizable liquid crystal compound at an interface of the first alignment layer on the light absorption anisotropic layer side and a normal line of the first alignment layer is in a range of 2° to 50°.

9. The light absorption anisotropic film according to claim 8, wherein the liquid crystal compound of the light absorption anisotropic layer includes a polymerizable liquid crystal compound, and the polymerizable liquid crystal compound includes a liquid crystal compound exhibiting a smectic phase.

10. The light absorption anisotropic film according to claim 8, further comprising:

a second alignment layer disposed adjacent to a side of the first alignment layer opposite to a side of the light absorption anisotropic layer and consisting of polyvinyl alcohol or polyimide.

11. A viewing angle control system comprising:

a polarizer; and the light absorption anisotropic film according to claim 3.

12. An image display device comprising:

the viewing angle control system according to claim 11 which is disposed on at least one main surface of a display panel.

13. The light absorption anisotropic film according to claim 1, wherein the liquid crystal compound of the light absorption anisotropic layer includes a polymerizable liquid crystal compound, and the polymerizable liquid crystal compound includes a liquid crystal compound exhibiting a smectic phase.

14. The light absorption anisotropic film according to claim 1, further comprising:

a second alignment layer disposed adjacent to a side of the first alignment layer opposite to a side of the light absorption anisotropic layer and consisting of polyvinyl alcohol or polyimide.

15. The light absorption anisotropic film according to claim 14, wherein the second alignment layer is a polyvinyl alcohol film subjected to a rubbing treatment or a polyimide film subjected to a rubbing treatment.

16. A viewing angle control system comprising:

a polarizer; and the light absorption anisotropic film according to claim 1.

17. An image display device comprising:

the viewing angle control system according to claim 16 which is disposed on at least one main surface of a display panel.

18. The light absorption anisotropic film according to claim 1, wherein the liquid crystal compound contained in the light absorption anisotropic layer is a polymer liquid crystal compound, and the polymer liquid crystal compound contained in the light absorption anisotropic layer has a repeating unit containing a mesogen group and an electron-withdrawing group having a σp value of greater than 0 present at a terminal of the mesogen group and a repeating unit containing a mesogen group and a group having a σp value of 0 or less present at a terminal of the mesogen group.

* * * * *